(12) United States Patent
Matsuki et al.

(10) Patent No.: US 6,732,911 B2
(45) Date of Patent: May 11, 2004

(54) SOLDER JOINTING SYSTEM, SOLDER JOINTING METHOD, SEMICONDUCTOR DEVICE MANUFACTURING METHOD, AND SEMICONDUCTOR DEVICE MANUFACTURING SYSTEM

(75) Inventors: Hirohisa Matsuki, Kawasaki (JP); Hiroyuki Matsui, Kawasaki (JP); Eiji Yoshida, Kawasaki (JP); Takao Ohno, Kawasaki (JP); Koki Otake, Kawasaki (JP); Akiyo Mizutani, Kawasaki (JP); Motoshu Miyajima, Kawasaki (JP); Masataka Mizukoshi, Kawasaki (JP); Eiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 09/970,802

(22) Filed: Oct. 5, 2001

(65) Prior Publication Data

US 2002/0130164 A1 Sep. 19, 2002

(30) Foreign Application Priority Data

| Jan. 18, 2001 | (JP) | ...... | 2001-010423 |
| Mar. 9, 2001 | (JP) | ...... | 2001-067615 |
| Jun. 7, 2001 | (JP) | ...... | 2001-172960 |

(51) Int. Cl.[7] .......... B23K 35/38; B23K 1/20; B23K 31/02; F27D 11/00
(52) U.S. Cl. .......... 228/219; 228/206; 228/19; 219/388; 219/390
(58) Field of Search .......... 228/206, 219, 228/37, 42, 208, 201; 219/388, 390

(56) References Cited

U.S. PATENT DOCUMENTS 4,283,847 A * 8/1981 May .......... 29/832
4,389,254 A * 6/1983 Tusset et al. .......... 134/3
4,437,905 A * 3/1984 Nitto et al. .......... 148/623
4,459,743 A * 7/1984 Watanabe et al. .......... 29/740

(List continued on next page.)

FOREIGN PATENT DOCUMENTS

| JP | 61-122065 | 1/1985 |
| JP | 04-182063 | 6/1992 |
| JP | 4-220166 | 8/1992 |
| JP | 5-211391 | 8/1993 |

(List continued on next page.)

OTHER PUBLICATIONS

Lin, et al. "Study of Fluxless Soldering Using Formic Acid Vapor"—IEEE Transaction on Advanced Packaging, vol. 22, No. 4, Nov. 1999, pp. 592–600.

Primary Examiner—Lynne Edmondson
(74) Attorney, Agent, or Firm—Armstrong, Kratz, Quintos, Hanson & Brooks, LLP

(57) ABSTRACT

There is provided a chamber open to the outside through openings through which a solder-adhered object is passed and the chamber having a heating/melting area, a carrying mechanism for carrying the solder-adhered object into the heating/melting area, a formic-acid supplying means for supplying a formic acid into the heating/melting area, an exhausting means for exhausting a gas from the heating/melting area and its neighboring area to create a lower pressure area in the heating/melting area as compared to the pressure of outside the chamber, heating means for heating directly or indirectly the solder-adhered object in the heating/melting area, and an air-stream suppressing means for disturbing a gas flow between the heating/melting area and the carrying areas. Accordingly, there can be provided a solder jointing system for jointing solder layers of a semiconductor device, an electronic device, or the like to the wirings or the pads, which is capable of having a high processing ability and preventing re-oxidation.

39 Claims, 42 Drawing Sheets

U.S. PATENT DOCUMENTS

| | | | |
|---|---|---|---|
| 4,460,144 A | | 7/1984 | Kazaoka et al. ............. 248/397 |
| 4,469,565 A | * | 9/1984 | Hampel ...................... 205/130 |
| 4,921,156 A | * | 5/1990 | Hohnerlein .................. 228/37 |
| 4,937,006 A | | 6/1990 | Bickford et al. ............. 228/219 |
| 5,046,658 A | * | 9/1991 | Morris ....................... 228/206 |
| 5,048,746 A | * | 9/1991 | Elliott et al. ............. 228/180.1 |
| 5,090,651 A | * | 2/1992 | Mittag ....................... 228/219 |
| 5,121,874 A | * | 6/1992 | Deambrosio et al. ....... 228/219 |
| 5,176,307 A | * | 1/1993 | Hagerty et al. ............... 228/37 |
| 5,192,582 A | * | 3/1993 | Liedke et al. ............... 228/206 |
| 5,227,604 A | * | 7/1993 | Freedman ............. 219/121.63 |
| 5,249,733 A | | 10/1993 | Brady et al. ................ 228/180 |
| 5,433,820 A | * | 7/1995 | Sindzingre et al. ........... 216/13 |
| 5,447,802 A | * | 9/1995 | Tobiyama et al. .......... 428/610 |
| 5,604,831 A | | 2/1997 | Dittman et al. |
| 5,967,402 A | * | 10/1999 | Kuwabara .................. 228/194 |
| 6,015,966 A | * | 1/2000 | Rehm ........................ 219/388 |
| 6,165,885 A | | 12/2000 | Gaynes et al. ............. 438/612 |
| 6,344,407 B1 | * | 2/2002 | Matsuki et al. ............. 438/613 |
| 6,354,481 B1 | * | 3/2002 | Rich et al. .................... 228/19 |

FOREIGN PATENT DOCUMENTS

| | | |
|---|---|---|
| JP | 6-29659 | 2/1994 |
| JP | 06-063733 | 3/1994 |
| JP | 6-112644 | 4/1994 |
| JP | 6-190584 | 7/1994 |
| JP | 03-310849 | 11/1994 |
| JP | 7-75699 | 3/1995 |
| JP | 7-79071 | 3/1995 |
| JP | 7-164141 | 6/1995 |
| JP | 7-170063 | 7/1995 |
| JP | 7-83930 | 9/1995 |
| JP | 8-83780 | 3/1996 |
| JP | 8-316233 | 11/1996 |
| JP | 9-232313 | 9/1997 |
| JP | 11-33023 | 2/1999 |
| JP | 11-233934 | 8/1999 |

* cited by examiner

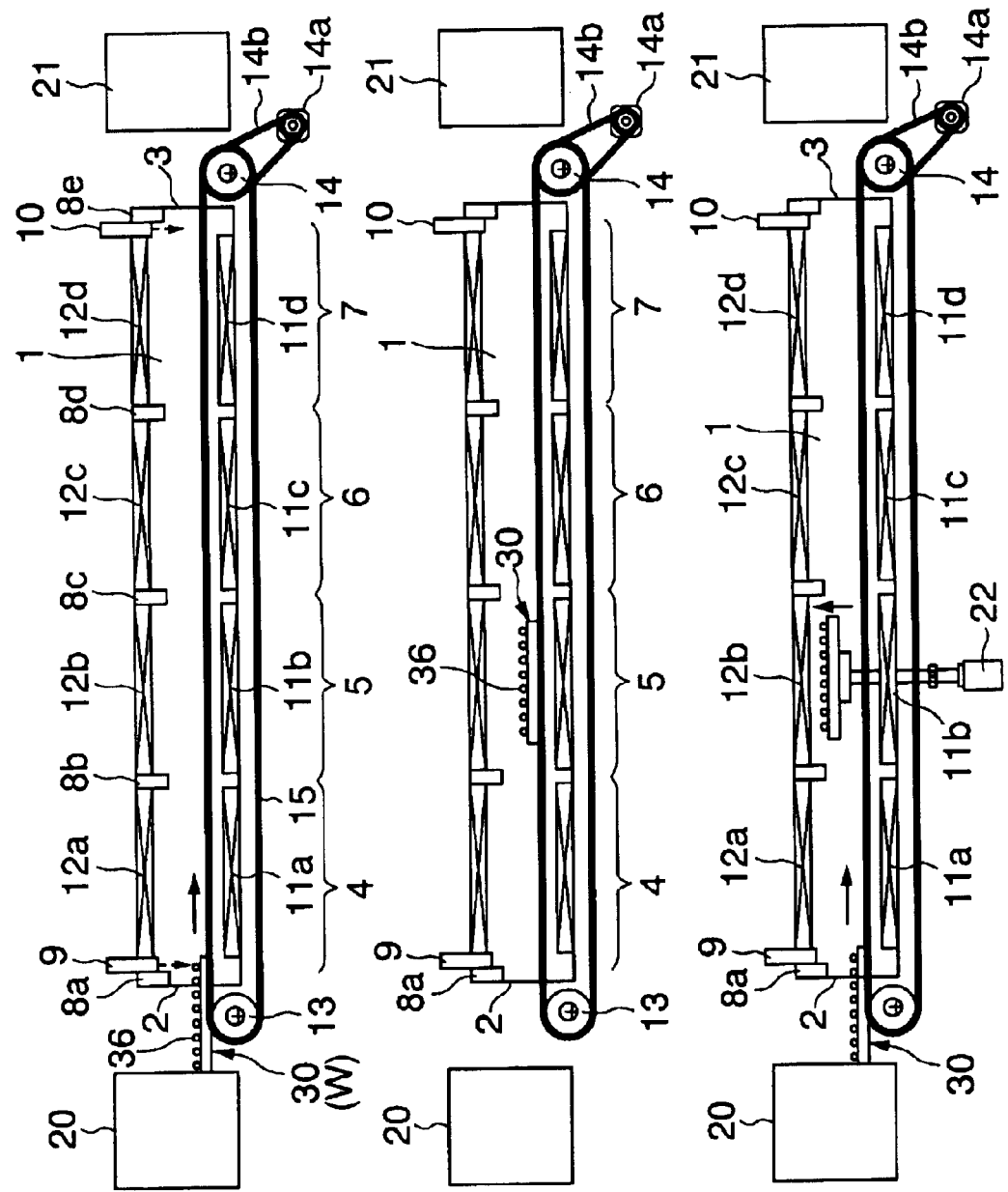

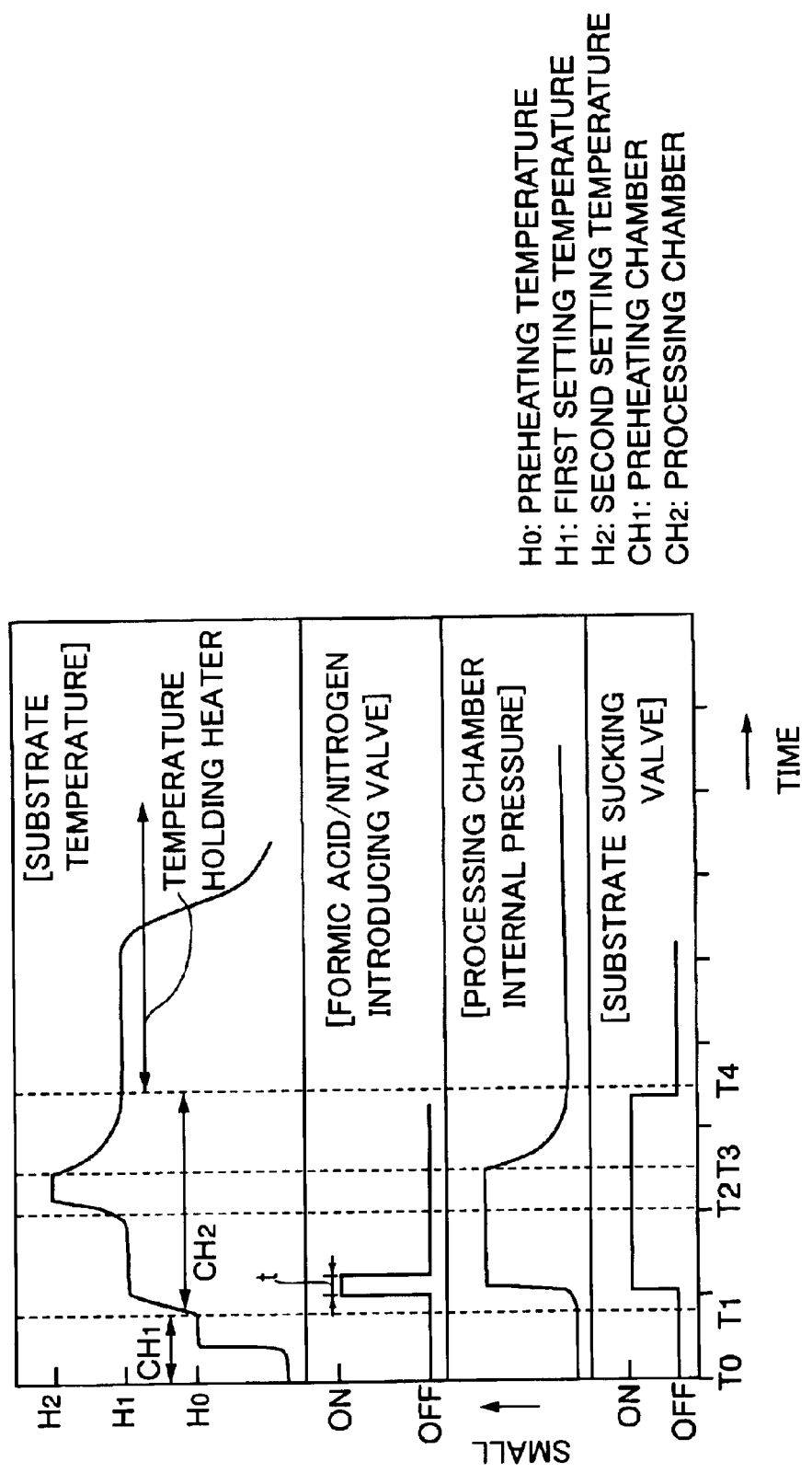

FIG. 42

| ETCHANT | DIPPING TIME | RESULT |
|---|---|---|
| PURE WATER | 3 MINUTES | NO CHANGE |
| CIREX | 30 MINUTES | OVERALL ROUGH SURFACE |
| CIREX 1/100 | 30 MINUTES | OVERALL ROUGH SURFACE |
| CIREX 1/1000 | 30 MINUTES | LOCALLY DAMAGED |
| CIREX 1/10000 | 30 MINUTES | LOCALLY DAMAGED |
| CIREX 1/100000 | 30 MINUTES | NO CHANGE |
| CIREX 1/1000000 | 30 MINUTES | NO CHANGE |

FIG. 43

| PROCESS CONDITION | PROCESS TEMPERATURE | PROCESS PRESSURE | ETCHING (REDUCING) RATE |
|---|---|---|---|
| 1 | 170°C | 73hPa | 0.9nm/MINUTES |
| 2 | 200°C | 73hPa | 1.5nm/MINUTES |
| 3 | 250°C | 73hPa | 2.5nm/MINUTES |
| 4 | 330°C | 73hPa | 2.8nm/MINUTES |

SOLDER JOINTING SYSTEM, SOLDER JOINTING METHOD, SEMICONDUCTOR DEVICE MANUFACTURING METHOD, AND SEMICONDUCTOR DEVICE MANUFACTURING SYSTEM

CROSS-REFERENCE TO RELATED APPLICATIONS

This application is based upon and claims priority of Japanese Patent Applications No. 2001-10423, filed in Jan. 18, 2001, and 2001-172960, filed in Jun. 7, 2001, and No. 2001-67615, filed in Mar. 9, 2001, the contents being incorporated herein by reference.

BACKGROUND OF THE INVENTION

1. Field of the Invention

The present invention relates to a solder jointing system and a solder jointing method and, more particularly, a solder jointing system and a solder jointing method employed to joint the solder layer to wirings or pads of the semiconductor device or the electronic device.

The present invention relates to a semiconductor device manufacturing method and a semiconductor device manufacturing system and, more particularly, a semiconductor device manufacturing method and a semiconductor device manufacturing system having a step/means for removing unnecessary substance that is adhered onto a surface of the electrode or the wiring formed mainly of copper.

In the prior art, normally the wiring or the electrode of the semiconductor device is made of metal containing mainly aluminum. However, in recent years, in order to satisfy requests for the miniaturization of the wirings and the higher speed, the development of the practical implementation of the wiring that employs the copper having the small resistivity and the high electromigration resistance as main material is being proceeded.

This copper has the property that is reduced more easily than aluminum, but is oxidized easily. Accordingly, in the steps of manufacturing the semiconductor device, the technology of removing quickly and precisely the oxide film formed on the surface of the copper wiring or the copper electrode to clean the surface is requested.

2. Description of the Prior Art

As the method of jointing the solder to the metal pattern such as the electrode pad, the metal wiring, etc. of the semiconductor device, the method of forming the solder on the metal pattern by virtue of the plating method, the printing method, the ball mounting method, etc. and then heating/melting the solder to joint/shape it onto the electrode pad is employed.

In melting the solder, normally the oxide film on the surface of the solder or the electrode pad under the solder is removed by using the flux, and then the solder is melted and jointed while cleaning the surface.

The solder jointing step using the flux is carried out by the method described hereunder, for example.

First, the flux that is coated on the surface of the metal pattern as the solder-deposited surface covers the surface of the metal pattern to prevent the oxidation of the metal pattern while its surface is being activated by the heating, so that the activated state of the metal pattern is maintained. At the same time, the solder is melted to spread over the surface of the metal pattern. A part of the flux is dissolved by the melting of the solder.

Then, the solder is solidified by the cooling and is jointed to the surface of the metal pattern. At the same time, the flux and the dissolved product remaining on the metal pattern are also solidified.

After the solder joint using such flux is executed, the solidified flux is removed by the cleaning. In this case, since the dissolved product cannot be simply removed by the organic solvent not-containing flon or trichlene in this cleaning, a large quantity of organic solvent must be used in this cleaning.

However, since the organic solvent exerts a harmful influence upon the environment, the development of the solder jointing method that does not need the cleaning is desired.

Also, in the packaging step of the electronic parts module, normally the packaging step is applied after the flux or the flux-containing paste is coated on the solder-jointed portion. In such case, since the flux is dissolved by the heat applied in the packaging to thus generate the harmful gas, the safety of the operation must be assured. Also, if the halogen component remains in the module as the residue of the flux, corrosion of the wirings in the module and the migration of the wirings are accelerated. Therefore, the thorough cleaning is needed, which acts as the cause to bring about the increase of the fabrication cost.

In order to overcome these problems, following methods or equipments are known.

First, the soldering method using the carboxylic acid is set forth in Patent Application Publication (KOKAI) Hei 6-190584 (literature 1), Patent Application Publication (KOKAI) Hei 6-267632 (literature 2), and Patent Application Publication (KOKAI) Hei 7-164141(literature 3), for example. Also, the equipment is set forth in literature 3.

Also, the soldering method executed in the low pressure or vacuum atmosphere is set forth in Patent Application Publication (KOKAI) Hei 4-220166 (literature 4), Patent Application Publication (KOKAI) Hei 5-211391 (literature 5), Patent Application Publication (KOKAI) Hei 6-29659 (literature 6), Patent Application Publication (KOKAI) Hei 7-79071 (literature 7), and Patent Application Publication (KOKAI) Hei 7-170063 (literature 8).

However, according to the solder jointing system and the solder jointing method in the prior art, there are subjects described in the following.

First, the first subject is that the danger of the explosion in the solder jointing atmosphere is present.

For example, it is set forth in the literature 3 that, in the solder jointing system using the carboxylic acid and the diketone, the carboxylic acid gas is supplied to reduce the oxide film of the solder and also the droplet of the diketone is supplied to remove the oxide film of the pad. However, the diketone is such material that is expensive as set forth in the literature 3 and has the danger of the explosion. Both the diketone and the carboxylic acid have the explosive limit. If the temperature and the concentration in the processing layer and the oxygen concentration exceed respective certain ranges, e.g., if the formic acid concentration and the oxygen concentration reach 30% and 10% at the temperature of 100° C. respectively, there exists the danger of the explosion.

The equipment and the method that have the possibility to reach such conditions causing the danger of the explosion are not readily accepted.

The second subject is that the carboxylic acid has the poisonous property.

For example, as disclosed in the literature 4, in order to prevent the leakage of the carboxylic acid from the process area, it is advantageous to execute the soldering by introducing the carboxylic acid into the chamber, that is excluded from the air, while reducing the oxide film. However, the solder joint in the chamber has small processing capability.

The third subject is that the re-oxidation is caused by the carboxylic acid that still remains on the surface of the solder and the surface of the metal pattern after the solder joint.

According to the examination of the inventors of the present invention, if the component of the carboxylic acid still remains on the surface of the solder, the surface of the solder is oxidized again after the solder is left as it is for a predetermined time in the atmosphere. Also, if the oxygen concentration of the atmosphere in which the solder joint is carried out is high, the surface of the solder is oxidized again by the residual heat after the heating/melting.

The fourth subject is that the throughput of the solder joint must be improved in the well-known solder jointing system.

The solder is formed on the wiring or the pad of the semiconductor substrate, the ceramic substrate, the circuit board, etc., then is carried into the solder jointing system, and then is heated/melted there to be jointed to the wiring or the pad. Since the substrate is loaded/unloaded one by one into/from the solder jointing system, i.e., such solder jointing system has the so-called sheet-fed processing structure, efficiency of the solder joint is low. For this reason, in order to enhance the substrate processing capability, the solder jointing system in which a plurality of neighboring solder joint areas are provided is set forth in FIG. 2 and FIG. 3 of Patent Application Publication (KOKAI) Hei 11-233934. In this case, since this equipment is substantially equivalent to the employment of a plurality of solder jointing systems, not only the cost is increased but also the wide area is needed.

The fifth subject is that the generation of residue on the substrate must be prevented after the solder joint. In above Patent Application Publication (KOKAI) Hei 7-164141, it is set forth that the mixture of the carboxylic acid and the diketones is introduced into the solder melting area in the solder jointing. In this case, the mixture which is supplied to the solder melting area in the form of the droplet is ready to generate the residue on the substrate.

In the prior art, in the step of manufacturing the semiconductor device having the electrode or the wiring containing the copper as the major material (the electrode and the wiring are referred to collectively as the "copper wiring, etc." hereinafter), the cleaning step must be carried out as ① the post-process of the chemical mechanical polishing (referred to as "CMP" hereinafter) step of the wiring in the semiconductor device, ② the pre-process of the physical vapor deposition (referred to as "PVD" hereinafter) process or the chemical vapor deposition (referred to as "CVD" hereinafter) process for the semiconductor substrate, ③ the post-process of the etching process, ④ the pre-process of the packaging process, etc. The cleaning steps in respective processes will be explained hereunder.

① The Cleaning Step as the Post-process of the CMP Step

As the cleaning method carried out after the CMP step of the copper wiring, etc. is completed, there is the method employing the carboxylic acid as the oxidizing material, like Patent Application Publication (KOKAI) Hei 11-33023, etc., as known in the prior art. This method executes previously the cleaning in the acid atmosphere after the cleaning in the alkaline atmosphere. In addition, there are many well-known examples about the method and the equipment employing the carboxylic acid as the oxidizing material, like the disclosure in Patent Application Publication (KOKAI) Hei 8-83780, etc.

Normally, as the cleaning carried out after the CMP step of the copper wiring, etc. is completed, the step of removing the particles by the brush scraper and the step of removing the copper oxide formed on the copper oxide and the copper wiring, etc. on the insulating layer by the chemicals are performed. The chemicals such as the citric acid, the oxalic acid, the hydrogen fluoride, etc., that can remove the copper oxide but has the small etching action against the copper are selected.

② The Cleaning Step as the Pre-process of the PVD Process and the CVD Process

As the oxide film removing method in the physical or chemical vapor deposition step, there is the method of removing the oxide film by the reducing gas plasma, like the disclosure in Patent Application Publication (KOKAI) Hei 9-82798, for example. According to this method, the copper wiring, etc. are cleaned by the inverse sputter using the mixed gas containing the hydrogen gas.

Also, in Patent Application Publication (KOKAI) Hei 9-232313 there is set forth the method of forming the copper wiring, etc. uniformly by cleaning the surface by using the reducing (hydrogen) gas when the copper wiring, etc. are formed. In addition, as set forth in Patent Application Publication (KOKAI) Hei 8-316233, etc., there is the method using the carboxylic acid as the reducing gas. According to this method, the copper wiring, etc. are reduced by causing locally the oxidation-reduction reaction while using the reducing gas and the oxidizing gas together, and then the burying is executed.

The PVD step is executed when the buried electrode is formed on the semiconductor substrate on which the underlying wiring made of the copper and the insulating layer for covering this wiring, for example, are formed, and the like. More concretely, the via hole is formed in the insulating layer at the buried-electrode forming position to expose the underlying wiring, and then the barrier metal is formed (film formation) in the via hole by the deposition using the PVD technology.

Then, the copper is buried in the via hole by the PVD technology, whereby the buried electrode that is connected to the underlying wiring is formed. The cleaning step is carried out to assure the electrical connection between the underlying wiring and the copper prior to the deposition of the barrier metal. More particularly, the surface of the underlying wiring is cleaned by the pre-process using the argon (Ar) sputter.

Also, in the CVD step, the SiN film of several hundreds nm thickness, etc. are deposited on the surface of the semiconductor substrate, for example, after the end of the CMP. This is to prevent the diffusion of the copper into the insulating layer from the underlying wiring and the buried electrode.

③ The Cleaning Step as the Post-process of the Etching Process

As described above, if the buried electrode connected to the underlying wiring is formed on the semiconductor substrate, the via hole is formed in the insulating film. The formation of the via hole is executed by providing the resist, that has the opening at the buried-electrode forming position, on the insulating layer and then etching the insulating layer while using the resist as a mask.

After the finish of this etching, the resist is removed by the ashing equipment and then the adhesion substance such as Si, C, Cu, etc. adhered onto the side wall of the via hole, etc. (referred to as "depo-substance" hereinafter), that is not removed yet, is cleaned by using the chemicals. It is difficult to use the strong acid or the alkaline as the chemicals since the underlying wiring made of the copper is exposed in the via hole, so that the weak-acid cleaning is often employed.

④ The Cleaning Step as the Pre-process of the Packaging Process

For instance, in the step of jointing the electrode containing the copper as the major material, normally the method employing the solder as the joint material is employed. In such case, the oxide film is always formed on the surface of the copper electrode prior to the joint or at the time of joint. Since this copper oxide is inferior in conductivity, it is executed usually to remove such copper oxide by executing the cleaning process. As the cleaning method of the copper oxide, there is the method of removing the copper oxide by employing the carboxylic acid as the forming gas, as disclosed in Patent Application Publication (KOKAI) Hei 7-75699, etc., for example.

However, there are the problems described hereunder in the above cleaning methods in the prior art.

① The Problem in the Cleaning Step as the Post-process of the CMP Step

As described above, in the cleaning step carried out as the post-process of the CMP step, the step of removing the particles and the step of removing the copper oxide on the insulating layer and the copper oxide formed on the copper wiring by the chemicals are carried out. When the process by using the chemicals is finished, the cleaning by the pure water is then performed to remove the chemicals.

However, there is the problem that the corrosion of the copper wiring, etc. is generated in the course during when the PH value of the chemicals is being changed from the acid to the neutral. This is because the slight etching proceeds on the overall surface of the copper wiring if the concentration of the chemicals is high, but the local etching occurs in the dilute solution.

FIG. 42 shows corrosions generated in the copper wiring, etc. having a 0.27 µm width when the concentration of the chemicals (CIREX (product name) as the etchant in the example shown in FIG. 42) is changed. From FIG. 42, it is found that the corrosions are generated in compliance with the change in the concentration of the chemicals. Also, if a large quantity of dissolved oxygen is also present in the chemicals, the corrosion proceeds locally. Therefore, in the cleaning method in the prior art, there is the problem that the uniform etching cannot be achieved.

② The Problem in the Cleaning Step as the Pre-process of the PVD Process and the CVD Process As described above, since the cleaning step executed as the pre-process of the PVD process and the CVD process is the physical removing method by the Ar sputter, the contaminant adheres again onto the underlying wiring (made of the copper) exposed from the bottom of the via hole, and also the shoulder of the via hole formed in the insulating layer is scraped off by the sputter. Therefore, there is the problem that the formation of the fine buried electrode cannot be achieved.

Also, in the CVD step, the SiN film, or the like is deposited on the surface of the semiconductor substrate, as described above. In this case, since the copper wiring, etc. are exposed to the atmosphere in the period from the CMP to the deposition of the CVD film, the oxidation of the copper wiring, etc. is unavoidable. For this reason, prior to the deposition of the diffusion preventing film such as the SiN film, or the like, normally the plasma process using the reducing gas such as $H_2$, $NH_3$, or the like is performed as the pre-process in the CVD equipment.

This plasma process is done under the temperature environment close to 400° C. Since such process is applied at the high temperature and in the state that the copper wiring, etc. are exposed, the copper surface is formed unevenly because of the recrystallization. Therefore, there is the problem that the coverage of the CVD film is locally degraded.

③ The Problem in the Cleaning Step as the Post-process of the Etching Process

As described above, the cleaning step executed after the etching process is mainly the cleaning step using the chemicals. But the cleaning action of this method is not sufficient. Therefore, there is the problem that the effective cleaning cannot be executed.

④ The Problem in the Cleaning Step as the Pre-process of the Packaging Process

As described above, in the prior art, the solder is employed as the joint material to joint the electrode made of the copper as the major material in the packaging. However, if the joint material whose resistivity is totally different from the electrode material is employed in transmitting the high speed signal, the reflection of the electromagnetic field is generated at that portion to disturb the high speed transmission. Therefore, it is desired that the different material should not be employed as much as possible to joint, otherwise the thinnest layer should be employed to the utmost to suppress the reflection of the signal if the different material is employed.

SUMMARY OF THE INVENTION

The present invention has been made in light of the above problems, and it is an object of the present invention to provide a solder jointing system which is capable of having a high processing capability and capable of preventing the re-oxidation or eliminating the danger of the explosion.

It is another object of the present invention to provide a solder jointing system and a solder jointing method which is capable of improving the throughput of the solder joint rather than the prior art, or preventing the generation of the residue on the substrate after the solder joint.

It is still another object of the present invention to provide a semiconductor device manufacturing method and a semiconductor device manufacturing system that is capable of removing uniformly and effectively the surface oxide film formed on the surface of the electrode or the wiring that contains the copper as the major material.

Also, it is yet still another object of the present invention to implement the good coverage in the film forming step that is carried out as the step subsequent to the cleaning step.

According to the present invention, the heating/melting areas and the carrying areas are provided in the chamber having the openings that are opened to the outer air, and in addition the formic-acid supplying means and the formic-acid exhausting mechanism are provided in the heating/melting areas.

Therefore, the low pressure atmosphere having the pressure distribution in which the lowest pressure is given in the heating/melting areas can be formed in the chamber, and also the temperature distribution in which the highest temperature is given in the heating/melting areas can be formed.

Accordingly, the oxides on the solder layers are removed by using the formic acid in the heating/melting areas, and also the formic acid is vaporized in the low pressure while jointing the solder layers by the heating and is removed by the exhausting mechanism. Since the exhaust and the inert gas supply are executed simultaneously in the heating/ melting areas, the partial pressure of the formic acid is low but the vaporizing ability of the formic acid is high. If the formic acid is removed from the surface of the solder-adhered object in the chamber in this way, the re-oxidation of the solder layers on the solder-adhered object can be prevented.

Also, since the solder-adhered object can be loaded/unloaded into/from the chamber via the openings that are opened to the outer air, the processing ability of the solder jointing process can be increased. In addition, if the carrying areas are held by the heating means at the predetermined temperature, the vaporization of the formic acid can be accelerated.

In addition, the formic acid supplied to the heating/melting areas is introduced into the formic-acid decomposing mechanism, the formic-acid recovering mechanism, or the like by the exhausting mechanism in response to the pressure distribution in the chamber not to leak from the openings. Therefore, the environmental disruption due to the formic acid can be prevented.

Further, the solder-adhered object heated in the heating/melting areas is unloaded to the outside via the openings while falling its temperature in response to the temperature distribution in the chamber. Therefore, the solder-adhered object can be taken out from the chamber at the temperature close to the room temperature, and thus the handling of the solder-adhered object can be facilitated.

If the formic-acid supplying means supplies the formic acid to the heating/melting areas at the concentration of less than 75 vol %, the formic acid of such concentration can be used safely without the explosive limit.

Besides, if the air-stream controlling means are arranged to the boundaries between the heating/melting areas and the carrying areas, the coming and going of the gas between mutual areas becomes difficult. Thus, the pressure and the temperature can be held easily in respective areas and also the entering of the formic acid into the carrying areas can be prevented.

Since the holding mechanism of the solder-adhered object is provided in the heating/melting areas, the oxide film can be removed by the formic acid after the solder-adhered object is stopped/held so as to reduce variation in the temperature of the solder-adhered object and variation in the pressure. Therefore, the uniformity of the process applied to all the solder-adhered objects can be achieved.

Since the solder-adhered object is loaded/unloaded into/from the chamber by the conveyer belts, the continuous processing of the solder-adhered object can be attained and thus the processing efficiency can be enhanced. In addition, the solder-adhered object can be supplied intermittently into the chamber by using the above holding mechanism together, so that the productivity can be improved not to bring about the reduction in the quality.

According to the present invention, there are provided the magazine for containing a plurality of substrates having the metal pattern to which the solder layers are adhered thereon at a distance, and the heater arranged such that the magazine can be confined in the heater. Therefore, the solders on a plurality of substrates can be jointed at the same time and thus the throughput can be improved rather than the prior art.

Also, since the heater can be taken away not to surround the magazine after the solder layers are heated/melted by the heater, the temperature of the solder layers can be easily lowered and thus the time required from the heating to the cooling can be shortened. In addition, since the mechanism for fitting the cooling gas introducing mechanism to the heater is employed, the solder layers can be cooled more quickly by the cooling gas immediately after the heating of the solder layers is finished, and thus the solder cooling time can be shortened.

If the formic acid is supplied to the solder layers, the formic acid and the gas are mixed to suppress the excessive supply of the formic acid, or the formic acid is changed into the mists by the ultrasonic wave. Therefore, the excessive supply of the formic acid can be suppressed.

Further, since the magazine is placed only in the heating chamber, the adhesion of the pollutant in the air onto the magazine can be suppressed and thus the contamination of the substrates during the heating can be prevented.

Besides, since the heater and the magazine are confined in the heating chamber from the introduction of the formic acid into the heater to the exhaust thereof, the leakage of the formic acid from the heating chamber to the outside can be prevented.

According to the another present invention, the present invention has the feature that, in order to remove the oxide film (surface oxide film) formed on the surface of the electrode or the wiring containing the copper as the main material (the copper wiring, etc.), the surface oxide film is changed into the carboxylate and then reduced/removed. Accordingly, the removal of the surface oxide film can be executed uniformly and effectively not to give the physical and chemical damages to the copper wiring, etc. per se and their peripheral structures.

The surface oxide film is mainly formed of copper (II) oxide (CuO). Even if the surface oxide film is left as it is in the reductive hydrogen atmosphere, or the like, such surface oxide film is not reduced unless the temperature is increased to exceed 400° C. or more. Therefore, in order to cause the copper surface to reduce quickly at the low temperature, such a reaction system is employed in the present invention that the surface is changed into the salt state having the high reactivity once and then the reduction of the copper is generated.

Also, in the present invention, the carboxylate is selected as the salt state having the high reactivity, and the formic acid is employed as the carboxylic acid gas used to form the carboxylate, and the heating of more than 200° C. but less than 400° C. is applied, for example.

The reaction when the formic acid is employed will be given as follows.

$$2HCOOH + CuO \rightarrow (HCOO)_2Cu + H_2O$$

$$(HCOO)_2Cu \rightarrow Cu + H_2O + 2CO_2$$

In this manner, since the formate is decomposed into $H_2O$ and $CO_2$, the impurity does not remain on the semiconductor substrate, on which the copper wiring, etc. are formed, after the cleaning process. Thus, the formate has no influence upon the post-step of this cleaning process.

In contrast, various types (e.g., acetic acid) may be employed as the employed carboxylic acid if they can generate the copper and the carboxylate. However, the formic acid has the quickest reaction as the carboxylate, and thus it is preferable from this viewpoint to employ the formic acid. Also, in order to reduce the copper from the generated carboxylate, the reactive gas (e.g., the hydrogen, etc.) may be introduced.

Meanwhile, if the above carboxylic acid is employed to remove the surface oxide film, the environmental temperature in the removing process must be set properly in order to remove effectively the surface oxide film. Therefore, the inventors of the present invention examined the temperature conditions necessary for the reduction of the surface oxide film and then obtained the results shown in FIG. 43. It is considered from these results that, unless the atmospheric temperature for the reduction is more than 200° C. but less than 400° C., the sufficient reducing rate cannot be achieved and that this temperature may be the limit temperature in practical use because the growth of the copper crystal grain is accelerated at the temperature higher than this temperature to thus generate the surface unevenness.

On the contrary, in the structure of the semiconductor device manufacturing system, since the seizure (generation of the foreign matter) is caused when the droplets are adhered onto the insulating layer on the semiconductor substrate in introducing the carboxylic acid, a method of preventing this seizure is needed. Also, since the copper is the material that is ready to re-oxidize, a structure for preventing the re-oxidation is needed.

This respect can be overcome by spraying the carboxylic acid as the small-particle mists to change the sprayed carboxylic-acid mists into the vapor when the carboxylic acid is supplied to the copper wiring, etc. For example, the spray nozzle BIMK6004 manufactured by the Ikeuchi Co., Ltd. can spray the carboxylic acid having the particle diameter of 15 to 30 $\mu$m in the air according to the conditions, and also the spray nozzle BIMV8002S can spray the carboxylic acid having the particle diameter of 10 to 20 $\mu$m.

As other means, there may be employed a method of generating the vapor of the carboxylic acid by heating the gas (e.g., nitrogen gas) that is mixed into the carboxylic-acid mists. For example, the line heater L-00-100W manufactured by the Kikuchi Co., Ltd. can heat the gas up to 300° C. at a gas flow rate of 12 liter/min at maximum.

In addition, there may be employed a method of generating the vapor indirectly by spraying the carboxylic-acid mists onto the hot plate, etc. In this case, the heater serving as the hot plate is heated to 250 to 300° C., then the carboxylic-acid mists (e.g., the formic-acid mists) are sprayed onto this hot plate, and then the surface oxide film may be removed by the generated vapor.

Meanwhile, since there is a possibility of the explosion during the process according to the concentration of the carboxylic acid used to remove the copper oxide film, this possibility must be avoided. For example, if the formic acid is employed as the carboxylic acid, there is the danger of ignition/explosion by the trouble in the equipment because the formic acid has the flash point of 69° C. at a volume concentration of 98%.

However, if the volume concentration is set to less than 76%, the flash point is lost and no danger of the explosion is present, nevertheless the reducing ability is not influenced. As a result, if the concentration of the carboxylic acid is set lower than the concentration at which the flash point does not exist (in the case of the formic acid, the volume concentration is 75%), the safety in the cleaning process can be improved.

BRIEF DESCRIPTION OF THE DRAWINGS

FIGS. 7A to 7F are sectional views showing processing steps in the solder jointing system according to the first embodiment of the present invention;

FIG. 36 is a flow chart showing steps of the semiconductor device manufacturing method shown in FIGS. 35A to 35E;

FIG. 42 is a table showing surface etching states in the CMP step; and

FIG. 43 is a table showing temperature conditions required to reduce a surface oxide film.

DESCRIPTION OF THE PREFERRED EMBODIMENTS

Embodiments of the present invention will be explained in detail with reference to the accompanying drawings hereinafter.

(First Embodiment)

Figure 1:
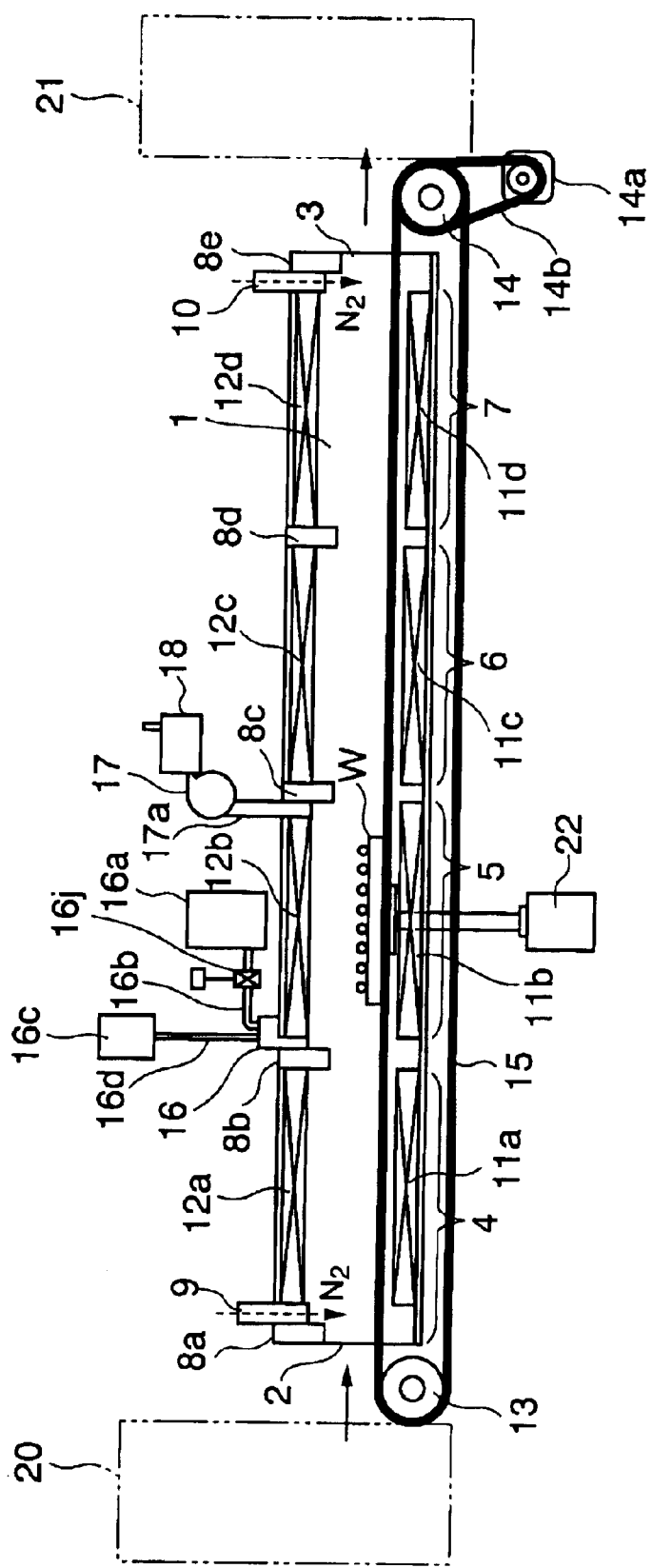
FIG. 1 is a sectional view showing a solder jointing system according to a first embodiment of the present invention.

FIG. 1 is a sectional view showing a solder jointing system according to a first embodiment of the present invention.

In FIG. 1, a chamber 1 has a loading port 2 for taking a solder-adhered object (work) w such as the semiconductor device, the electronic parts, or the like into the inside and an unloading port 3 for taking out the solder-adhered object w to the outside. Both the loading port 2 and the unloading port 3 are opened into the air.

First to fourth areas 4 to 7 are arranged in sequence from the loading port 2 to the unloading port 3 in the chamber 1. The first to fourth areas (spaces) 4 to 7 have a size in which the solder-adhered object w can be placed respectively, and they are partitioned longitudinally by gas shielding plates 8a to 8e with a heater, which are fitted to the upper portion of the chamber 1.

In the chamber 1, inert gas introducing pipes 9, 10 for discharging the inert gas such as nitrogen, argon, or the like into the chamber 1 respectively are fitted close to the loading port 2 but on the side inner than the gas shielding plate 8a and close to the unloading port 3 but on the side inner than the gas shielding plate 8e respectively. Air curtains are formed by the inert gas that is discharged from the inert gas introducing pipes 9, 10.

Also, lower and upper heaters 11a to 11e, 12a to 12e whose temperature is managed by a controller (not shown) are fitted to lower and upper portions of the first to fourth areas 4 to 7 in the chamber 1 respectively. These heaters 11a to 11e, 12a to 12e are provided to heat the solder. The infrared lamp may be employed as the upper heaters 12a to 12e. The upper heaters 12a to 12e may be omitted, but the higher efficiency of the heating can be achieved if they are provided. Also, the upper heaters 12a to 12e are placed at positions higher than the bottom ends of the gas shielding plates 8a to 8e not to eliminate a gas-flow suppressing effect that can be attained by the gas shielding plates 8a to 8e.

The second area 5 serves as a heating/melting area in which the solder can be heated/melted in accordance with the temperature control of the heaters 11b, 12b.

Figure 2:
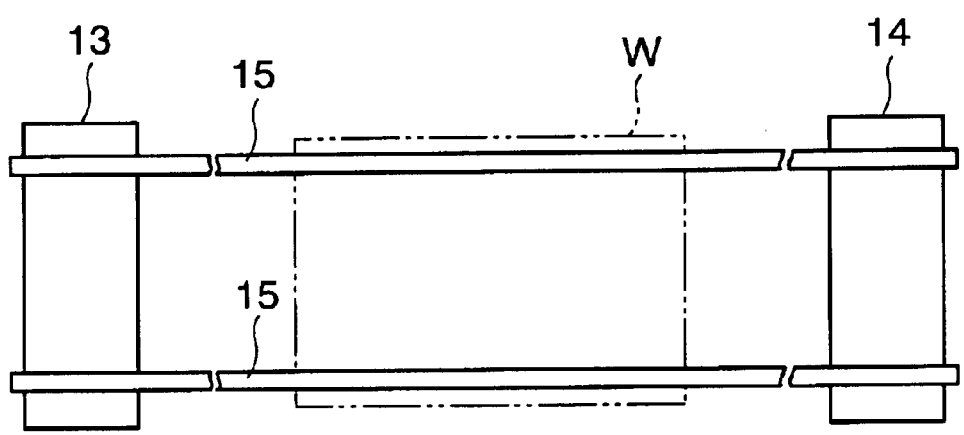
FIG. 2 is a plan view showing a conveyer belt in the solder jointing system according to the first embodiment of the present invention.

Pulleys 13, 14 are provided on the outer sides of the loading port 2 and the unloading port 3 of the chamber 1 respectively. Two loop conveyer belts 15 passing through the inside of the chamber 1 and the lower outside of the chamber 1 are put on these pulleys 13, 14 laterally at a distance, that is narrower than the solder-adhered object w. FIG. 2 shows a relationship among the pulleys 13, 14, the conveyer belts 15, and the solder-adhered object w.

One pulley 14 is rotated by a rotation driving force, that is transmitted from a motor (driving source) 14a via a belt 14b, to move the conveyer belts 15 from the loading port 2 to the unloading port 3 in the chamber 1.

The conveyer belts 15 are arranged in the chamber 1 separately from lower ends of the gas shielding plates 8a to 8e by a distance that is slightly larger than a height of the solder-adhered object w, whereas they are separated from the lower heaters 1a to 11e to suppress the influence of the heat upon the inside of the solder-adhered object w.

A formic acid spraying unit 16 is connected to an upper portion in the second area 5 in the chamber 1 near the boundary between the second area 5 and the first area 4. Also, an air sucking pipe 17a of an exhaust fan 17 that is provided on the outside of the chamber 1 is connected to an upper portion in the second area 5 in the chamber 1 near the boundary between the second area 5 and the third area 6.

Figure 3:
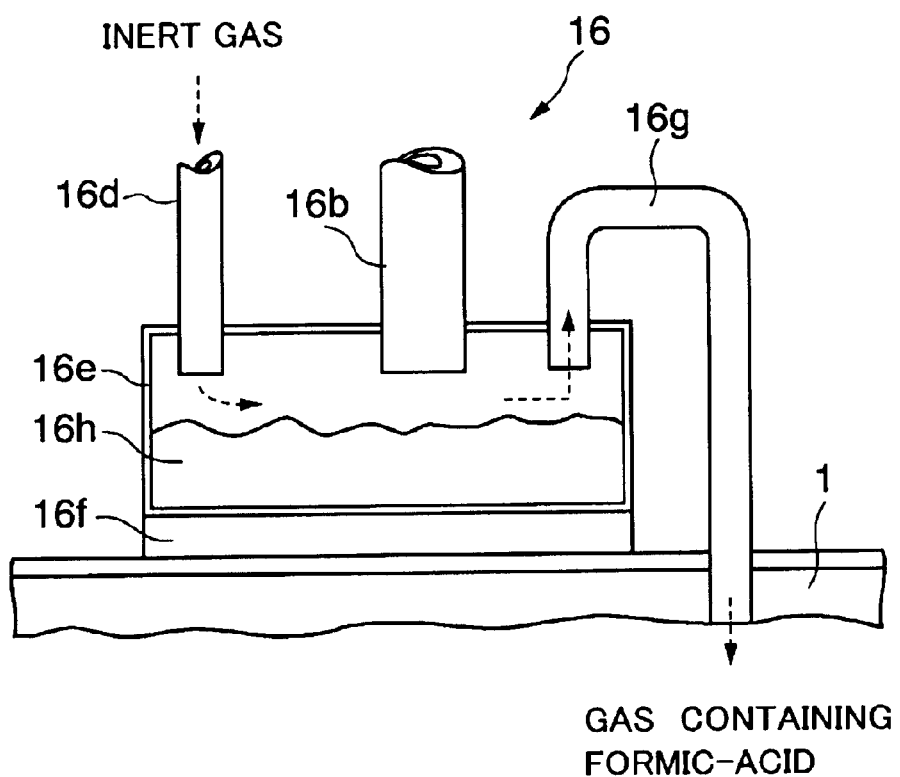
FIG. 3 is a sectional view showing a formic acid spraying unit in the solder jointing system according to the first embodiment of the present invention.

As shown in FIG. 3, for example, the above formic acid spraying unit 16 comprises a formic-acid containing liquid introducing pipe 16b for introducing a formic-acid containing solution 16h from a formic-acid containing solution tank 16a provided on the outside of the chamber 1, a gas introducing pipe 16d for introducing an inert gas such as nitrogen, argon, or the like from a bomb 16c, a vessel 16e into an upper portion of which the formic-acid containing liquid introducing pipe 16b and the gas introducing pipe 16d are inserted, a ultrasonic vibration plate 16f placed to come into contact with a bottom portion of the vessel 16e, and a gas discharging pipe 16g extracted from the upper portion of the vessel 16e into the inside of the chamber 1. A heater (not shown) may be provided to the formic-acid containing solution tank 16a to accelerate the vaporization of the formic-acid containing solution 16h. As the formic-acid containing solution 16h, there is the mixture in which the formic acid is mixed into the water at a concentration of less than 75 vol %.

Then, the formic-acid containing solution 16h that is supplied from the formic-acid containing liquid introducing pipe 16b into the vessel 16e is vaporized/gasified or changed into the mist by the vibration of the ultrasonic vibration plate 16f. Then, such formic acid as well as the inert gas introduced via the gas introducing pipe 16d is discharged into the chamber 1 via the gas discharging pipe 16g.

If the formic acid contained in the formic-acid containing solution 16h is controlled to have a concentration of less than 75 vol %, the gas containing formic-acid discharged from the gas discharging pipe 16g has no explosive limit and can be used safely. In this case, the water, for example, in addition to the formic acid is contained in the formic-acid containing solution 16h.

The method of forming the formic acid into the gas is not limited to the ultrasonic vibration method. There is the method of bubbling the formic-acid containing solution 16h by using the inert gas discharged from the gas introducing pipe 16d inserted into the vessel 16e. In this case, a symbol 16j in FIG. 1 denotes a valve for adjusting a flow rate of the formic-acid containing liquid supplied via the formic-acid containing liquid introducing pipe 16b or stopping the flow of the solution.

Figure 4:
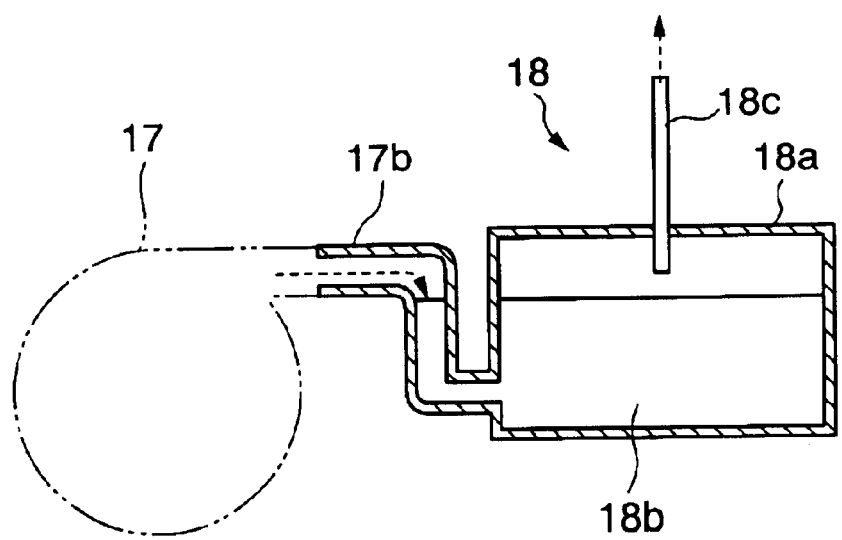
FIG. 4 is a sectional view showing a formic acid recovering mechanism used in the solder jointing system according to the first embodiment of the present invention.

The sirocco fan having the high exhaust capability, for example, is desired as the above exhaust fan 17, and a formic-acid recovering mechanism 18 is connected to the exhaust port. As shown in FIG. 4, for example, the formic-acid recovering mechanism 18 has such a structure that a stainless exhaust pipe 17b of the exhaust fan 17 is inserted into a solution 18b in a closed stainless liquid tank 18a and also a stainless exhaust pipe 18c is connected to an upper portion of the liquid tank 18a. The solution 18b is a water or an alcohol into which the formic acid is easily dissolved.

A loader 20 for supplying the semiconductor device, the electronic parts, or the like onto the conveyer belts 15 is arranged on the outside of the loading port 2 of the chamber 1. Also, an unloader 21 for recovering the semiconductor device, the electronic parts, or the like from the conveyer belts 15 is arranged on the outside of the unloading port 3 of the chamber 1.

Also, an air cylinder 22 is provided under the second area 5. This air cylinder 22 moves upward through two conveyer belts 15 to lift up the solder-adhered object w to the position higher than the conveyer belts 15, then stops temporarily to hold the solder-adhered object w, and then moves downward to bring down the solder-adhered object w.

In the solder jointing system having the above structure, the inert gas that is discharged downward from the inert gas introducing pipes 9, 10 isolates the inside atmosphere of the chamber 1 from the outside atmosphere. Also, the pressure in the interior of the chamber 1 is lowered by the exhaust fan 17 connected to the second area 5, and in addition the flow of the gas in the chamber 1 is disturbed by a plurality of gas shielding plates 8a to 8e to some extent. Therefore, a pressure distribution in the chamber 1 is given as shown in FIG. 5, for example, to have such a pressure gradient that the pressure is lowest in the second area 5 and the pressure is increased gradually from the second area 5 to the loading port 2 to come up substantially to the atmospheric pressure and have such a pressure gradient that the pressure is increased gradually from the second area 5 to the unloading port 3 to come up to the atmospheric pressure.

Figure 5:
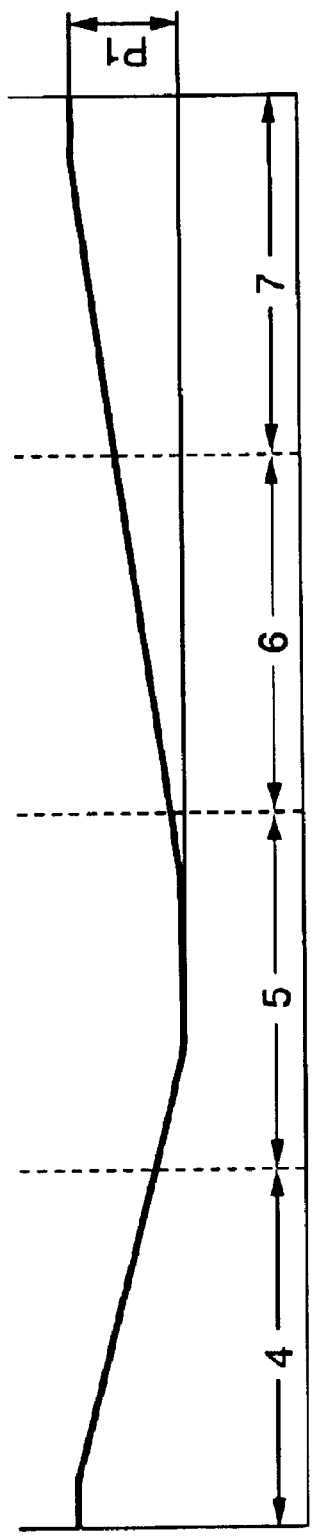
FIG. 5 is a view showing an example of a pressure distribution in a chamber of the solder jointing system according to the first embodiment of the present invention.

In FIG. 5, for example, the pressure is 1030 to 1020 hPa in the first area 4, the pressure is 990 to 1000 hPa in the second area 5, the pressure is about 1010 hPa in the third area 6, and the pressure is 1030 to 1020 hPa in the fourth area 7, whereby the pressure $P_1$ near the loading port 2 and the unloading port 3 becomes highest.

Then, a method of jointing the solder exposed from the solder-adhered object w to the metal pattern by using the above solder jointing system will be explained hereunder. Here a semiconductor device 30 is used as the solder-adhered object w.

Figure 6A:
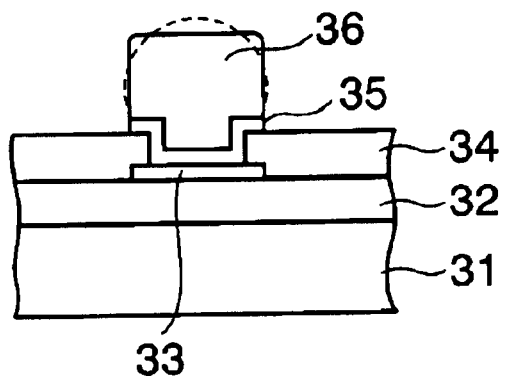
FIGS. 6A and 6B are sectional views showing a part of a semiconductor device as a heated object of the solder jointing system according to the first embodiment of the present invention.

As shown in FIG. 6A, for example, the semiconductor device 30 comprises a silicon (semiconductor) substrate 31 on which a semiconductor device such as a transistor, or the like is formed, an insulating film 32 formed thereon, and an electrode pad 33 formed on the insulating film 32. The electrode pad 33 is connected electrically to a semiconductor element (not shown) formed on the silicon substrate 31. The insulating film 32 may be formed to insulate the multi-layered wiring. The electrode pad 33 is exposed via an opening of an insulating cover film 34 formed thereon. Then, an underlying metal layer 35 consisting of titanium and nickel is formed in the exposed portion. A solder layer 36 is formed on the underlying metal layer 35 by the nonelectrolytic plating method, the electrolytic plating method, the printing method, or the like.

Figure 6B:
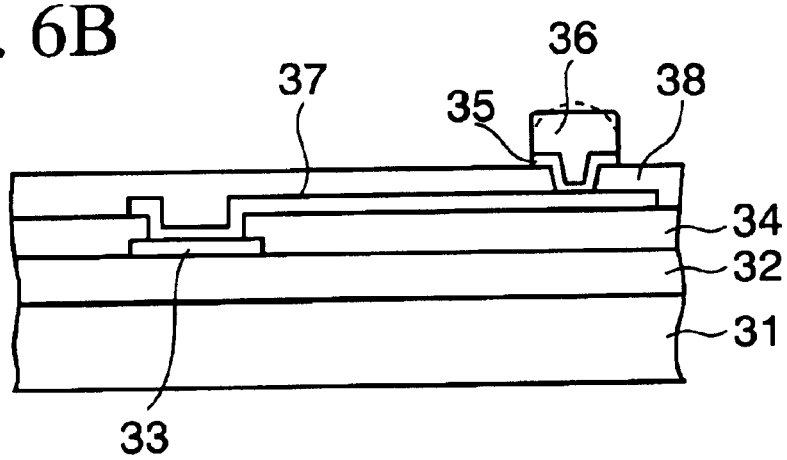

As shown in FIG. 6B, it is known that the electrode pad 33 and the solder layer 36 are electrically connected mutually via a leading wiring (relocation wiring) 37. The leading wiring 37 is formed on the insulating cover film 34. One end of the leading wiring 37 is connected the electrode pad 33 via the opening of the insulating cover film 34, and the other end is connected to the underlying metal layer 35 and the solder layer 36 via an opening of an overlying insulating cover film 38 that covers the leading wiring 37.

In case such solder layer 36 is jointed to the electrode pad 33 or the leading wiring 37 via the underlying metal layer 35, first a plurality of semiconductor devices 30 are loaded into the loader 20 shown in FIG. 1. The semiconductor devices 30 in the loader 20 are fed intermittently onto the rotating conveyer belts 15 one by one at an interval.

As shown in FIG. 7A, the first semiconductor device 30 in the loader 20 is fed onto the rotating conveyer belts 15. Then, the semiconductor device 30 on the rotating conveyer belts 15 is passed through the first area 4 in the chamber 1 according to the rotation of the conveyer belts 15. Then, as shown in FIGS. 7B and 7C, the semiconductor device 30 is lifted up by the rise of the air cylinder 22 positioned under the second area 5 at a point of time when the semiconductor device 30 enters completely into the second area 5 as the heating/melting zone.

Then, the formic acid is supplied from the formic-acid spraying unit 16 to the solder layer 36 on the semiconductor device 30 at a point of time when the environments of the semiconductor device 30 such as the temperature, the pressure, etc. are stabilized.

In this case, the supply of the formic acid from the formic-acid spraying unit 16 to the semiconductor device 30 may be carried out in the middle of the movement of the semiconductor device 30 from the first area 4 to the second area 5.

As the first stage, in order to remove the oxide film on the surface of the solder layer 36 by the reducing action of the formic acid, the heating temperature of the semiconductor device 30 by the heaters 11b, 12b arranged in the second area 5 is controlled to the temperature that is lower than the melting point of the solder layer 36 by about 50 to 90° C., for example.

The formic acid starts to act effectively from the temperature that is lower than the melting point of the solder layer 36 by about 50° C., and the oxide film on the surface of the solder layer 36 is removed gradually at that temperature. If the solder layer 36 is formed of the eutectic tin-lead (SnPb) solder, the temperature at which the reducing action of the formic acid becomes effective is in excess of about 150° C. Also, if the solder layer 36 is formed of the refractory solder material, e.g., tin-silver (SnAg), the temperature at which the reducing action of the formic acid becomes effective is in excess of about 180° C.

Meanwhile, because the first area 4 is located adjacent to the loading port 2, the temperature of the first area 4 near the loading port 2 comes close to the room temperature in the atmosphere. As a result, the first area 4 has such a temperature gradient that the temperature is increased from the loading port 2 toward the second area 5. Also, since the air in the neighborhood of the boundary between the second area 5 and the third area 6 is exhausted by the exhaust fan 17 in the second area 5, the gas containing formic-acid supplied from the formic-acid spraying unit 16 substantially flows only into the second area 5.

As the second stage, the temperature of the heaters 11b, 12b in the second area 5 is controlled such that the temperature can rise to exceed the melting point or more of the solder layer 36 after the reducing process by the formic acid is finished. Accordingly, the temperature of the solder layer 36 rises, and then the gas generated or existing in the inside of the solder layer 36 escapes gradually in the course of the temperature rise and also the solder layer 36 is melted gradually. Therefore, the scattering or the molding failure of the solder layer 36 is not caused. In addition, the vaporization of the formic acid on the surface of the solder layer 36 is accelerated by the heating under the low pressure atmosphere. The solder layer 36 is melted and formed as indicated by a broken line in FIGS. 6A and 6B.

The heating temperature of the heaters 11b, 12b is returned to the melting point or less of the solder layer 36 within a predetermined time, e.g., within one minute after the solder layer 36 is heated/melted by the heaters 11b, 12b within the predetermined time in the second area 5.

Figure 7D:
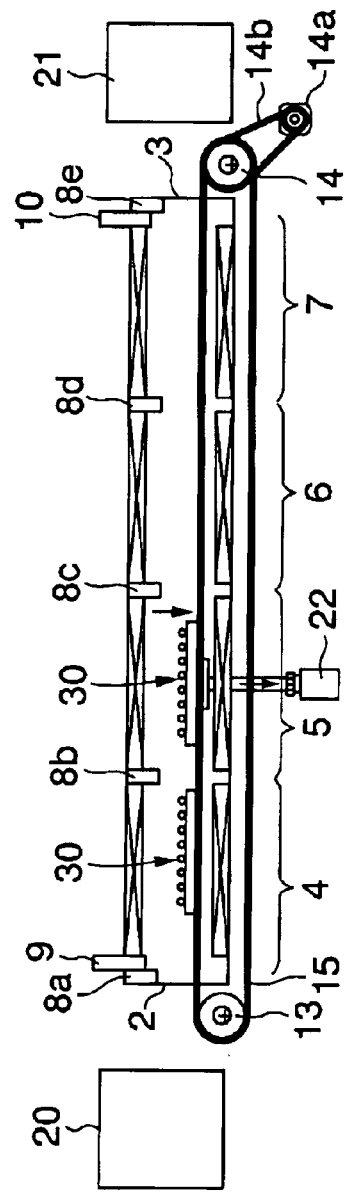

After this, as shown in FIG. 7D, the first semiconductor device 30 is returned onto the conveyer belts 15 by causing the air cylinder 22 to fall down, and then the first semiconductor device 30 is moved to the third area 6 by the rotation of the conveyer belts 15.

The cooling of the solder layer 36 may be executed in the third area 6. In this case, it is preferable that the solder layer 36 should be cooled down below the melting point within one minute from the end of the solder heating. Therefore, the air cylinder 22 and the conveyer belts 15 must be operated so as to complete the movement of the semiconductor device 30 from the second area 5 to the third area 6 within one minute.

At this time, as shown in FIG. 7C, the second semiconductor device 30 is fed from the loader 20 into the first area 4 via the conveyer belts 15 to standby there during when the first semiconductor device 30 is lifted up by the air cylinder 22. The supply of the semiconductor device 30 from the loader 20 to the conveyer belts 15 and the drive/stop of the conveyer belts 15 are managed by a timer.

The operations such that the second semiconductor device 30 and subsequent semiconductor devices are fed to the first area 4 to standby there and then fed into the second area 5 are executed intermittently on the basis of the processing time of the semiconductor device 30 in the second area 5. Accordingly, the process in the second area 5 can be done stably and thus the improvement of the productivity can be achieved not to bring about the degradation of the quality.

Figure 7E:
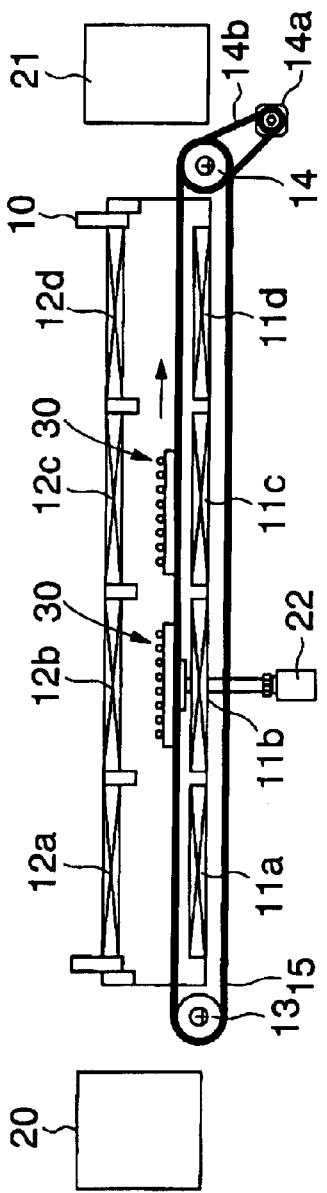

As shown in FIG. 7E, the second semiconductor device 30 that is stood by in the first area 4 is moved into the second area 5 synchronously with the movement of the first semiconductor device 30, then the formic acid is supplied to the second semiconductor device 30 as described above, then the second semiconductor device 30 is lifted up by the air cylinder 22, and then the solder layer 36 is heated/melted.

Figure 7F:
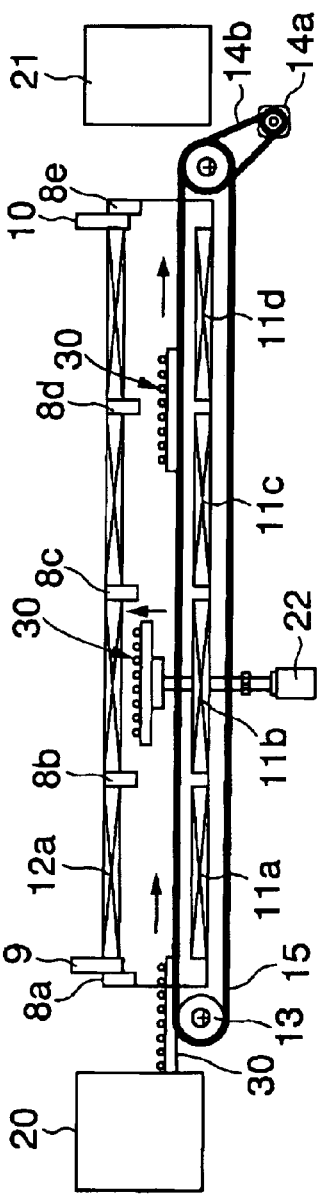

As shown in FIG. 7F, the first semiconductor device 30 passes through the third area 6 and the fourth area 7 after the second semiconductor device 30 is lifted up by the air cylinder 22. The temperature of the first semiconductor device 30 is gradually lowered every time when the first semiconductor device 30 passes through the third area 6 and the fourth area 7. The heaters 11c, 12c in the third area 6 are managed at the temperature that is below the melting point of the solder but is more than 110° C. to facilitate the removal of the formic acid. In addition, the heaters 11d, 12d in the fourth area 7 heats the semiconductor device 30 at the temperature that is lower than the heating temperature in the third area 6 and is close to the room temperature. Further, since the semiconductor device 30 is showered with the inert gas near the unloading port 3 to cool, such semiconductor device 30 have no temperature influence on other semiconductor devices 30 that are stored in the unloader 21 even when it is stored in the unloader 21 through the unloading port 3.

In this case, when the first semiconductor device 30 is put completely into the unloader 21 or after that, the third semiconductor device 30 is fed from the loader 20 onto the conveyer belts 15 at the timing that such third semiconductor device 30 can enter perfectly into the first area 4 and can be put on standby.

The air curtain of the inert gas is formed at the loading port 2 and the unloading port 3 of the chamber 1 respectively. The inert gas is sucked mainly by the exhaust fan 17 and exhausted to the outside. Accordingly, the gas containing formic-acid discharged from the formic-acid supplying spray 16 is exhausted along the flow of the gas not to leak to the outside of the chamber 1. The gas containing formic-acid exhausted by the exhaust fan 17 is dissolved into the solution in the formic-acid recovering mechanism 18 shown in FIG. 4 and is recovered.

Next, when the formability and the oxide film of the solder layer 36 jointed to the underlying metal 35 were examined by introducing the formic acid of 75 vol % into the second area 5 in the chamber 1, then heating/melting the solder layer 36, and then cooling the solder layer 36 in the third area 6 and thereafter, results given in Table 1 were derived.

According to Table 1, it becomes apparent that the removal of the oxide film of the solder layer 36 and the formation of the solder layer 36 can be executed in the second area 5, the pressure of which is lowered rather than the atmospheric pressure and which contains the formic acid, in the chamber 1 and that the joint between the solder layer 36 and the pad can be executed well without the flux.

In addition, since the loading port 2 and the unloading port 3 of the chamber 1 are opened into the atmosphere, the loading/unloading of the semiconductor device 30 into/from the equipment can be facilitated rather than the prior art and also the workability can be improved.

TABLE 1

[Solder melting conditions and Oxide film removing effect]

| solder composition | melting peak temperature | melting zone pressure | oxide film | formability |
|---|---|---|---|---|
| Pb95:Sn5 | 200° C. | 1000 hPa | formed | NG |
|  | 300° C. | 1000 hPa | not formed | NG |
|  | 350° C. | 1000 hPa | not formed | OK |
|  | 380° C. | 1000 hPa | not formed | OK |
| Sn-3.5Ag | 170° C. | 1000 hPa | formed | NG |
|  | 240° C. | 1000 hPa | not formed | NG |
|  | 270° C. | 1000 hPa | not formed | OK |
| Eutectic Pb—Sn | 110° C. | 1000 hPa | formed | NG |
|  | 170° C. | 1000 hPa | not formed | NG |
|  | 220° C. | 1000 hPa | not formed | OK |

Next, when it was examined how the re-oxidation of the solder layer 36 is influenced by the difference in handling after the solder layer 36 made of Pb95:An5 is heated/melted, results given in Table 2 were derived.

According to Table 2, the re-oxidation caused by the formic acid can be prevented by heating/melting the solder layer 36 at the peak temperature of 350° C. in the second area 5 in the chamber 1, then keeping the solder layer 36 at more than 110° C. for a predetermined time, and then cooling the solder layer 36. However, if the temperature is set to 70° C. after the heating/melting, the solder layer 36 is oxidized again. It may be guessed that, since removal of the formic acid from the surface of the solder layer 36 is incomplete, this re-oxidation is caused.

TABLE 2

[Post-melting heating conditions and Generation of re-oxidation]

| Solder Composition | Melting peak temperature | Post-melting heating temperature | Post-melting heating-holding time | re-oxidation |
|---|---|---|---|---|
| Pb95:Sn5 | 350° C. | 180° C. | 4 min | not generated |
|  | 350° C. | 110° C. | 8 min | not generated |
|  | 350° C. | 70° C. | 12 min | generated |

Figure 8:
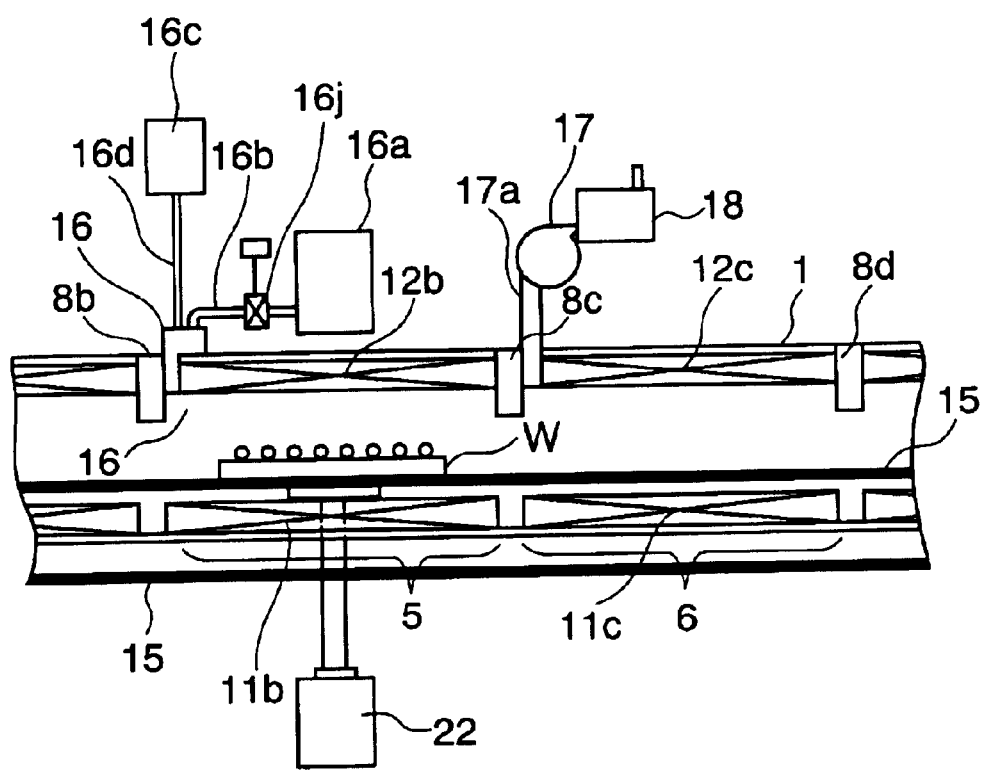
FIG. 8 is a sectional view showing a structure in which a position of an exhaust fan is changed in the solder jointing system according to the first embodiment of the present invention.

The position of the air sucking pipe 17a of the exhaust fan 17 may be set in the third area 6 close to the boundary between the third area 6 and the second area 5, as shown in FIG. 8, in place of the second area 5. Also, if the upper heaters 11a, 12a, 13a, 14a in the chamber 1 are omitted, the air cylinder 22 may be omitted at the same time and the solder layer 36 may be heated only by the lower heaters 11b, 12b, 13b, 14b.

Figure 9A:
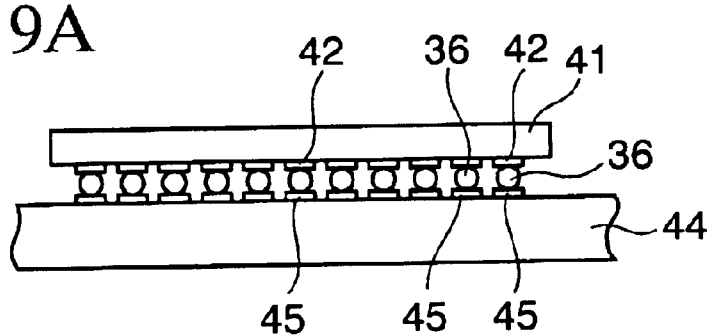
FIGS. 9A and 9B are sectional views showing the formation of a semiconductor module as the heated object of the solder jointing system according to the first embodiment of the present invention.
Figure 9B:
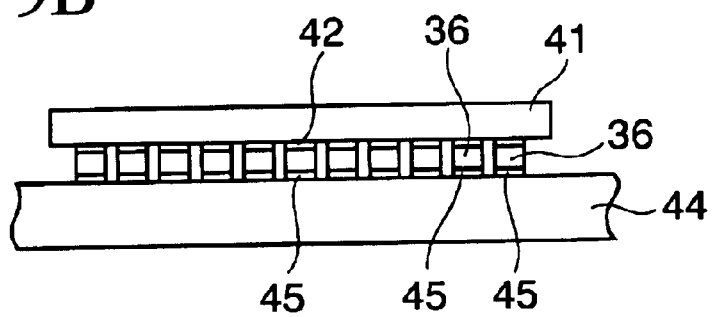

In the above explanation, the semiconductor device 30 having the electrode pad 33 shown in FIGS. 6A and 6B is taken as the example. But a module as shown in FIG. 9A may be employed. In FIG. 9A, the solder layers 36 formed on wirings 42 of an electronic parts 41 are put on wirings 45, and then the solder layers 36 are heated/melted in the chamber 1. Thus, as shown in FIG. 9B, the opposing wirings 42, 45 are jointed mutually via the solder layers 36.

(Second Embodiment)

Figure 10:
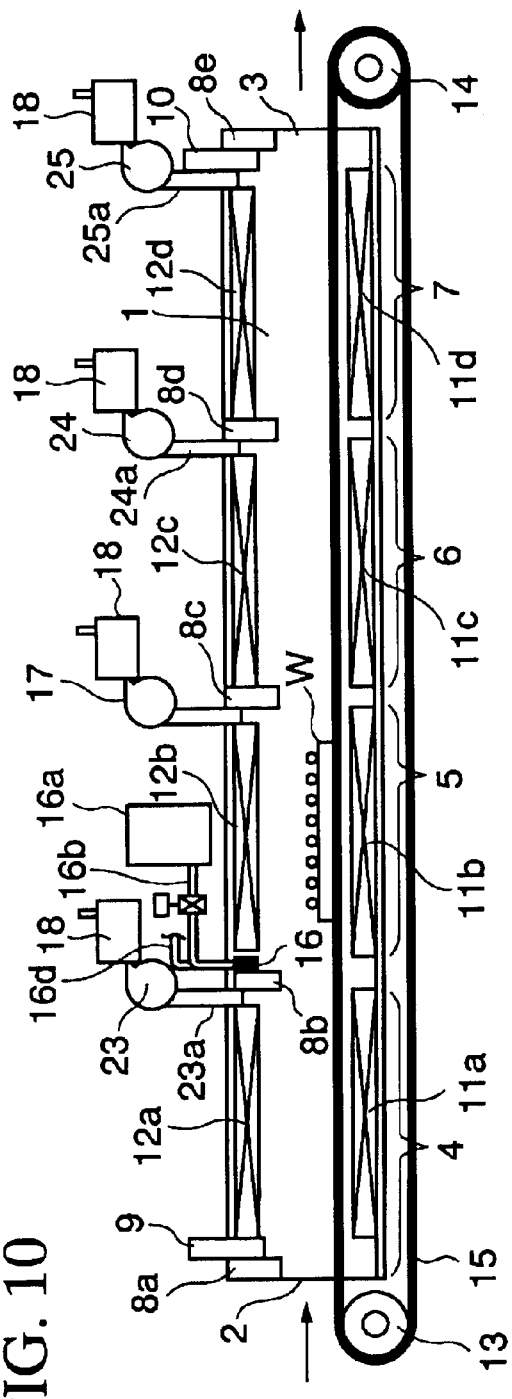
FIG. 10 is a sectional view showing a solder jointing system according to a second embodiment of the present invention.

In the first embodiment, one exhaust fan 17 is connected only to the second area 5 in the chamber 1. In addition to this, as shown in FIG. 10, sucking pipes 23a, 24a, 25a of exhaust fans 23, 24, 25 may be provided near the boundary portion between the first area 4 and the second area 5, near the boundary portion between the third area 6 and the fourth area 7, and near the unloading port 3 in the fourth area 7 respectively. The formic-acid recovering mechanism 18 having the same structure is fitted to exhaust ports of these exhaust fans 23, 24, 25.

Figure 11:
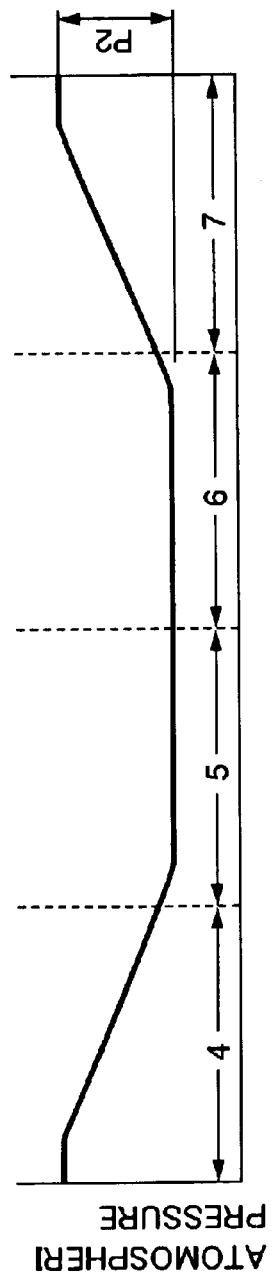
FIG. 11 is a view showing a pressure distribution in the chamber of the solder jointing system shown in FIG. 10.

If the exhaust fans 17, 23, 24, 25 are provided to the first area 4 to the fourth area 7 respectively, the atmosphere of the second area 5 can be set easily to the constant low pressure state by adjusting the pressure in the first area 4, the third area 6, and the fourth area 7 one by one. For example, if the exhaust of the exhaust fans 17, 24 in the second area 5 and the third area 6 is set stronger than the exhaust fans 23, 25 in the first area 4 and the fourth area 7, a pressure distribution in the second area 5 is made constant, as shown in FIG. 11.

In contrast, in the first embodiment, the exhaust fan 17 is connected only in the second area 5. However, since the influence of the outer air from the loading port 2 and the unloading port 3 is great in this situation, not only the pressure in the chamber cannot be so lowered but also it is difficult to adjust the low pressure distribution in the second area 5 constantly.

Since the inert gas introducing pipe 10 is connected near the exhaust fan 25 in the fourth area 7, an amount of exhaust may be adjusted not to exhaust excessively the inert gas supplied from the inert gas introducing pipe 10, otherwise the sucking pipe 25a of the exhaust fan 25 may be arranged in the middle of the fourth area 7 or near the fourth area 7.

(Third Embodiment)

In the first embodiment, the gas shielding plates 8b to 8d are provided to the boundaries between the first area 4 and the second area 5, the second area 5 and the third area 6, and the third area 6 and the fourth area 7 respectively. In this case, as shown in FIGS. 12A and 12B, the air curtain may be provided instead of the gas shielding plates 8b, 8c provided before and after the second area 5.

Figures 12A, 12B:
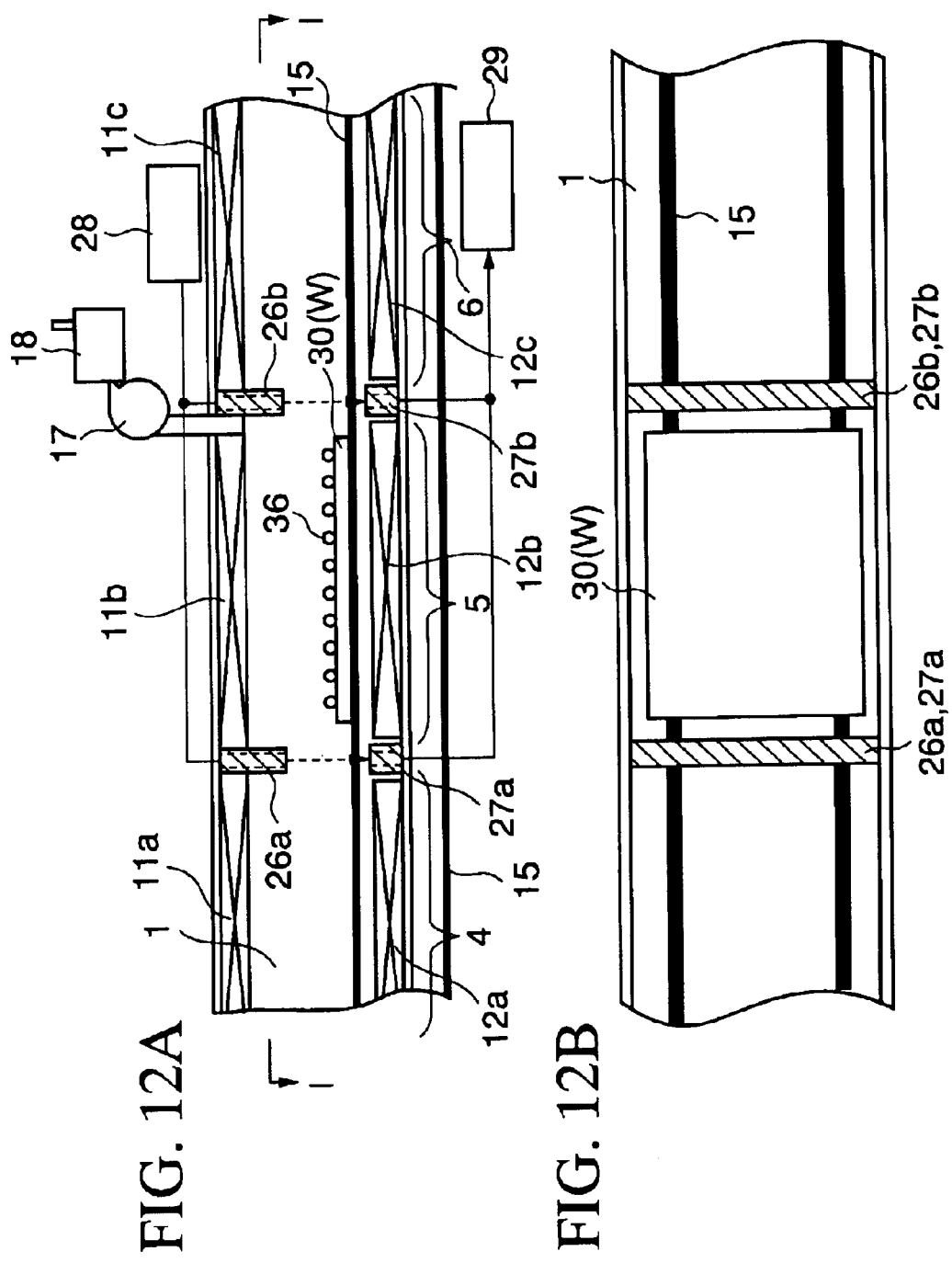
FIG. 12A is a sectional view showing partially a solder jointing system according to a third embodiment of the present invention.
FIG. 12B is a sectional view taken along a I—I line in FIG. 12A.

In FIGS. 12A and 12B, nitrogen-gas supplying mechanisms 26a, 26b are provided before and after the second area 5 in the chamber 1 in place of the gas shielding plates 8b, 8c, and also gas sucking/recovering mechanisms 27a, 27b are fitted to positions, that oppose to the nitrogen-gas supplying mechanisms 26a, 26b and are below the conveyer belts 15, respectively.

The nitrogen-gas supplying mechanisms 26a, 26b inject the nitrogen gas, which is fed from an external nitrogen supply source, downward into the chamber 1. The nitrogen gas discharged from the nitrogen-gas supplying mechanisms 26a, 26b are exhausted to the outside by the exhaust pump 29 through the gas sucking/recovering mechanisms 27a, 27b. Accordingly, as indicated by a broken-line arrow in FIG. 12A, the air curtain is formed by the nitrogen gas before and after the second area 5. If the injection pressure of the nitrogen-gas supplying mechanisms 26a, 26b is set to a level not to affect the vacuum suction by the exhaust fan 17, the second area (heating process zone) 5 that is put between two air curtains is brought into the low pressure state by the exhaust fan 17. In this state, the solder-adhered object w is carried into the heating process zone 5 by the conveyer belts 15 and then processed under the stabilized low-pressure atmosphere. Also, if the trouble is caused in the solder-adhered object w by the gas pressure when the solder-adhered object w is passed through the air curtains, the nitrogen injection pressure is weakened during when the solder-adhered object w is passed under the nitrogen-gas supplying mechanisms 26a, 26b and then the nitrogen injection pressure is changed higher after the solder-adhered object w is fed completely into the second area 5.

The nitrogen-gas supplying mechanisms 26a, 26b may be provided to the lower portion or the side portion of the chamber in lieu of the upper portion of the chamber. Also, other inert gas may be employed in lieu of the nitrogen gas.

(Fourth Embodiment)

In the first embodiment, the formic-acid spraying unit 16 is employed to supply the formic acid to the chamber 1. In this case, a formic-acid vaporizing unit 51 shown in FIG. 13 may be employed as the formic-acid supplying means.

Figure 13:
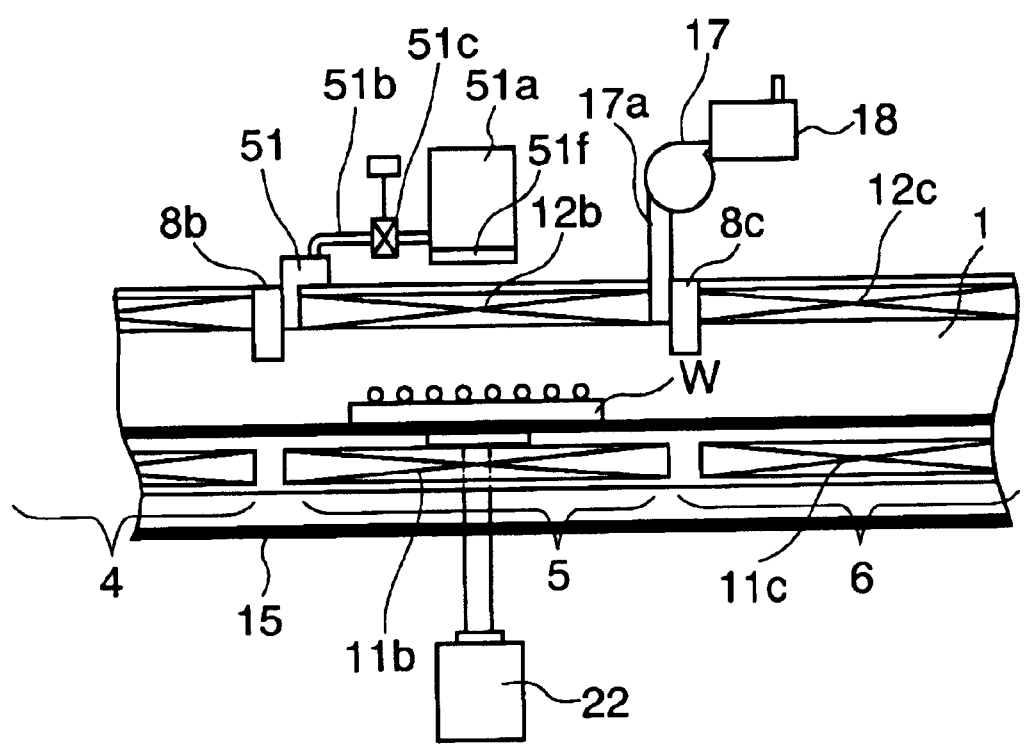
FIG. 13 is a sectional view showing partially a solder jointing system according to a fourth embodiment of the present invention.

A formic-acid supplying pipe 51b of a formic-acid-containing solution tank 51a is connected to the formic-acid vaporizing unit 51 shown in FIG. 13. A flow rate controlling valve 51c is provided to the formic-acid supplying pipe 51b to adjust an amount of supply of the formic-acid containing solution supplied from the formic-acid-containing solution tank 51a to the formic-acid vaporizing unit 51 or to stop the supply of the formic acid.

Figure 14A:
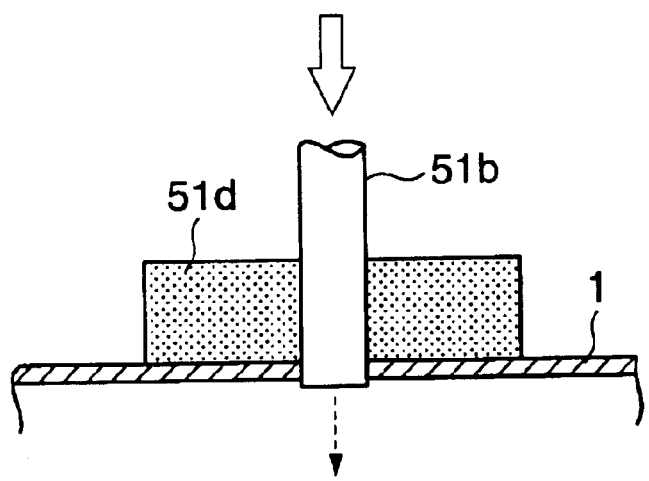
FIGS. 14A and 14B are sectional views showing two concrete examples of a formic acid vaporizing unit employed in the solder jointing system shown in FIG. 10.
Figure 14B:
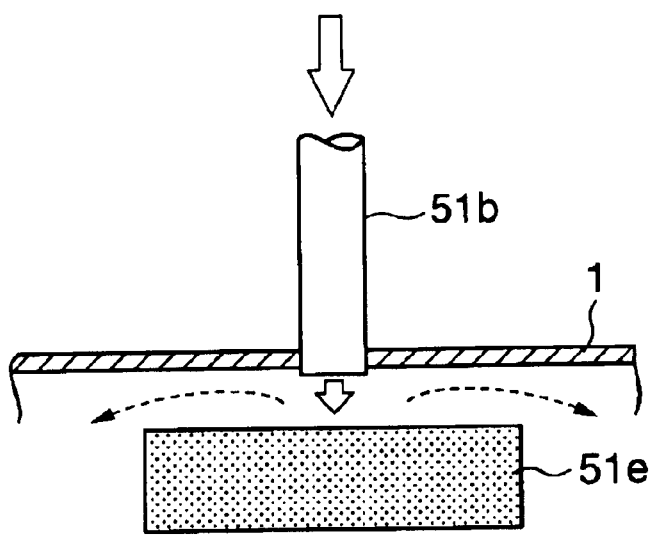

As shown in FIG. 14A, for example, the formic-acid vaporizing unit 51 has a heater 51d provided on the outer periphery of the exhaust end of the formic-acid supplying pipe 51b. The formic-acid-containing solution flowing through the formic-acid supplying pipe 51b is heated/vaporized by heating the formic-acid supplying pipe 51b at more than 110° C. by virtue of the heater 51d to introduce into the chamber 1. Also, the formic-acid vaporizing unit 51 shown in FIG. 14B has a heater 51e that is positioned in the chamber 1 at a distance from the exhaust end of the formic-acid supplying pipe 51b. The formic-acid-containing solution discharged from the formic-acid supplying pipe 51b is heated/vaporized by heating the formic-acid supplying pipe 51b at more than 110° C. by virtue of the heater 51e to introduce into the second area 5. As the formic acid vaporizing unit, a structure for heating the solution up to its boiling point may also be employed.

According to such formic-acid vaporizing unit 51, the formic-acid distribution can be uniformized in the second area 5 in the chamber in the low pressure atmosphere, so that the formic acid can be supplied uniformly to a plurality of solder layers 36 on the semiconductor device 30 respectively. If the formic acid can be supplied to a plurality of solder layers 36 at a uniform level, the shapes of respective solder layers 36 after the heating/melting are formed uniformly, and therefore the yield of the joint between the solder layers 36 and the underlying metal layer 35 can be improved.

In this case, in order to accelerate the vaporization of the formic-acid-containing solution in the formic-acid-containing solution tank 51a, a heater 51f may be provided in the formic-acid-containing solution tank 51a or on the outside thereof.

Figure 15:
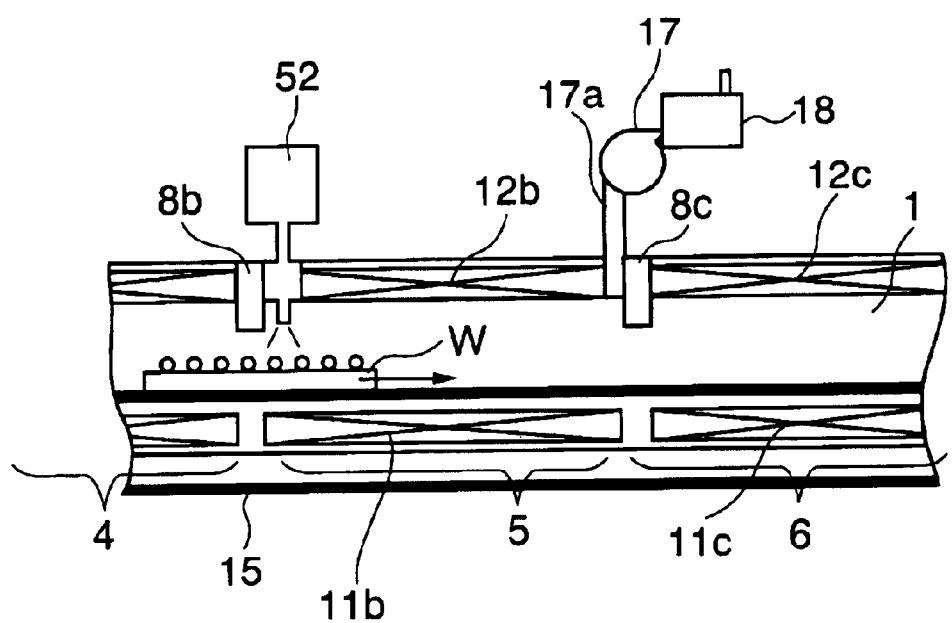
FIG. 15 is a sectional view showing a variation of the solder jointing system according to the fourth embodiment of the present invention.

By the way, the mist-like formic acid may be supplied to the solder layers on the semiconductor device. As shown in FIG. 15, the mist-like formic-acid-containing solution can be supplied from a formic-acid mist spray 52 that is provided instead of the formic-acid vaporizing unit 51. Then, the formic acid or the formic-acid-containing solution discharged from the formic-acid mist spray 52 is supplied to the solder layers 36 on the semiconductor device 30 in the middle of the carrying of the semiconductor device 30 from the first area 4 to the second area 5 via the conveyer belts 15.

According to this, it is possible to supply totally uniformly the formic acid on a plurality of solder layers 36 on the semiconductor device 30. The formic acid left on the surface of the solder layers 36 after the solder layers 36 are heated/melted and solidified is removed by the heating in the third area 5 and the fourth area 6 in the low pressure atmosphere.

(Fifth Embodiment)

In the first embodiment, the formic acid in the chamber is recovered by the formic-acid recovering mechanism. In this case, a formic-acid decomposing mechanism may be provided to at least one of the suction side and the exhaust side of the exhaust fan 17.

Figure 16A:
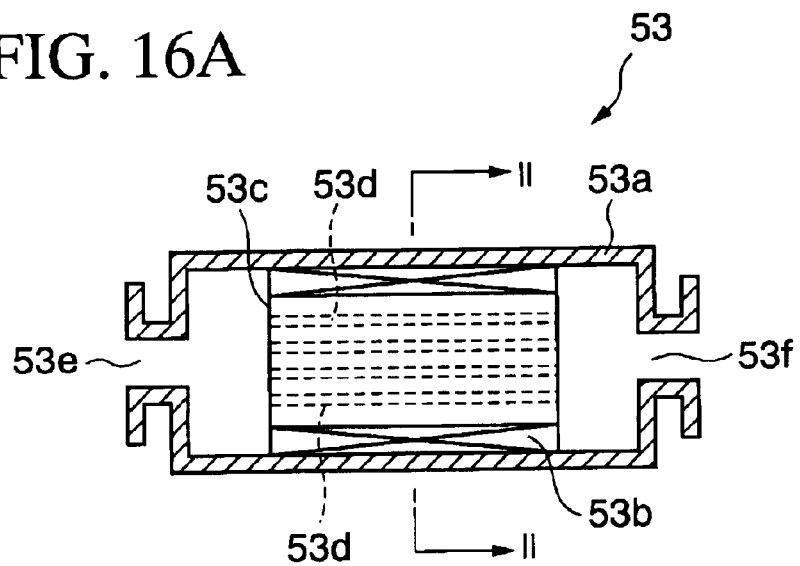
FIG. 16A is a sectional view showing a formic acid decomposing mechanism used in a solder jointing system according to a fifth embodiment of the present invention.
Figure 16B:
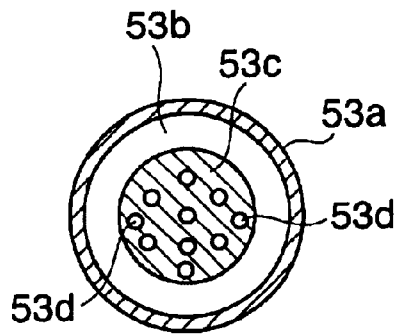
FIG. 16B is a sectional view taken along a II—II line in FIG. 16A.

FIG. 16A is a side sectional view showing an example of the formic-acid decomposing mechanism, and FIG. 16B is a sectional view taken along a II—II line in FIG. 16A.

The formic-acid decomposing mechanism 53 shown in FIGS. 16A and 16B has a stainless circular cylinder 53c that is surrounded by a heater 53b in a stainless circular-cylindrical casing 53a. A plurality of through holes 53d are formed in the circular cylinder 53c to extend in the axis direction of the circular cylinder 53c. Also, a gas inlet port 53a and a gas outlet port 53f are formed on both ends of the casing 53a. In this case, a plurality of stainless pipes that are bundled in parallel may be arranged in lieu of the circular cylinder 53c.

According to such formic-acid decomposing mechanism 53, insides of the through holes 53d in the circular cylinder 53c are heated by the heater 53b at the temperature of more than 200° C. but less than 300° C. Then, the formic-acid exhausted from the exhaust pipe 17b of the exhaust fan 17 is decomposed into the water and the carbon in the through holes 53d and then exhausted. Since the formic acid starts to decompose if it is heated up to 200° C. or more, the exhaust gas loses the corrosive property.

(Sixth Embodiment)

In the above embodiments, the mechanism using the conveyer belts 15 is shown as the method of carrying the solder-adhered object w. This is because, if the solder-adhered object w is brought directly into contact with the lower heaters 11a to 11d in the chamber 1, peeling-off is readily caused between layers in the solder-adhered object w, e.g., the semiconductor device 30 by the influences of the thermal conductivity and the thermal expansion coefficient, and thus such peeling-off must be prevented. In this case, the temperature is changed relatively gently in the first to fourth areas 4 to 7, and thus the temperature in the solder jointing system rises/falls in compliance with the temperature of the atmospheric gas in the chamber 1.

Figure 17:
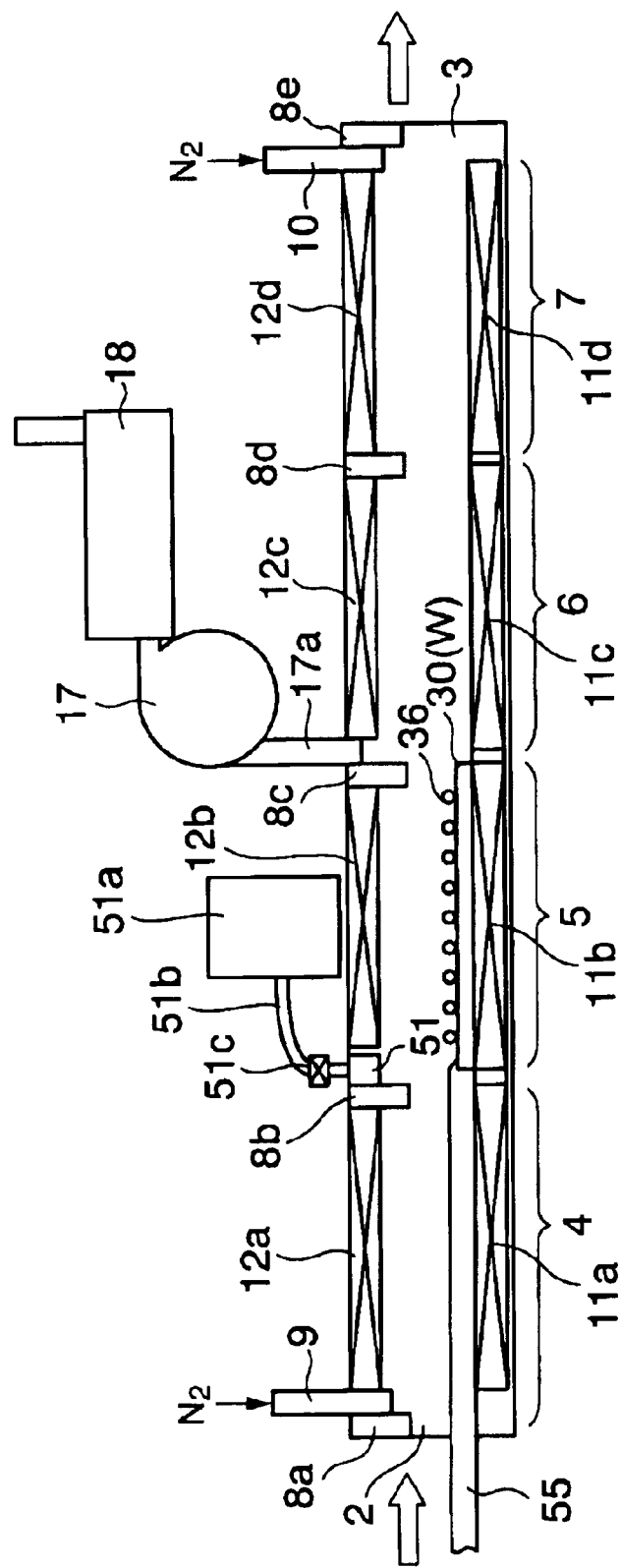
FIG. 17 is a sectional view showing a solder jointing system according to a sixth embodiment of the present invention.

However, if rising/falling change of the temperature in the chamber 1 should be controlled sharply with no possibility of peeling-off between the layers in the solder-adhered object w, e.g., the semiconductor device 30, a mechanism for carrying sequentially the solder-adhered object w on the lower heaters 11a to 11d in the chamber 1 by using a moving (carrying) arm 55, as shown in FIG. 17, is employed. In this case, the air cylinder 22 used in the first embodiment is omitted.

In the second area 5, the solder layers 36 are heated/melted at the temperature in excess of the melting point by the heaters 11b, 12b. After this, the solder-adhered object w may be moved from the second area 5 to the third area 6 by the moving arm 55 and then the solder layers 36 may be cooled in the third area 6. In this case, it is preferable that the solder layers 36 should be cooled below the melting point within one minute from the end of the heating.

Figure 18:
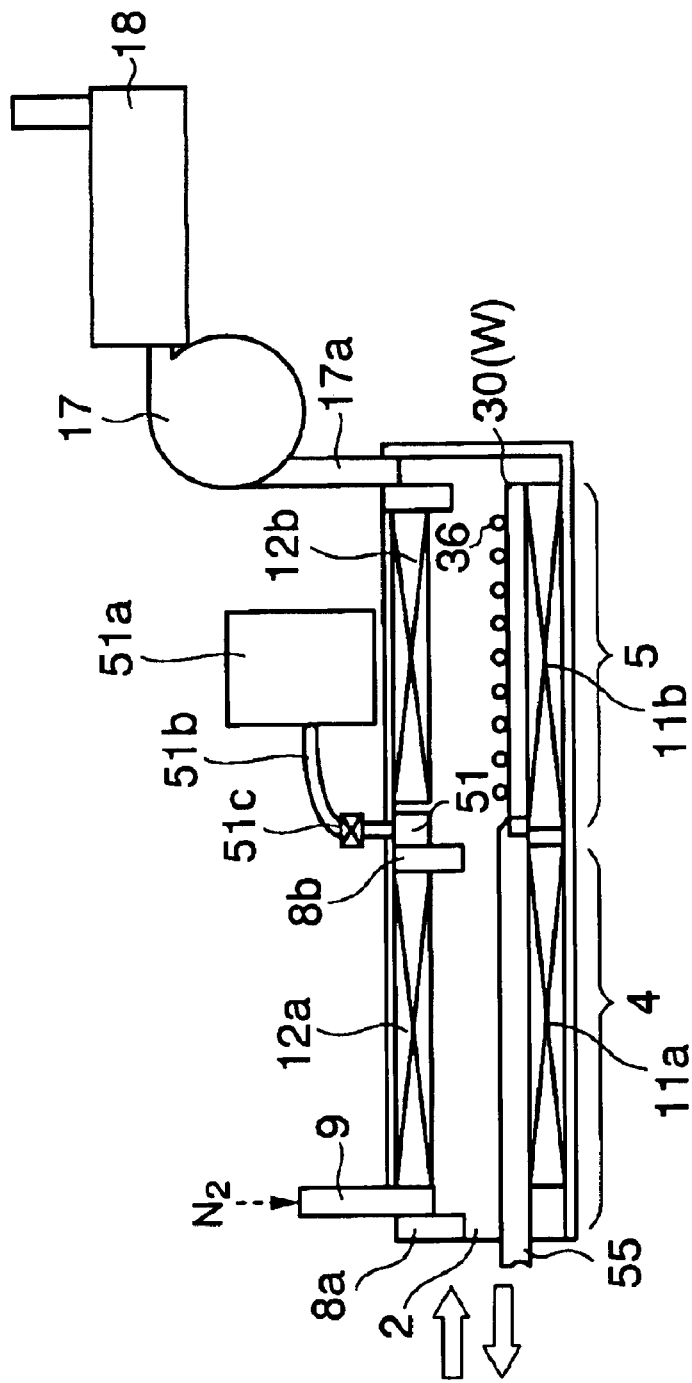
FIG. 18 is a sectional view showing a variation of the solder jointing system according to the sixth embodiment of the present invention.

Also, as shown in FIG. 18, if the carrying arm 55 is employed, the solder-adhered object w can be loaded/unloaded into/from the chamber 1 through the loading port (opening) 2. In this case, the third area 6 and the fourth area 7 can be omitted from the chamber 1 to shorten the total length of the chamber 1, and thus the space of the installing area of the solder jointing system can be saved. In this case, the portion of the second area 5, that is located on the opposite side to the opening 2, is closed.

Figure 19:
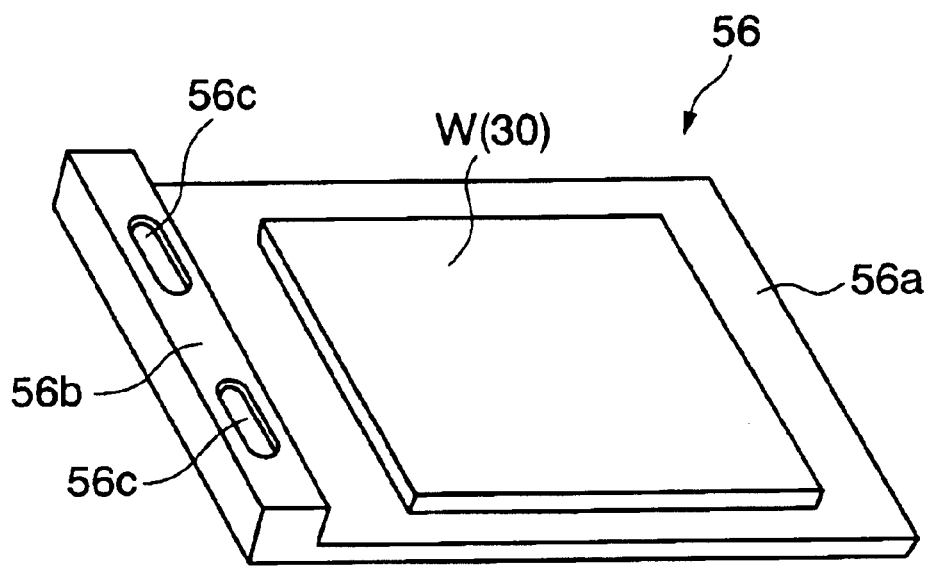
FIG. 19 is a perspective view showing a carrier for loading the heated object of the solder jointing system according to the sixth embodiment of the present invention.

In this manner, if the solder-adhered object w is loaded/unloaded by using the carrying arm 55 through the same opening 2, the formic-acid introducing mechanism employed in the above embodiments can be omitted by using a carrier 56 shown in FIG. 19.

The carrier 56 shown in FIG. 19 has a stainless sourcer portion 56a on which the semiconductor device as the solder-adhered object w is put, and a formic acid containing portion 56b formed on one end of the sourcer portion 56a. Formic-acid supplying/discharging ports 56c are formed on an upper portion of the formic acid containing portion 56b.

In case the solder layers 36 on the semiconductor device 30 are heated/melted by using such carrier 56, the semiconductor device 30 is put on the sourcer portion 56a and then the formic-acid-containing solution, e.g., the solution in which the formic acid is mixed into the water at 75 vol % is filled into the formic-acid containing portion 56b via the formic-acid supplying/discharging ports 56c.

Then, in the solder jointing system shown in FIG. 18, the carrier 56 is loaded in the second area 5 by using the carrying arm 55 via the opening of the chamber 1 and the first area 4 such that the formic-acid containing portion 56b is loaded lastly.

In the second area 5, since the formic-acid containing portion 56b and the semiconductor device 30 is heated by the heaters 11b, 12b, the formic-acid containing solution that is vaporized in the formic-acid containing portion 56b is flown along the air flow via the formic-acid supplying/discharging ports 56c and thus supplied to the solder layers 36 on the semiconductor device 30.

The solder layers 36 are heated/melted by the heaters 11b, 12b in the second area 5 and jointed to the underlying metal layer 35. The formic acid that is vaporized and passed over the semiconductor device 30 is exhausted by the exhaust fan 17, and then is recovered by the formic-acid recovering mechanism 18.

In the second area 5 whose pressure is lowered by the exhaust fan 17, the solder layers 36 are heated/melted, then the temperature is lowered to the temperature of less than the melting point of the solder layers 36 but more than the boiling point of the formic acid so as to remove the formic acid, then the carrier 56 is carried into the first area 4 by using the carrying arm 55, then the carrier 56 is cooled close to the room temperature there, and then the carrier 56 is taken out to the outside via the opening 2 by using the carrying arm 55.

According to the employment of the above carrier 56, the formic-acid introducing mechanism having a complicated structure can be omitted and also a structure of the solder jointing system can be simplified, whereby a cost of the solder jointing system can be lowered.

(Seventh Embodiment)

Figure 20:
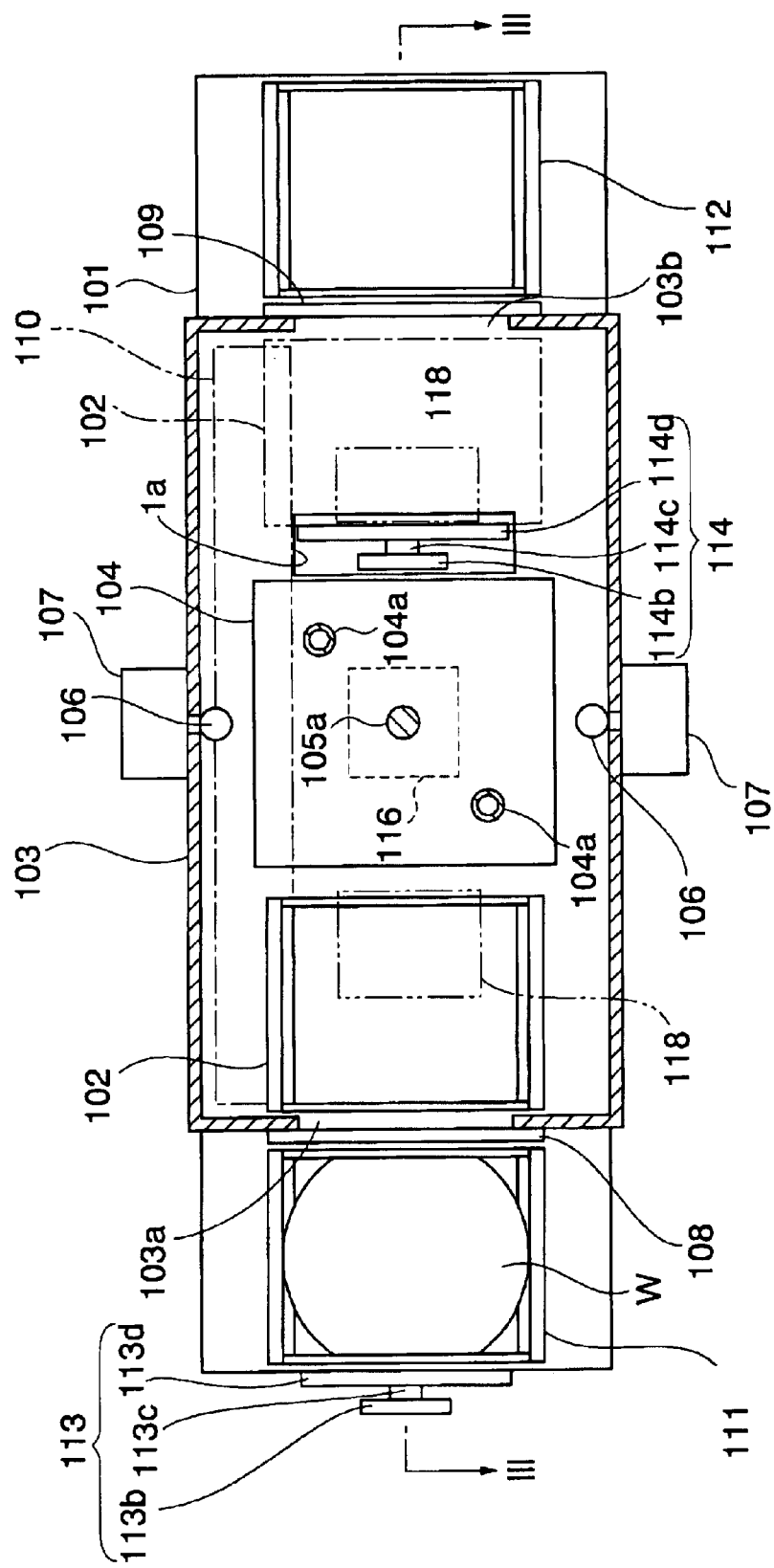
FIG. 20 is a top view showing a solder jointing system according to a seventh embodiment of the present invention.
Figure 21:
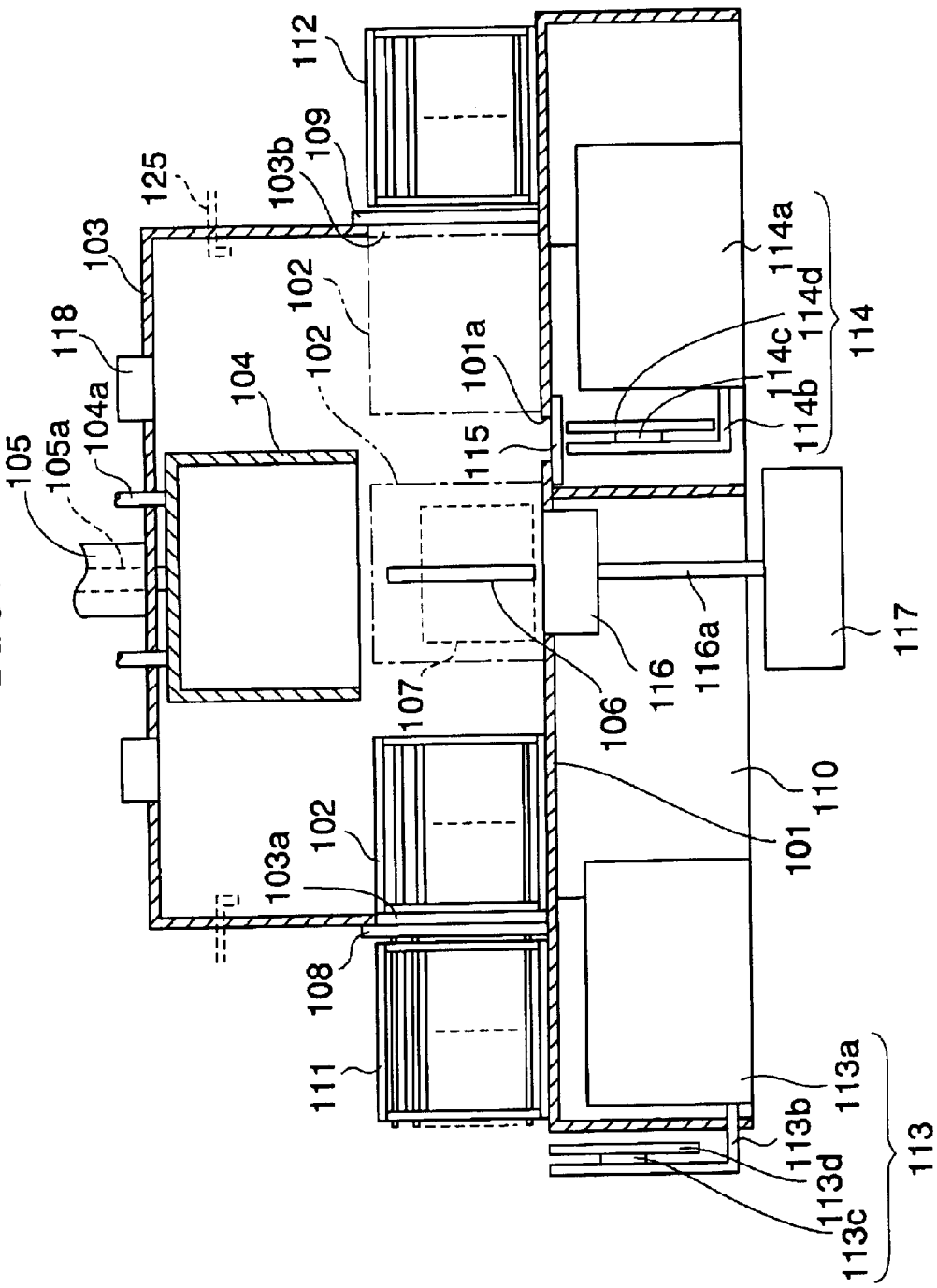
FIG. 21 is a sectional view taken along a III—III line in FIG. 20.

FIG. 20 is a top view showing a solder jointing system according to a seventh embodiment of the present invention. FIG. 21 is a sectional view taken along a III—III line in FIG. 20.

In FIG. 20 and FIG. 21, a stainless processing magazine 102 moved by a magazine moving mechanism 110 is loaded on a magazine loading table 101, and also a stainless heating/melting chamber 103 for covering the processing magazine (carrying mechanism) 102 is provided to a moving area of the processing magazine 102.

A bottom-opened bell type heater 104 that is lifted higher than the processing magazine 102 is arranged in the middle of the heating/melting chamber 103. This heater 104 consists of one of a thermal conduction heater, an infrared lamp heater, and a coil heater, or their combination. The heater 104 is moved vertically by a supporting shaft 105a of a driving mechanism 105 fitted to the upper middle of the heating/melting chamber 103. Also, an inert gas purge nozzle 104a that is led from a nitrogen supply source (not shown) provided on the outside of the heating/melting chamber 103 is connected to one upper portion or plural upper portions of the heater 104.

Figure 22:
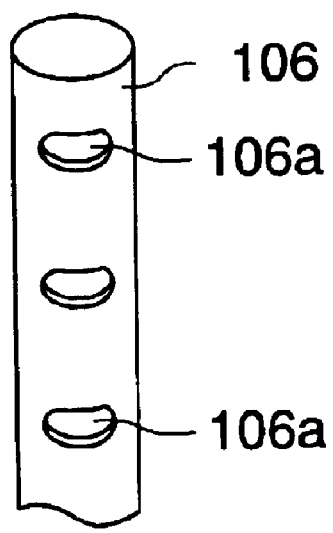
FIG. 22 is a perspective view showing a part of a formic acid supplying nozzle used in the solder jointing system according to the seventh embodiment of the present invention.

A formic-acid spraying nozzle 106 connected to a formic acid supplying mechanism 107 provided on the outside of the heating/melting chamber 103 is arranged on both sides of the processing magazine 102 in the middle of the heating/melting chamber 103. As shown in FIG. 22, for example, the formic-acid spraying nozzle 106 has a plurality of formic-acid spraying holes 106a, which are formed to be directed to the center of the heating/melting chamber 103 respectively, on its side portion.

A loading port 103a is provided to one end of the heating/melting chamber 103 in the moving direction of the processing magazine 102, and an unloading port 103b is provided to the other end of the heating/melting chamber 103. The loading port 103a and the unloading port 103b are opened and closed by shutters 108, 109 respectively. These shutters 108, 109 are provided to prevent the formic acid, which is introduced into the heating/melting chamber 103, from leaking to the outside. The leakage of the formic acid into the outer air not only gives off an irritating smell to the human beings but also causes the explosion because of the contact of the formic acid to the outer air.

A loader 111 for housing wafers W, onto which the unjointed solders are adhered, therein is placed on the magazine loading table 101 on the outside of the loading port 103a. Also, an unloader 112 for receiving the substrate W from the processing magazine 102 is placed on the magazine loading table 101 on the outside of the unloading port 103b.

A first pusher 113 is provided under a loading area of the loader 111. The first pusher 113 is lifted up along one side end of the magazine loading table 101, and then pushes out the wafer W in the loader 111 into the processing magazine 102 via the loading port 103a. Also, a second pusher 114 is provided under the heating/melting chamber 103 near the unloading port 103b. The second pusher 114 is lifted up via an opening 101a of the magazine loading table 101, and then pushes out the wafer W in the processing magazine 102 into the unloader 112 via the unloading port 103b. A shutter 115 for closing the opening 101a when the second pusher 114 stands by under the magazine loading table 101 is provided to the upper side or the lower side of the opening 101a.

The first and second pushers 113, 114 have elbow portions 113b, 114b which are moved vertically by driving portions 113a, 114a provided under the magazine loading table 101, arms 113c, 114c which are moved back and forth in the horizontal direction to the loading port 103a or the unloading port 103b of the heating/melting chamber 103 from the elbow portions 113b, 114b, and plates 13d, 14d which are fitted vertically to top ends of the arms 113c, 114c and have a narrower width than the processing magazine 102, respectively.

An exhaust unit 116 for discharging a gas in the heating/melting chamber 103 or the heater 102 to the outside of the heating/melting chamber 103 is provided under an area of the magazine loading table 101 in which the heater 102 is placed. A formic acid recovering mechanism 117 is connected to an exhaust port (not shown) of the exhaust unit 116 via an exhaust pipe 116a. For example, as the exhaust unit 116, a dry pump is used if the pressure of the internal space of the heater 114 that covers the processing magazine 102 is lowered, or a sirocco fan is used if the pressure of the internal space is kept at the atmospheric pressure.

A sirocco fan 118 for introducing the outer air into the heating/melting chamber 103 is provided to a ceiling portion of the heating/melting chamber 103.

Figure 23:
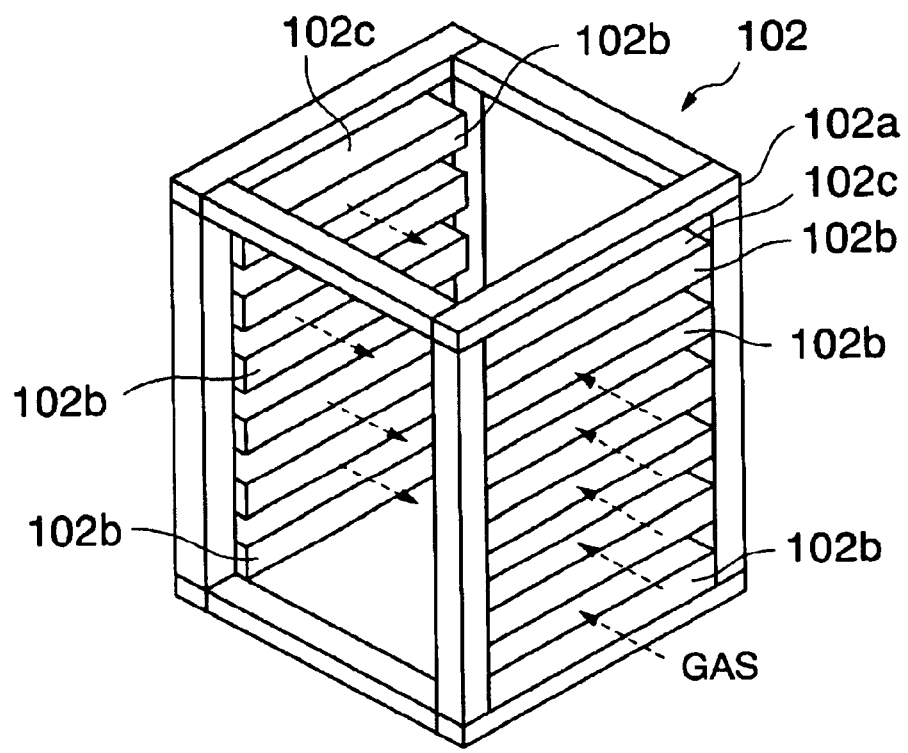
FIG. 23 is a perspective view showing a processing magazine used in the solder jointing system according to the seventh embodiment of the present invention.

For example, as shown in FIG. 23, the above processing magazine 102 has a frame body 102a assembled into a cubic shape, and a plurality of lattice-like bars 102b fitted vertically on both sides of the frame body 102a at a distance. The bars 102b have supporting faces 102c projected to the inside of the frame body 102a respectively, and are arranged to support base members such as the wafers, the semiconductor substrates, the supporting plates, etc. by the right and left supporting faces 102c of the bars 102b in respective stages. An interval between the supporting faces 102c of the bars 102b arranged vertically, i.e., a slot interval, is set to 5 mm or more from a viewpoint of the solder bump joint. The spaces function as the formic acid introducing space.

Also, the loader 111 and the unloader 112 have plural stages loading surfaces, on which the wafers, the substrates, or the like are loaded, at the same positions as the supporting faces 102c of the processing magazine 102 respectively. The same structure as the processing magazine 102 shown in FIG. 23 may be employed as the loader 111 and the unloader 112.

Figure 24A:
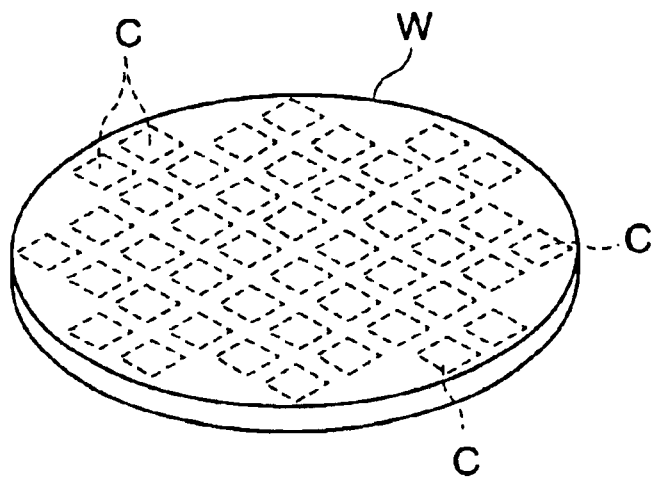
FIGS. 24A and 24B are a perspective view and a side view showing a semiconductor wafer on which solders to be jointed by the solder jointing system according to the seventh embodiment of the present invention are formed respectively.
Figure 24B:
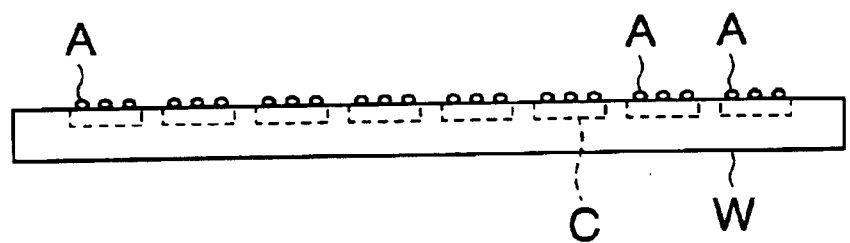

The processing magazine 102, the loader 111, and the unloader 112 are placed on the magazine loading table 101 such that their front faces without the bars 102b are opposed to the loading port 103a and their rear faces without the bars 102b are opposed to the loading port 103b. Also, for example, as shown in FIG. 24A, the substantially circularly-shaped semiconductor wafers W are loaded on respective stages of the processing magazine 102, the loader 111, and the unloader 112. Then, as shown in FIG. 24B, a plurality of solder layers A are formed on a plurality of semiconductor devices C formed on the semiconductor wafers W.

Figure 25:
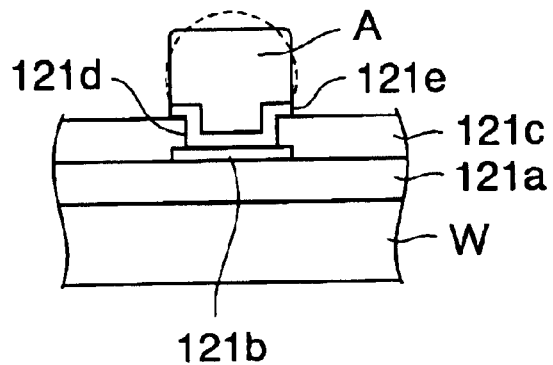
FIGS. 25 and 26 are sectional views showing a part of the semiconductor device shown in FIG. 24B.

For example, as shown in FIG. 25, the semiconductor device C has an insulating film 121a formed on the semiconductor wafer W having the semiconductor elements such as the transistors, the capacitors, the multi-layered wirings, and others, and an electrode pad 121b formed on the insulating film 121a. The electrode pad 121b is connected electrically to the semiconductor element, and is exposed from an opening 121d in an insulating cover film 121c formed thereon. An underlying metal layer 121e consisting of titanium and nickel is formed on the exposed portion of the electrode pad 121b. A solder layer A is formed on the underlying metal layer 121e by the nonelectrolytic plating method, the electrolytic plating method, the printing method, or the like.

Figure 26:
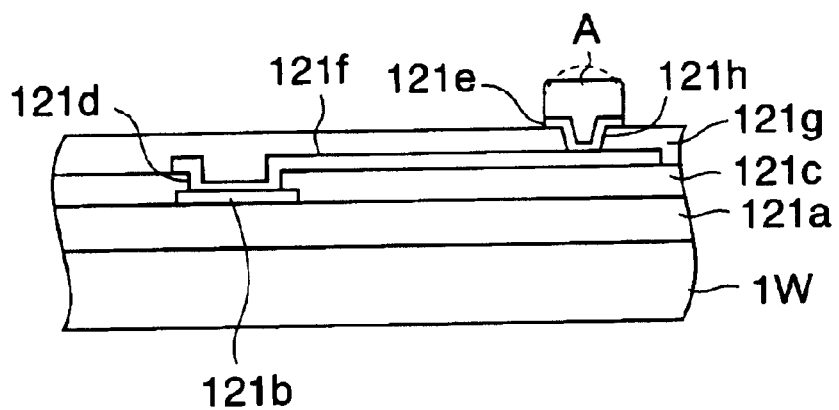

As shown in FIG. 26, the electrode pad 121b and the solder layer A are formed at remote positions respectively and sometimes are electrically connected via a leading wiring (relocation wiring) 121f mutually. The leading wiring 121f is formed on the insulating cover film 121c. One end of the leading wiring 121f is connected to the electrode pad 121b via the opening 121d in the insulating cover film, and the other end thereof is connected to the underlying metal layer 121e and the solder layer A via an opening 121h in an overlying insulating cover film 121g that covers the leading wiring 121f.

Figure 27:
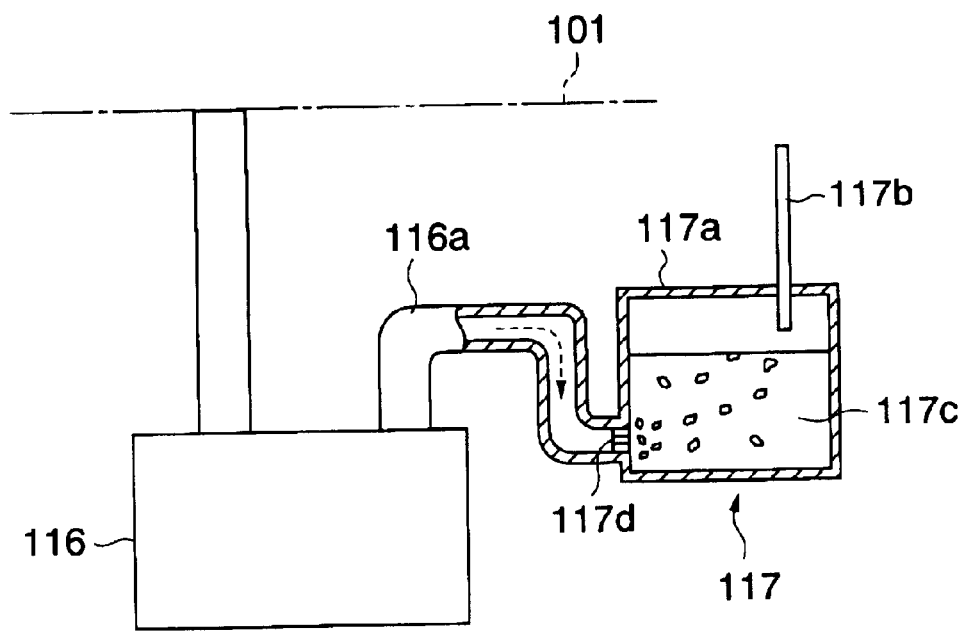
FIG. 27 is a sectional view showing a formic acid recovering mechanism used in the solder jointing system according to the seventh embodiment of the present invention.
Figure 28:
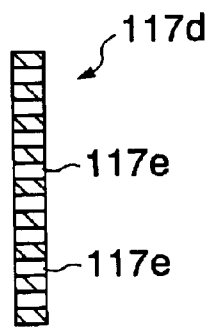
FIG. 28 is a sectional view showing a plate incorporated into the formic acid recovering mechanism.

For example, as shown in FIG. 27, the above formic acid recovering mechanism 117 has a structure in which the exhaust pipe 116a of the exhaust unit 116 is connected to a lower portion of a tank 117a and an exhaust pipe 117b is connected to a top portion of the tank 117a. As the solution 117c which is filled in the tank 117a to such an extent that this solution does not come into contact with a bottom end of the exhaust pipe 117b, there are the alcohol, the water, etc. Also, a plate 117d formed of porous material or a plate 117d in which a number of holes 117e are formed, as shown in FIG. 28, is put into a connection port between the exhaust pipe 116a of the exhaust unit 116 and the tank 117a. This plate 117d changes the formic-acid containing exhaust gas that is introduced from the exhaust pipe 116a of the exhaust unit 116 into a number of bubbles. Accordingly, the formic-acid containing exhaust gas is subjected to the bubbling in the solution 117c such that the formic acid component is dissolved into the solution, and then the solution having the formic acid at a low contained amount is exhausted from the exhaust pipe 117b. In other words, since a contact area between the formic-acid containing exhaust gas and the solution 117c is increased, a formic-acid recovering efficiency can be enhanced and also the formic acid can be recovered safely.

The movement of the processing magazine 102, the rise/fall of the heater 104, the drive of the formic acid supplying mechanism 107, the drive of the exhaust unit 116, the drive of the pushers 113, 114, the open/close of the shutters 115, 108, 109, the drive of the sirocco fan 118, the temperature control of the heater 104, the introduction and the stop of the nitrogen gas from the inert gas purge nozzle 104a, etc. are carried out by a control circuit (not shown) respectively.

Next, a method of jointing the solder layer (solder bump) A and the electrode pad 121b, as shown in FIG. 25, or a method of connecting the solder layer A and the leading wiring 117f, as shown in FIG. 26, by using the solder heating/melting equipment shown in FIG. 20 and FIG. 21 will be explained with reference to FIGS. 27A to 27C, FIGS. 28A to 28C, and FIGS. 29A to 29C hereinafter.

Figure 29A:
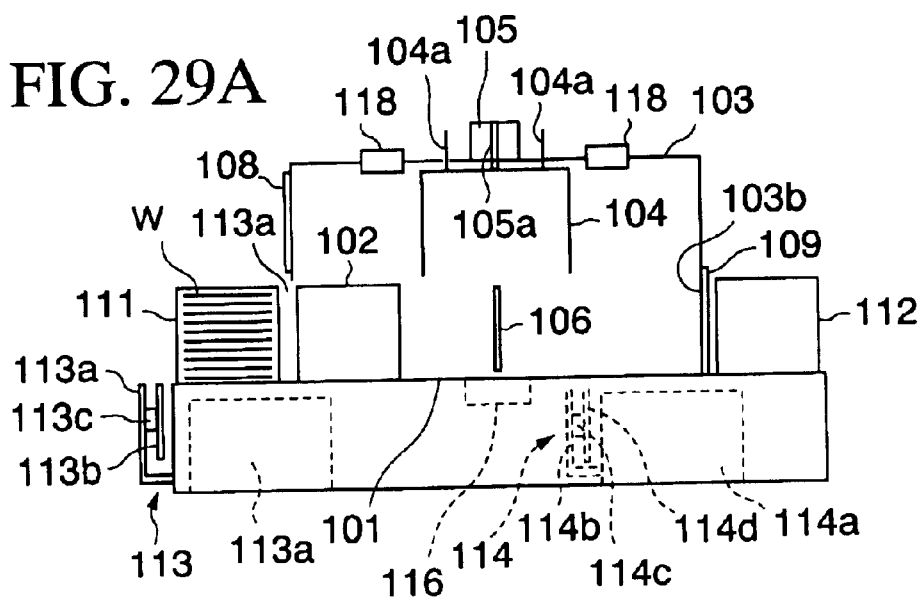
FIGS. 29A to 29I are views showing an operation of the solder jointing system according to the seventh embodiment of the present invention.

First, as shown in FIG. 29A, the shutter 108 of the loading port 103a in the heating/melting chamber 103 is opened and the shutter 109 of the unloading port 103b is closed. Also, the elbow portions 113b, 114b, the arms 113c, 114c, the plates 113d, 114d of the first and second pushers 113, 114 are pulled down lower than the upper surface of the magazine loading table 101. In addition, the heater 104 is lifted up to the upper portion by the supporting shaft 105a in the heating/melting chamber 103 and also is heated up to the temperature of the melting point of the solder layer A or more, for example.

Then, the loader 111 in which a plurality of semiconductor wafers W are housed at a distance vertically is placed on the magazine loading table 101 on the outside of the loading port 103a, and also the processing magazine 102 is brought to the loading port 103a.

Figure 29B:
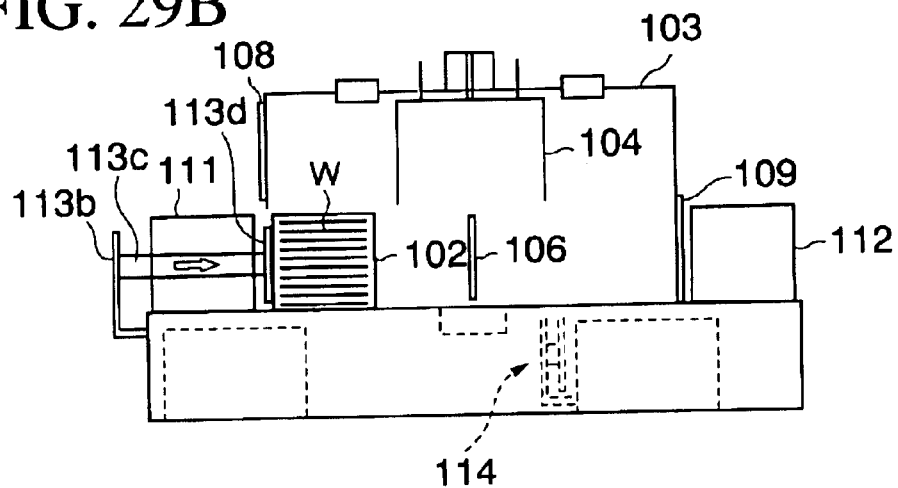

In turn, as shown in FIG. 29B, while keeping their vertical distances, a plurality of semiconductor wafers W in the loader 111 are moved to the bars 102b of the processing magazine 102 on respective stages by lifting up the elbow portion 113b by virtue of the driving portion 113a of the first pusher 113, and then extending the arm 113c toward the loader 111 to push the wafers W by the plate 113d provided to the top end of the arm 113c.

Figure 29C:
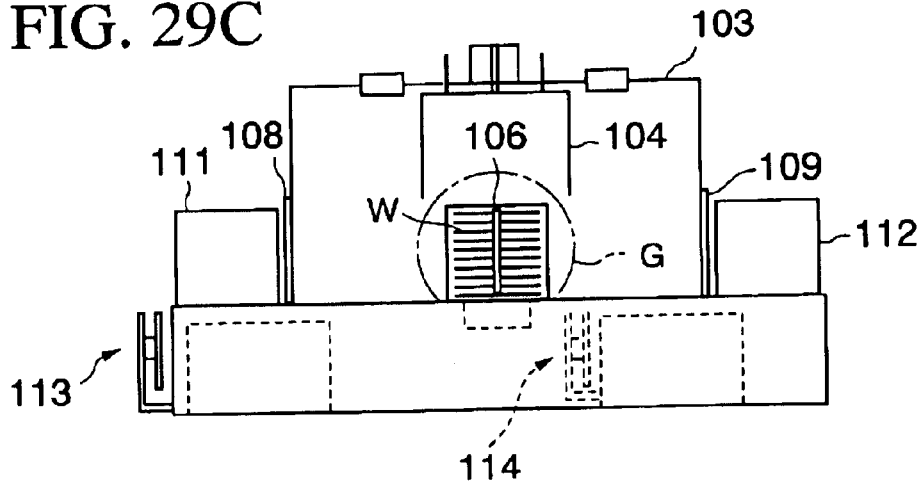

Then, as shown in FIG. 29C, the processing magazine 102 is moved to the center of the heating/melting chamber 103 and at the same time the shutter 108 provided to the loading port 103a is closed. Then, the movement of the processing magazine 102 is stopped at a point of time when the processing magazine 102 is positioned immediately under the heater 104.

Then, the gas containing formic-acid G is sprayed onto the processing magazine 102 from the formic acid supplying nozzle 106 that is positioned on the side of the processing magazine 102. Accordingly, the gaseous formic acid is floating on the wafers W and in the space between the wafers W in the processing magazine 102. The gaseous formic acid is formed by changing the solution whose formic acid concentration is set to 76 vol % or less prior to the vaporization into the vapor phase, so that the explosion is not caused and thus the safety can be assured.

Figure 29D:
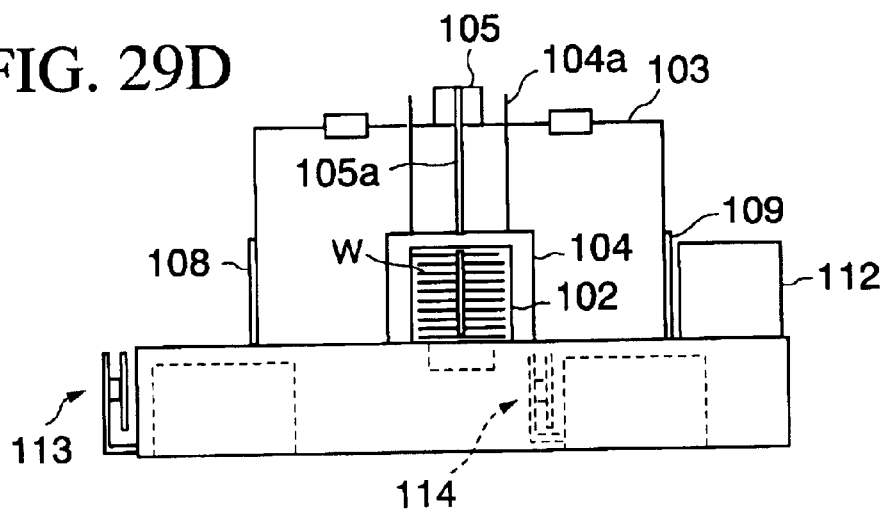

Then, as shown in FIG. 29D, the processing magazine 102 is covered with the heater 104 by dropping the supporting shaft 105a from the driving mechanism 105. A plurality of solder layers A on each wafer W is heated/melted by the heater 104 and jointed to the underlying electrode pad 121b or the underlying leading wiring 121f. Here, the gas containing formic-acid being supplied to the processing magazine 102 can be prevented by the surrounding heater 104 from leaking to the outside.

In this case, the heating temperature of the heater 104 may be controlled. For example, as the first stage, in order to remove the oxide film on the surface of the solder layer A by the reducing action of the formic acid, the temperature is controlled lower than the melting point of the solder layer A by almost 50 to 90° C.

The formic acid starts to act effectively from the temperature that is lower than the melting point of the solder layer A by almost 50° C., and the oxide film on the surface of the solder layer A is removed at the temperature. If the solder layer A is formed of the eutectic tin lead, the temperature at which the reducing action of the formic acid becomes effective is more than 150° C. Also, if the solder layer A is formed of the refractory solder material, e.g., the tin lead, the temperature at which the reducing action of the formic acid becomes effective is more than about 180° C.

As the second stage of the temperature control of the heater 104, the temperature is set to the melting point or more of the solder layer A. Accordingly, the temperature of the solder layer A is increased, and the gas that is generated or exists in the inside of the solder layer A escapes gradually in such increasing process, and in addition the solder layer A is gradually melted and jointed to the electrode pad 121b or the leading wiring 121f. As a result, the scattering or the defective formation of the solder layer A is not caused. The solder layer A is formed into the shape by indicated by a broken line in FIGS. 25A and 25B after the melting.

In such heating step of the solder layer A, since the processing magazine 102 is confined in the narrow heater 104, the temperature control in the processing magazine 102 is easy.

Figure 29E:
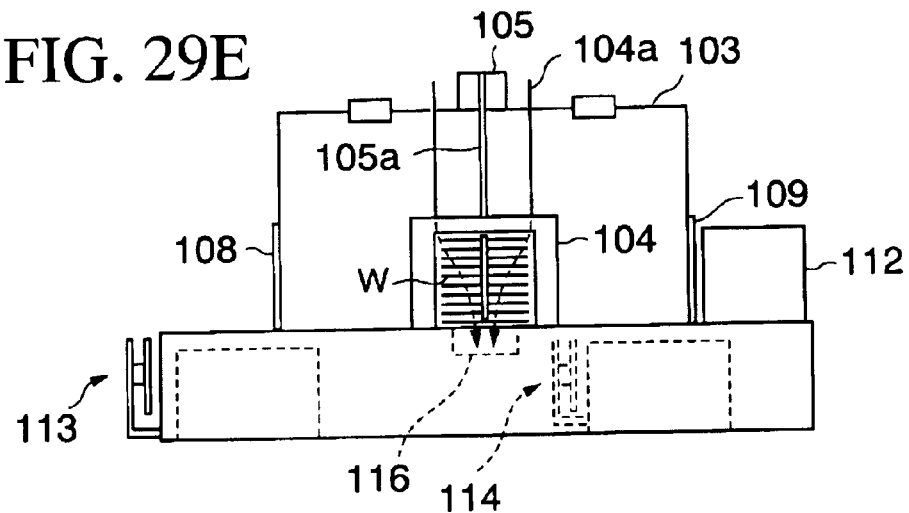

Then, as shown in FIG. 29E, the nitrogen gas is introduced into the heater 104 from the inert gas purge nozzle 104a, and then the gas containing formic-acid in the heater 104 as well as the nitrogen gas is exhausted to the nitrogen recovering mechanism 117 by driving the exhausting mechanism 116. Accordingly, the solder layer A is cooled and solidified, and also the vaporization of the formic acid on the surfaces of the solder layer A and the electrode pad 121b or the leading wiring 121f is accelerated and such formic acid is removed. In this stage, the temperature of the heater 104 maybe dropped lower than the melting point of the solder layer A. In this case, the inert gas such as argon, neon, or the like in lieu of nitrogen may be introduced from the inert gas purge nozzle 104a.

Figure 29F:
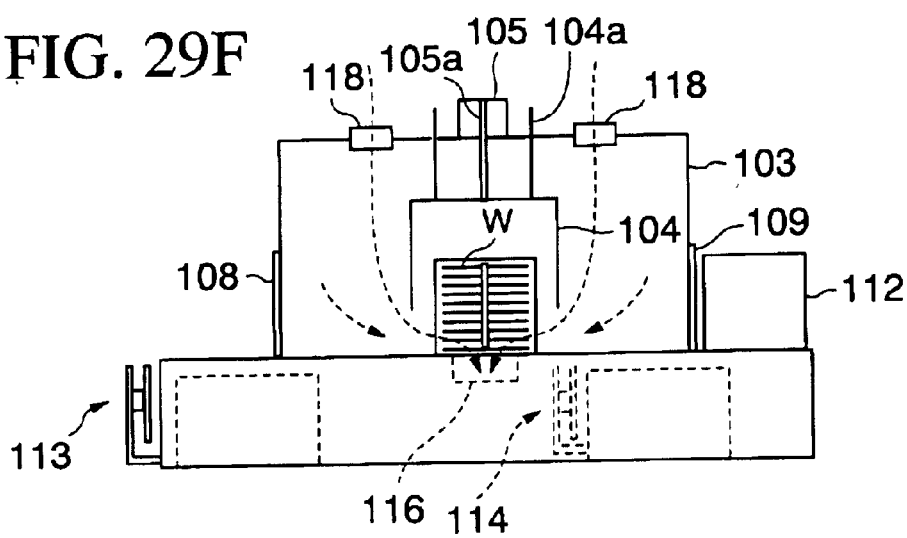

Then, as shown in FIG. 29F, while driving the sirocco fan 118 provided to the ceiling portion of the heating/melting chamber 103, the heater 104 is lifted by lifting the supporting shaft 105a. Accordingly, the processing magazine 102 is exposed in the heating/melting chamber 103 and also the gas still remaining in the interior of the processing magazine 102 is exhausted to the formic-acid recovering mechanism 117 by driving the exhausting mechanism 116. As a result, the formic acid diffused slightly in the heating/melting chamber 103 is also exhausted and in addition the semiconductor wafer W in the processing magazine 102 is further cooled closely to the atmospheric temperature.

After this, the sirocco fan 118 and the exhausting mechanism 116 are stopped.

Figure 29G:
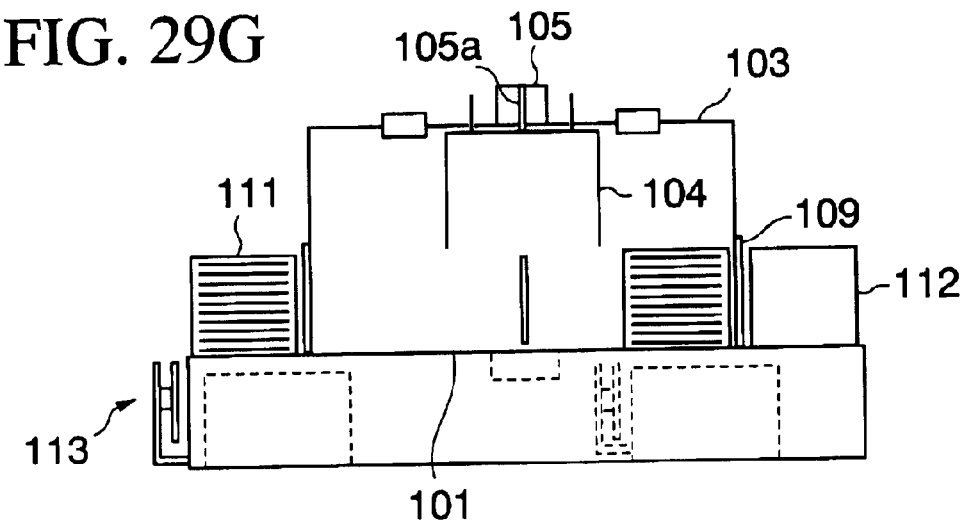

Then, as shown in FIG. 29G, the processing magazine 102 is moved to the unloading port 103b.

Figure 29H:
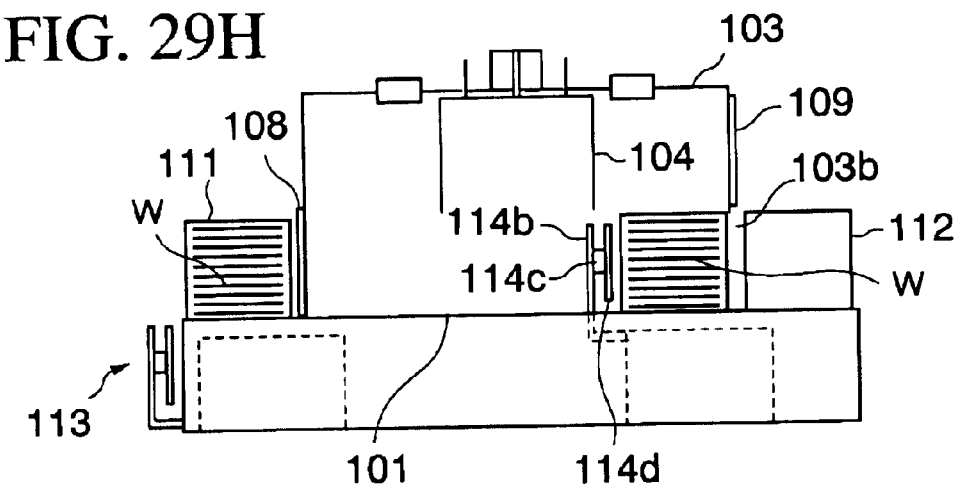

Then, as shown in FIG. 29H, the elbow portion 104b of the second pusher 114 is lifted up and also the shutter 109 provided to the unloading port 103b is opened.

Figure 29I:
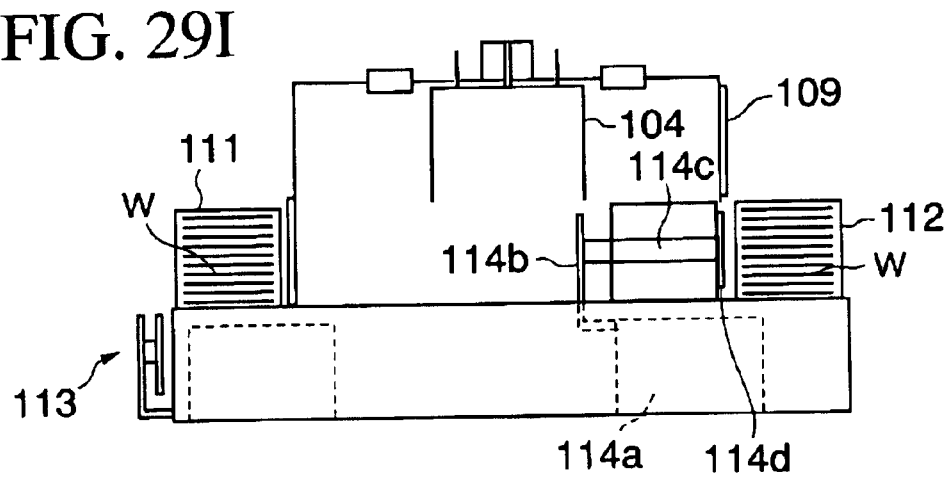

Then, as shown in FIG. 29I, the arm 114c of the second pusher 114 is extended toward the unloading port 103b to push out a plurality of wafers W in the processing magazine 102 by the plate 114d provided to the top end of arm 114c, whereby a plurality of wafers W are transferred onto the unloader 112.

In this case, before the shutter 109 provided to the unloading port 103b is closed and the processing magazine 102 is pulled up to the loading port 103a, the loader 111 on which the new wafers W are loaded is placed on the outside of the shutter 108 provided to the loading port 103 of the heating/melting chamber 103.

With the above, one cycle process from the loading of the semiconductor wafers W into the heating/melting chamber 103 to the unloading of them is completed. Thus, a series of such processes are repeated.

According to a series of operations described above, since the solder layers on plural sheets of wafers can be jointed simultaneously by one solder heating/melting process, the throughput can be improved rather than the sheet-fed process in the prior art. In addition, after the solder layers A are heated/melted, such solder layers A are put forcedly in the flow of the nitrogen (inert) gas. Therefore, not only the quick temperature fall and the cooling of the solder layers A can be achieved, but also the formic acid in the processing magazine 102 can be recovered in a short time and the reaction generated gas existing on the surfaces of the solder layers A can be removed/recovered by the flow of the nitrogen gas. As a result, the situation that the reaction generated gas is solidified in cooling the solder layers A and then adhered onto the surfaces of the solder layers A as the residue can be avoided. Such residue acts as the cause of the re-oxidation of the solder layers A.

Also, according to the above solder heating/melting equipment, since the heater 104 for heating the solder has such a mechanism that can confine the processing magazine 102 therein at the time of heating by its rising/falling operation, the quick temperature rise of the solder layers A can be achieved and thus the solder layers A can be released quickly from the heating. In addition, since a mechanism that can confine the processing magazine 102 in the heater 104 to surround it from respective sides is used, the heat can be transmitted well to the center of the processing magazine 102 and the heat distribution in the heater become almost even, whereby the unevenness of heating due to difference in the position on the upper surfaces of the semiconductor wafer W can be eliminated.

Further, since the formic acid is recovered from the insides of the heater 104 and the heating/melting chamber 103 every one cycle, the formic acid never leaks to the outside from the heating/melting chamber 103 during when a plurality of semiconductor wafers W are transferred from the heating/melting chamber 103 to the unloader 112 or during when a plurality of semiconductor wafers W are transferred from the loader 111 to the heating/melting chamber 103 in the subsequent cycle, so that the environmental pollution can be prevented.

In the meanwhile, if the dry pump is used as the exhausting mechanism 116, the pressure of the inside of the heater 104 is lowered by the dry pump in the state that the processing magazine 102 is covered with the heater 104. Also, in the above explanation, the formic-acid supplying nozzle 106 is positioned on the side of the heater 104. But a diffusing amount of the formic acid into the heating/melting chamber 103 may be previously reduced by arranging the formic-acid supplying nozzle 106 on the inside of the heater 104.

The above heating/melting of the solder layers A is made to joint the solder layers A to the pads or the wirings. Also, if the pads of the semiconductor chip are jointed to the wirings of the circuit board via the solder, the above solder heating/melting equipment may be employed.

Figure 30A:
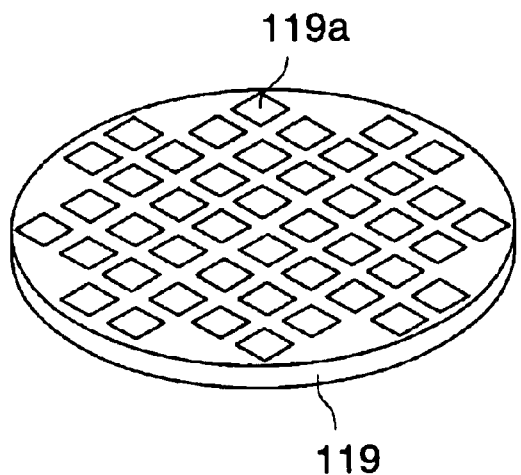
FIGS. 30A and 30B are a perspective view and a side view showing a jig to which a plurality of chip-like semiconductor devices, on which the solders to be jointed by the solder jointing system according to the seventh embodiment of the present invention are formed, are fitted respectively.
Figure 30B:
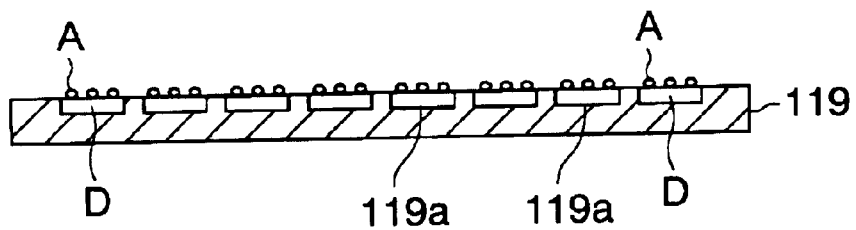

If the solder layers A are heated/melted by using the above solder jointing system after the chip-like semiconductor devices C are formed by dividing the semiconductor wafer W shown in FIG. 24A, a jig 119 shown in FIG. 30 may be employed.

This jig 119 has the substantially same shape as the circular semiconductor wafer W, and recess portions 119a on which chip-like semiconductor devices D are put are formed on its upper surface. In order to execute quickly the temperature rise/fall of the solder layers A on the semiconductor devices D, it is preferable that the jig 119 should be formed of the thin and tough material having the high thermal conductivity. For example, as such material, there are the inorganic material such as quartz and the metal material such as aluminum nitride. In order to improve the temperature rise/fall of the jig 119, it is preferable that a thickness of the quartz jig 119 under the recess portion 119a should be set to less than 0.5 mm and a thickness of the aluminum nitride jig 119 under the recess portion 119a should be set to less than 1.0 mm.

Figure 31:
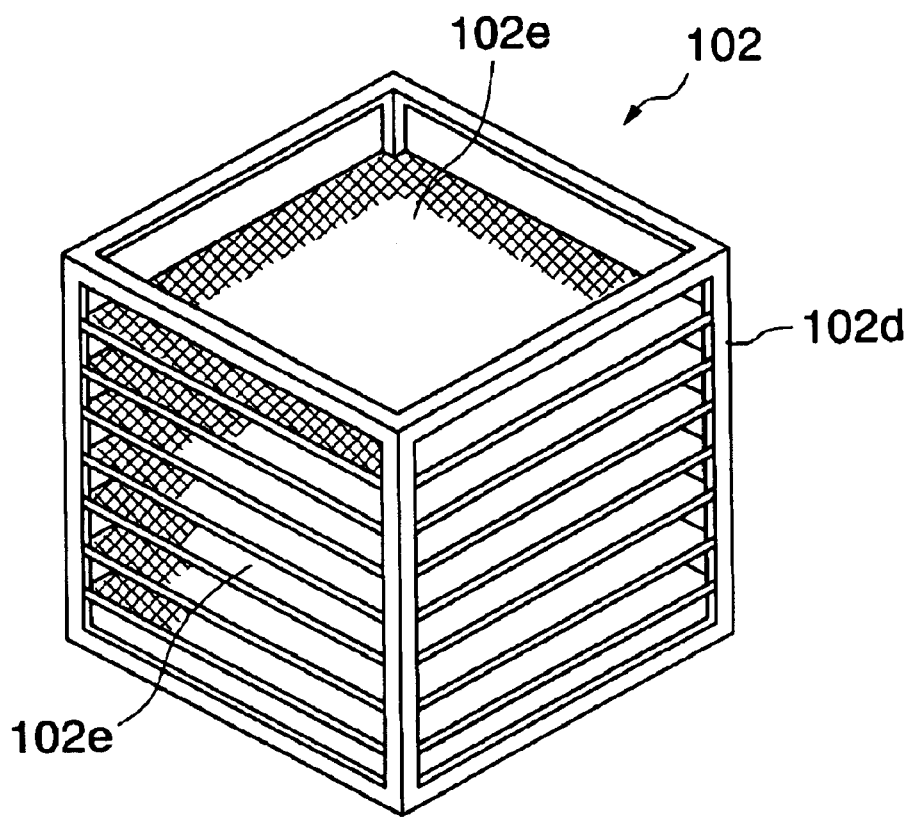
FIG. 31 is a perspective view showing another processing magazine used in the solder jointing system according to the seventh embodiment of the present invention.

By the way, the above processing magazine 102 is not limited to the structure shown in FIG. 23. For example, as shown in FIG. 31, a structure in which racks 102e are provided at plural stages in a cubic frame body 102d may be employed. A vertical pitch between the racks 102e is selected as a size that allows a clearance of 5 mm or more between the wafers in the situation that the wafers are put on the racks 102e respectively. The space between the racks 102e functions as the formic-acid introducing space.

According to the processing magazine 102 having such structure, the restriction in size of the heated object that put in such magazine can be reduced and the versatility can be widened. In addition, since the heat is transferred to the heated object through the clearance between the racks 102e, the uniformity of the heating applied to the heated object is not lost. Such structure may be employed as the loader 111 and the unloader 112.

Also, as shown in FIG. 22, the above formic-acid supplying mechanism 107 is equipped with the nozzle 106 having the spraying holes 106a. In this case, such formic-acid supplying mechanism is not limited to this structure.

Figure 32A:
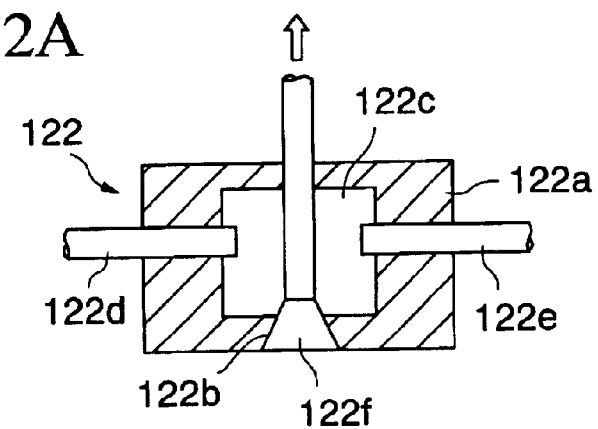
FIGS. 32A and 32B are sectional views showing another formic acid supplying mechanism used in the solder jointing system according to the seventh embodiment of the present invention.

For example, as shown in FIG. 32A, a spray having a structure that mixes the formic acid and the inert gas in vicinity of the spraying holes so as to change them into mists may be arranged in the heating/melting chamber 103.

Figure 32B:
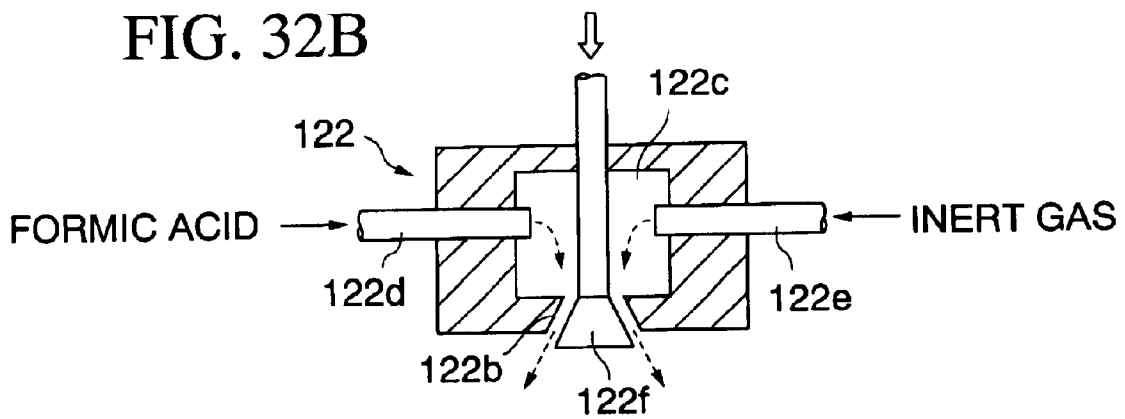

The spray 122 shown in FIG. 32A has a main body 122a having a gas mixing space 122c coupled to a spray hole 122b, and a formic-acid introducing pipe 122d and an inert gas introducing pipe 122e connected the gas mixing space 122c. A throttle type injection valve 122f is fitted to the spray hole 122b of the spray 122. When the pressure in the gas mixing space 122c is enhanced by the pressure of the inert gas introduced from the inert gas introducing pipe 122e, the injection valve 122f is pushed out to open the spray hole 122b, as shown in FIG. 32B, and then the formic acid introduced from the formic-acid introducing pipe 122d is changed into the mists and then discharged from the spray hole 122b into the processing magazine 102.

Also, if the introduction of the inert gas into the gas mixing space 122c is stopped, the injection valve 122f is retreated to close the spray hole 122b and the discharge of the formic acid from the spray holes 122b is stopped. In this case, since the spray hole 122b is closed by the injection valve 122f, the drop of the solution from the spray hole 122b can be prevented. The injection valve 122f may be moved back and forth by not the pressure of the gas but the external force.

Figure 33:
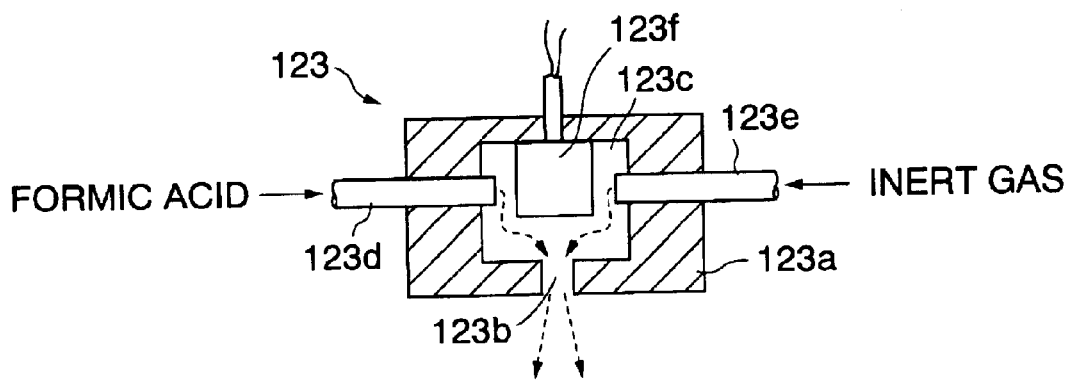
FIG. 33 is a sectional view showing still another formic acid supplying mechanism used in the solder jointing system according to the seventh embodiment of the present invention.

As the formic-acid supplying mechanism, a spray 123 having a ultrasonic vibrator shown in FIG. 33 may be employed.

The spray 123 shown in FIG. 33 has a main body 123a having a gas mixing space 123c coupled to a spray hole 123b, and a formic-acid introducing pipe 123d and an inert gas introducing pipe 123e connected the gas mixing space 123c. A ultrasonic vibrator 123f is provided to the gas mixing space 123c. The formic acid and the inert gas are mixed on the ultrasonic vibrator 123f to change the formic acid into the mists by the ultrasonic wave. Then, the mists are emitted from the spray hole 123b to the processing magazine 102. Since the ultrasonic vibrator 123f is driven in supplying the mists and is not driven in the remaining time, the supply/stop of the gas containing formic-acid is controlled.

In place of the shutters 108, 109 provided to the loading port 103a and the unloading port 103b of the heating/melting chamber 103 respectively, a nozzle 125 for discharging the air curtains of the nitrogen (inert gas) may be provided, otherwise the shutters 108, 109 and the air curtains may be provided together. Accordingly, the leakage of the formic acid to the outside of the heating/melting chamber 103 can be prevented without fail.

Also, the inert gas may be introduced from the nozzle 125 or the inert-gas purge nozzle 104a in the state that the wafers, etc. are contained in the processing magazine 102, to thereby form the inert gas atmosphere in the heating/melting chamber 103.

(Eighth Embodiment)

The present invention has a feature in the step of cleaning the surface oxide film formed on the copper wiring, etc. out of the steps of manufacturing the semiconductor device having the electrode or the wiring containing the copper as main material (the copper wiring, etc.). As described above, in the semiconductor device manufacturing steps, the cleaning step must be carried out as ① the post-process of the CMP step of the wiring in the semiconductor device, ② the pre-process of the PVD process or the CVD process for the semiconductor substrate, ③ the post-process of the etching process, ④ the pre-process of the packaging process, etc. Therefore, the cleaning steps will be explained in accordance with the classifications of above ① to ④ cases hereunder.

(Eighth Embodiment)

Figure 34A:
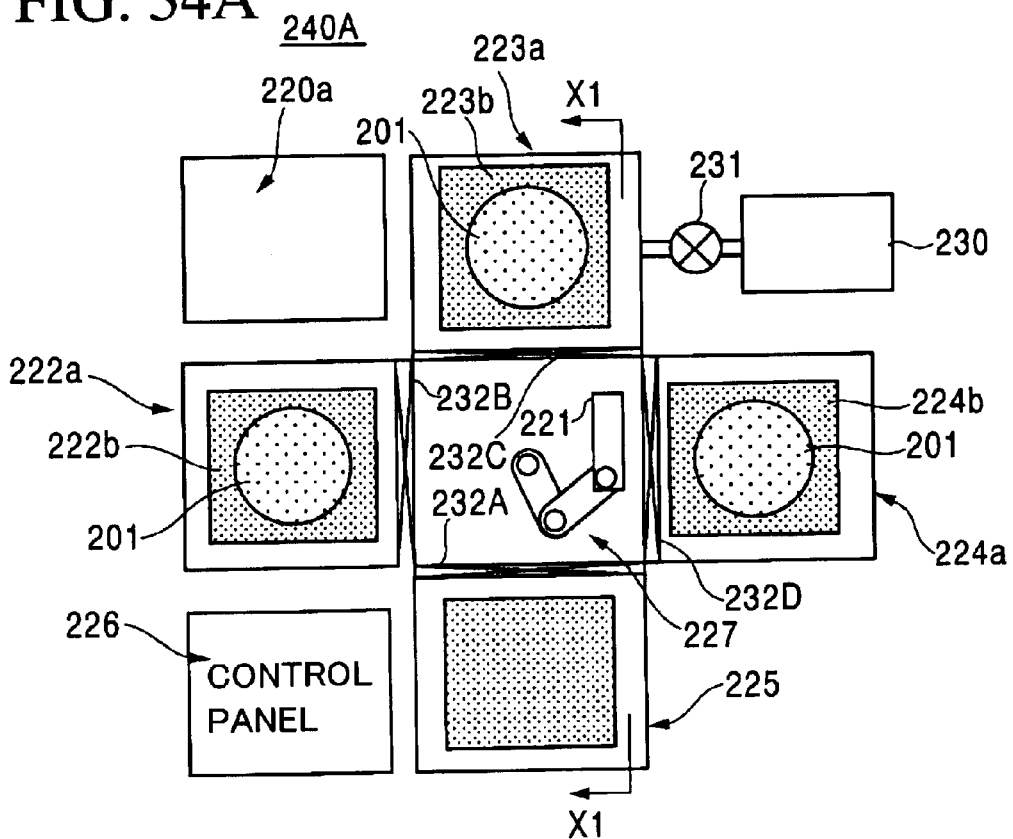
FIG. 34A is a plan view showing a structure of a semiconductor device manufacturing system according to an eighth embodiment of the present invention.
Figure 34B:
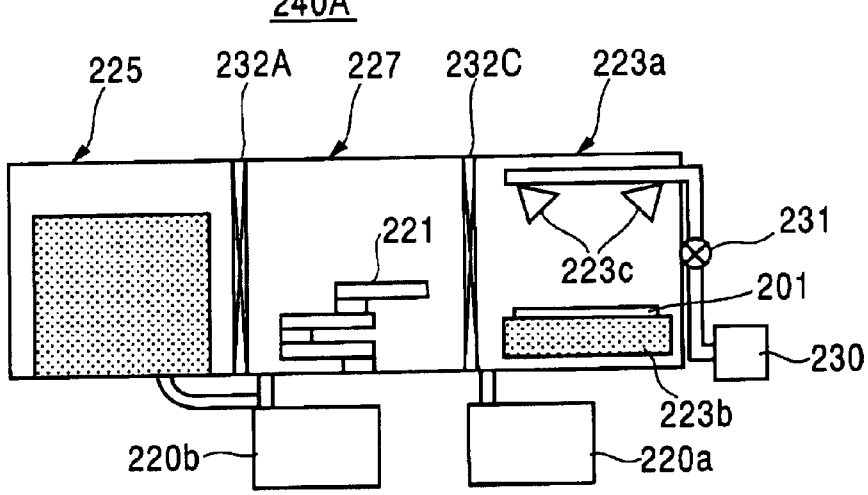
FIG. 34B is a sectional view taken along a X1—X1 line in FIG. 34A.

This eighth embodiment executes the cleaning step as the post-process of the CMP step. FIG. 34A shows a semiconductor device manufacturing system 240A according to an eighth embodiment of the present invention. FIG. 34B is a sectional view taken along a X1—X1 line in FIG. 34A.

The manufacturing system 240A comprises a preheating chamber 222a, a processing chamber 223a, a temperature holding heater chamber 224a, a load lock chamber 225, a carrying chamber 227, and the like. Respective chambers 222a, 223a, 224a, 225, 227 are partitioned respectively with gates 32A that can be opened/closed in an airtight fashion.

Also, respective chambers 222a, 223a, 224a, 225, 227 are connected selectively to exhaust pumps 220a, 220b, and a predetermined low-pressure atmosphere can be obtained in respective chambers. In addition, constituent elements provided to respective chambers 222a, 223a, 224a, 225, 227 are collectively driven and controlled by a control panel 226.

The semiconductor substrates 201 are loaded into the load lock chamber 225 from the outside of the manufacturing system 240A. The load lock chamber 225 is opened into the atmosphere when the semiconductor substrates 201 are loaded, but the pressure reducing process is applied to the load lock chamber 225 by the exhaust pump 220b after the semiconductor substrates 201 have been loaded into the load lock chamber 225. Then, after the pressure in the load lock chamber 225 is reduced to a predetermined low-pressure atmosphere, the gate 232A is opened and then the semiconductor substrates 201 are delivered to respective chambers 222a, 223a, 224a by the carrying arm 221 provided in the carrying chamber 227.

A pre-heating heater 222b in which the semiconductor substrates 201 are loaded is provided to the preheating chamber 222a. This pre-heating heater 222b is used to heat preliminarily the semiconductor substrates 201 before the cleaning process is carried out in the processing chamber 223a described later. The heating way of the semiconductor substrates 201 by the pre-heating heater 222b can be set arbitrarily by the control panel 226.

In the processing chamber 223a, surface oxide films 214 formed on the surfaces of the underlying wiring 202 and the copper wiring 3, etc. (the copper wiring, etc.) that are formed on the semiconductor substrates 201 are cleaned and removed. As shown in FIG. 34B, a temperature rising/falling heater 223b for loading the semiconductor substrates 201 thereon, a mist introducing nozzle 223c for spraying carboxylic acid mists 207 (in the present embodiment, the formic acid is employed as the carboxylic acid) to the semiconductor substrates 201, as described later, etc. are provided in the processing chamber 223a.

The temperature rising/falling heater 223b also acts as the stage on which the semiconductor substrates 201 are loaded.

A vacuum chucking mechanism (not shown) for vacuum-chucking the semiconductor substrates 201 is provided in the temperature rising/falling heater 223b. This vacuum chucking mechanism starts the vacuum suction by turning ON a substrate sucking valve (not shown) and releases the vacuum suction by turning OFF the substrate sucking valve. Also, the temperature rising/falling heater 223b can rise and fall the temperature of the loaded semiconductor substrates 201.

Also, the mist introducing nozzle 223c is connected to a supply unit 30. A formic acid/nitrogen introducing valve 231 is provided to a pipe that connects the mist introducing nozzle 223c and the supply unit 30. Thus, the formic acid can be supplied to the semiconductor substrates 201 by opening the formic acid/nitrogen introducing valve 231.

The semiconductor substrates 201 which are subjected to the cleaning process in the processing chamber 223a are carried into the temperature holding heater chamber 224a. Thus, even if the carboxylic acid (formic acid) remains on the semiconductor substrates 201 after the cleaning process in the processing chamber 223a, the residual carboxylic acid can be vaporized and removed by heating the semiconductor substrates 201 in the temperature holding heater chamber 224a. As a result, the residual carboxylic acid can be removed without the water cleaning.

In turn, a method of manufacturing the semiconductor devices (semiconductor substrates 201) by using the above manufacturing system 240A will be explained hereunder. As described above, the present eighth embodiment has the step of cleaning the surface oxide film formed on surfaces of the underlying wiring 202 and the copper wiring 203 on the semiconductor substrates 201 as the feature, but remaining steps are not changed from those in the prior art. Therefore, the cleaning step of the surface oxide film will be explained hereunder.

Figure 35A:
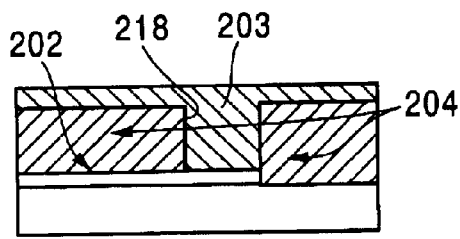
FIGS. 35A to 35E are sectional views showing a semiconductor device manufacturing method employing the semiconductor device manufacturing system shown in FIG. 34A.

FIG. 35A shows the semiconductor substrate 201 prior to the application of the CMP step. The underlying wiring 202 made of the copper is formed on the semiconductor substrate 201 and the interlayer insulating material 204 is formed thereon. Also, a via hole 218 is formed in a predetermined position in the interlayer insulating material 204, and the copper wiring 203 is formed in the via hole 218 by the plating method, for example. As shown in FIG. 35A, since the CMP step is not carried out yet, a part of the copper wiring 203 is formed on an upper surface of the interlayer insulating material 204.

Figure 35B:
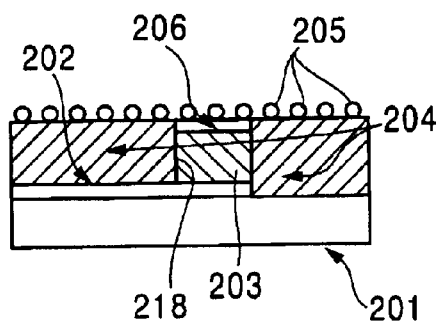

The copper wiring 203 formed on the semiconductor substrate 201 is polished by the CMP process using the oxidizing agent and abrasive particles 105 in the CMP step until the surface of the interlayer insulating material 204 is exposed. As shown in FIG. 35B, a surface oxide film 206 is formed on the surface of the copper wiring 203 at a point of time when the CMP step is finished.

Also, the abrasive particles 105 used in the CMP step are adhered onto the overall surface of the semiconductor substrate 201 at a point of time when the CMP step is finished. The abrasive particles 105 are removed from the surface of the substrate 201 by using the wafer scraper, by executing the ultrasonic cleaning, or the like.

The semiconductor substrate 201 from which the abrasive particles 105 are removed are loaded on the manufacturing system 240A shown in FIG. 34. Then, the cleaning process of the surface oxide film 206 is applied to the semiconductor substrate 201. The pre-heating heater 222b and a temperature holding heater 224b are previously heated in the manufacturing system 240A. Also, the carrying chamber 227 is exhausted to have an internal pressure of about 20 Pa, and the processing chamber 223a is exhausted to have an internal pressure of less than 10 Pa.

First, the above semiconductor substrate 201 is loaded in the load lock chamber 225. At this time, a plurality of semiconductor substrates 201 may be loaded collectively by providing the racks in the load lock chamber 225. After the semiconductor substrate 201 is loaded, the load lock chamber 225 is exhausted to less than 10 Pa by the exhausting pump 220b.

When the pressure in the load lock chamber 225 is lowered to the above predetermined pressure, the gates 232A, 232B are opened and then the semiconductor substrate 201 is carried from the load lock chamber 225 to the preheating chamber 222a by the carrying arm 221 provided to the carrying chamber 227. Then, the semiconductor substrate 201 is put on the preheating heater 222b, and then the gate 232B is closed. Then, the heating process for the semiconductor substrate 201 is carried out.

FIG. 36 is a flow chart showing steps of the manufacturing method in the manufacturing system 240A. In FIG. 36, the temperature change of the semiconductor substrate 201 is shown in the uppermost area, and then open/close states of the formic acid/nitrogen introducing valve, the internal pressure of the processing chamber, and open/close states of the substrate sucking valve are shown subsequently. A time point when the semiconductor substrate 201 is loaded into the preheating chamber 222a is a time T0 in FIG. 36. The semiconductor substrate 201 is heated in the preheating chamber 222a in a time interval T0 to T1, whereby the semiconductor substrate 201 is pre-heated.

When the preheating process for the semiconductor substrate 201 in the preheating chamber 222a is completed, the gates 232B, 232C are opened and then the pre-heated semiconductor substrate 201 is carried into the processing chamber 223a by the carrying arm 221. At the same time, the subsequent semiconductor substrate 201 is carried from the load lock chamber 225 to the preheating chamber 222a.

After the semiconductor substrate 201 is carried into the processing chamber 223a and put on the temperature rising/falling heater 223b, the gate 232C is closed. Also, when the semiconductor substrate 201 is loaded into the processing chamber 223a, the temperature-rising process of the semiconductor substrate 201 is started by the temperature rising/falling heater 223b and also the pressure reducing process in the processing chamber 223a is started by starting the exhaust pump 220a. Also, the substrate sucking valve is turned ON and thus the semiconductor substrate 201 is sucked/fixed to the temperature rising/falling heater 223b.

Figure 35C:
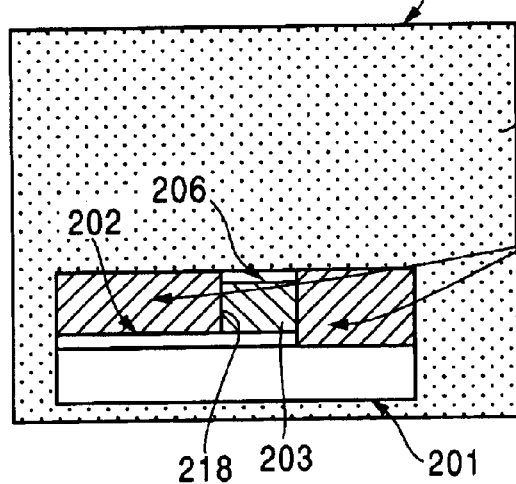

Then, when the temperature of the semiconductor substrate 201 is increased up to a first setting temperature, the formic acid (carboxylic acid) is supplied from the supply unit 230 to the semiconductor substrate 201 for a predetermined time t by switching the formic acid/nitrogen introducing valve 231 from OFF to ON. More particularly, when the temperature of the semiconductor substrate 201 is increased up to 250° C. (first setting temperature) and the pressure in the processing chamber 223a is lowered to about 60 Pa, the formic acid/nitrogen introducing valve 231 is turned ON. Thus, the mists 207 in which the formic acid of 10 cc is mixed with the nitrogen (referred to as "carboxylic acid mists" hereinafter) are introduced into the processing chamber 223a via the mist introducing nozzle 223c. FIG. 35C shows the state that the carboxylic acid mists 207 are introduced into the processing chamber 223a.

As described above, if the droplet of the carboxylic acid is adhered onto the interlayer insulating material 4 on the semiconductor substrate 201 at the time of introducing the carboxylic acid (the formic acid), there is the possibility that the seizure (generation of the foreign matter) occurs in the semiconductor substrate 201. In order to prevent this, in the present eighth embodiment, the formic acid that is formed into small-particle mists are supplied to the processing chamber 223a. The carboxylic acid mists 207 can be formed readily by employing the above spray nozzle BIMK6004, BIMV8002S, or the like manufactured by the Ikeuchi Co., Ltd. as the mist introducing nozzle 223c.

In addition, it is effective to supply the carboxylic acid mists 207 onto the semiconductor substrate 201 from the mist introducing nozzle 223c after such carboxylic acid mists 207 is changed into the vapor. The vapor of the carboxylic acid mists 207 can be generated by heating the nitrogen gas constituting the carboxylic acid mists 207 to thereby evaporate the carboxylic acid (formic acid). As the means for heating the nitrogen gas, the line heater L-00-100W, or the like manufactured by the Kikuchi Co., Ltd. can be employed, as described above.

The means of generating the vapor of the carboxylic acid is not limited to the above method. The vapor of the carboxylic acid may be generated by heating the heater as a hot plate to 250 to 300° C., and then spraying the carboxylic acid mists 207 (formic acid mists) onto this hot plate.

As described above, the carboxylic acid has the flash point and, for example, the formic acid has the flash point of 40° C. at a volume concentration of 87%. Therefore, if the formic acid is used at this volume concentration, it is liable to cause the ignition or the explosion due to the trouble of the manufacturing system 240A. However, the volume concentration of the formic acid employed in the present embodiment is set to less than 75%. If the volume concentration of the formic acid is set to less than 76%, the flash point is lost and danger of the explosion can be eliminated. But the reducing ability is not affected if the volume concentration is lowered. Therefore, according to the present embodiment, the cleaning process of the surface oxide film 206 can be executed without fail while keeping the safety.

After the formic acid is introduced as mentioned above, the atmospheric pressure in the processing chamber 223a can be held at 6000 Pa to 7500 Pa. Also, the semiconductor substrate 201 is heated at the maximum temperature of 350° C. (the second setting temperature) for about 6 minutes (the time interval T2 to T3 in FIG. 36). During this time interval T2 to T3, the surface oxide film 206 (copper (II) oxide) formed on the surface of the copper wiring 203 is changed into the formate and then reduced.

In this manner, in the present embodiment, since a reaction series such that first the surface oxide film 206 is changed into the formate (carboxylate) having high reactivity by supplying the formic acid and then the reduction of the copper is started is employed, it is possible to execute the cleaning process of the surface oxide film 206 at the low temperature.

Figure 35D:
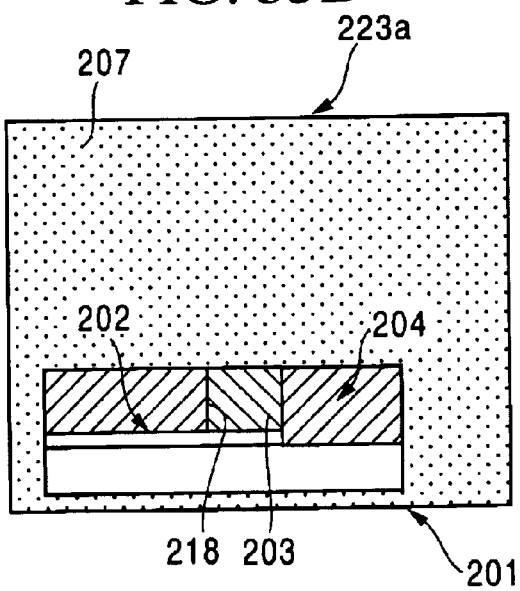

As shown in FIG. 35D, the surface oxide film 206 formed on the surface of the copper wiring 203 is removed by executing the above process and the copper is generated on the copper wiring 203 in accordance with the above reaction formula. Also, $H_2O$ and $CO_2$ generated at the same time are exhausted to the outside of the processing chamber 223a.

Then, while falling the temperature of the semiconductor substrate 201, the processing chamber 223a is exhausted until the pressure of less than 10 Pa and accordingly the carboxylic acid mists 207 in the processing chamber 223a is also exhausted (the time interval T3 to T4). Also, the substrate sucking valve is turned OFF and the temperature rising/falling heater 223b for the semiconductor substrate 201 is released.

When the above cleaning process of the surface oxide film 206 in the processing chamber 223a is finished, the gates 232C, 232D are opened and then the semiconductor substrate 201 is carried from the processing chamber 223a to the temperature holding heater chamber 224a. When the semiconductor substrate 201 is loaded on the temperature holding heater 224b in the temperature holding heater chamber 224a, the gate 232D is closed. Then, the temperature holding heater 224b maintains the semiconductor substrate 201 at the above first setting temperature (250° C.).

It is feared that the formic acid still remains and is adhered on the semiconductor substrate 201 that is taken out from the processing chamber 223a. If the formic acid remains on the copper wiring 203, there is the possibility that the copper wiring 203 is oxidized again by the formic acid. However, if the semiconductor substrate 201 that has been subjected to the cleaning process in the temperature holding heater chamber 224a is heated in the exhausting environment, the remaining formic acid is vaporized and removed from the semiconductor substrate 201. Thus, the re-oxidation of the copper wiring 203 can be prevented.

Figure 35E:
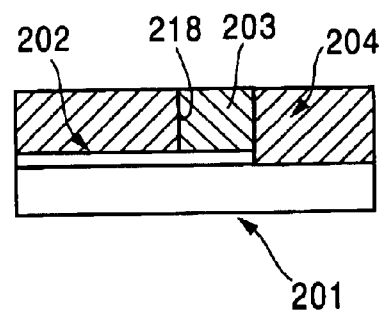

When the residual formic acid removing process in the temperature holding heater chamber 224a is completed, the gates 232A, 232D are opened and then the semiconductor substrate 201 is carried from the temperature holding heater chamber 224a to the load lock chamber 225 by the carrying arm 221. Then, the semiconductor substrate 201 is brought out from the load lock chamber 225 by leaking the load lock chamber 225 after the gate 232A is closed. FIG. 35E shows the semiconductor substrate 201 that is taken out from the load lock chamber 225. As shown in FIG. 35E, the surface oxide film 206 is not formed on the upper surface of the copper wiring 203, whereby the high quality semiconductor substrate 201 can be manufactured.

In the above embodiments, the heating temperature of the semiconductor substrate 201 in the processing chamber 223a is set to 250° C. to 350° C. It is possible to execute the cleaning process of the surface oxide film 206 at the temperature lower than this temperature. More concretely, it is verified actually by the experiment of the inventors of the present invention that the cleaning of the surface oxide film 206 can be carried out properly at the temperature set between 200° C. to 300° C.

(Ninth Embodiment)

Figure 37A:
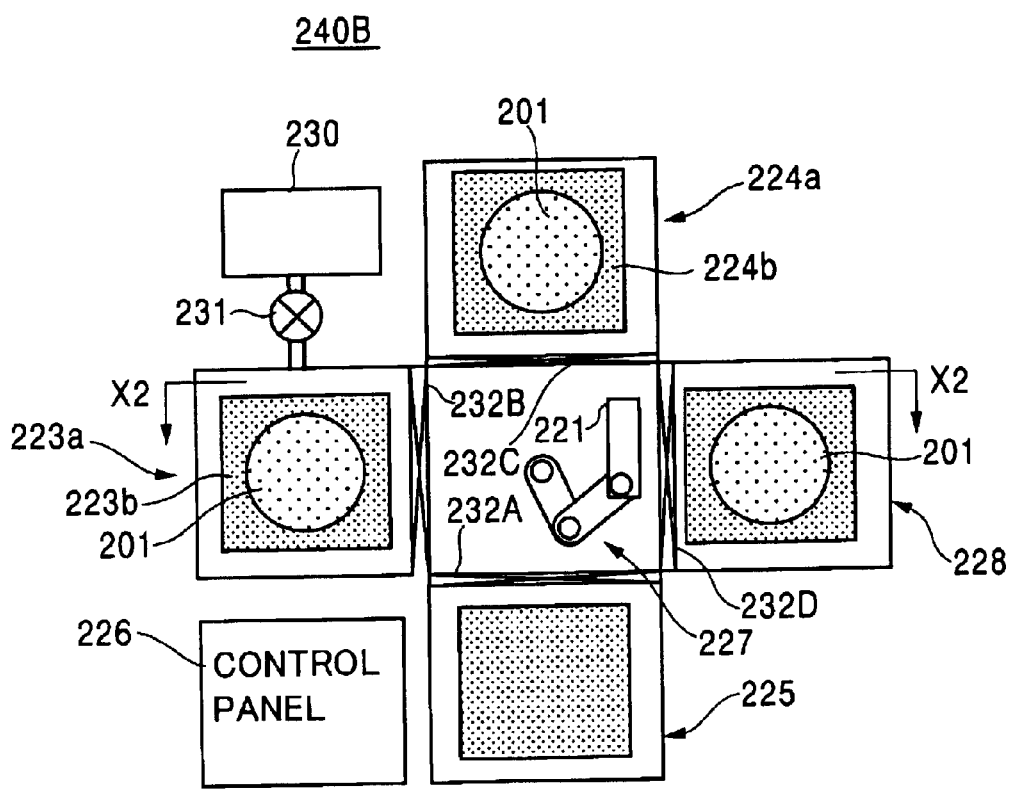
FIG. 37A is a plan view showing a structure of a semiconductor device manufacturing system according to a ninth embodiment of the present invention.

In this ninth embodiment, the cleaning step is applied to the semiconductor substrate as the post-process of the etching process or as the pre-process of the PVD process or the CVD process. FIG. 37A shows a semiconductor device manufacturing system 240B employed in the ninth embodiment.

Figure 37B:
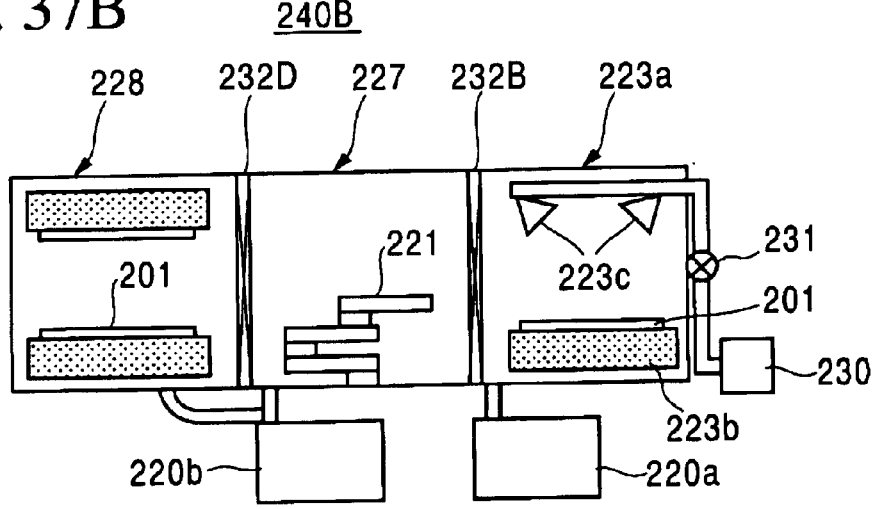
FIG. 37B is a sectional view taken along a X2—X2 line in FIG. 37A.

FIG. 37B is a sectional view taken along a X2—X2 line in FIG. 37A. Also, in FIGS. 37A and 37B employed in the present embodiment and the figures employed in respective embodiments explained in the following, the same symbols are affixed to the same structures as the manufacturing system 240A according to the eighth embodiment explained previously with reference to FIGS. 34A and 34B, and their explanation will be omitted. Also, out of the semiconductor device manufacturing steps executed in this embodiment and the manufacturing steps in respective embodiments explained in the following, their explanation of manufacturing steps of executing the same processes as the manufacturing steps explained in the eighth embodiment will be omitted.

The manufacturing system 240B according to the ninth embodiment has the feature that a PVD/CVD chamber 228 is provided instead of the temperature holding heater 224b in the manufacturing system 240A according to the eighth embodiment. In this PVD/CVD chamber 228, the PVD process or the CVD process is applied to the semiconductor substrate 201. In the ninth embodiment, the PVD/CVD chamber 228 is provided to execute the PVD process.

The PVD/CVD chamber 228 is arranged at a position that is remotest from the processing chamber 223a in which the cleaning process is performed. Both the PVD process/the CVD process executed in the PVD/CVD chamber 228 dislike the entry of the unnecessary gas. Therefore, if the carboxylic acid having the high reactivity enters into the PVD/CVD chamber 228 from the processing chamber 223a, the reliability of the film formation on the semiconductor substrate 201 is extremely deteriorated.

However, like this embodiment, if the PVD/CVD chamber 228 is arranged remote from the processing chamber 223a and the exhausting system is provided to respective chambers 223a, 228 and the carrying chamber 227 positioned between them (is connected to the exhaust pumps 220a, 220b) respectively, the carboxylic acid can be prevented without fail from entering into the PVD/CVD chamber 228. As a result, the reliability of the film formed in the PVD/CVD chamber 228 can be enhanced.

Subsequently, the method of manufacturing the semiconductor device (the semiconductor substrate 201) by employing the above manufacturing system 240B will be explained hereunder.

Figure 38A:
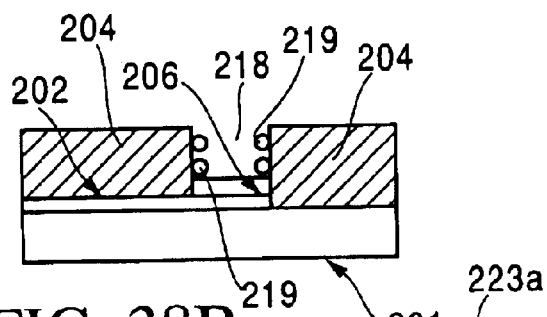
FIGS. 38A to 38E and FIGS. 39A to 39D are sectional views showing a semiconductor device manufacturing method employing the semiconductor device manufacturing system shown in FIG. 37A.

FIG. 38A shows the semiconductor substrate 201 before it is loaded on the manufacturing system 240B. As shown in FIG. 38A, a via hole 218 is formed in the interlayer insulating material 204 on the semiconductor substrate 201 by executing previously the etching step to expose the underlying wiring 202. In this case, it takes a time to some extent to execute the carrying process between the manufacturing systems, etc. until the semiconductor substrate 201 is loaded onto the manufacturing system 240B after the via hole 218 is formed by the etching step. As a result, the surface oxide film 206 is exposed to the outer air during this time and thus the surface oxide film 206 is formed on the surface of the underlying wiring 202. In contrast, in some cases depo-substance 219 such as Si, C, Cu, or the like is deposited on a side surface of the via hole 218 in the etching step executed as the preceding step.

In this manner, the semiconductor substrate 201 in which the surface oxide film 206 and the depo-substance 219 are present in the via hole 218 is loaded into the load lock chamber 225 of the manufacturing system 240B. In the ninth embodiment, the semiconductor substrate 201 loaded into the load lock chamber 225 is carried into the processing chamber 223a by the carrying arm 221.

Figure 38B:
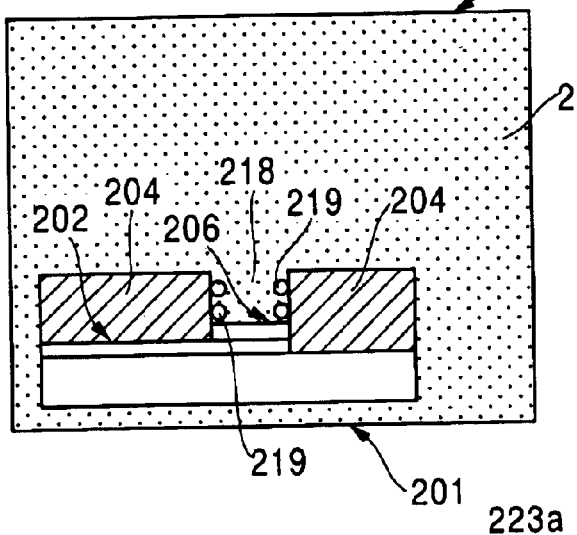

In the processing chamber 223a, the surface oxide film 206 and the depo-substance 219 are reduced/removed by executing the similar cleaning process described in the eighth embodiment. That is, the interior of the processing chamber 223a is set to the predetermined low-pressure atmosphere, and also the carboxylic acid mists 207 are supplied from the supply unit 230 in the situation that the semiconductor substrate 201 is heated up to about 200° C. to 350° C. FIG. 38B shows the behaviors of executing the reducing/removing process of the surface oxide film 206 and the depo-substance 219 in the processing chamber 223a.

In this fashion, in the ninth embodiment, reduction/removal of the formate is carried out after the surface oxide film 206 and the depo-substance 219 are changed into the formate (carboxylate) having the high reactivity by supplying the formic acid. For this reason, the removing process of the surface oxide film 206 and the depo-substance 219 can be carried out at the low temperature.

Figure 38C:
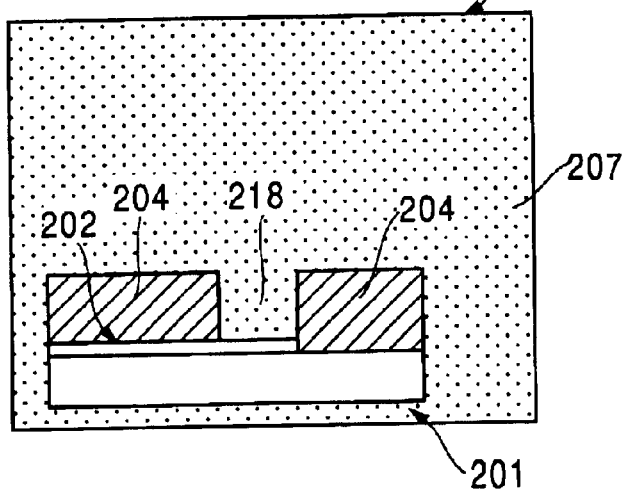

As shown in FIG. 38C, the surface oxide film 206 formed on the surface of the underlying wiring 202 and the depo-substance 219 adhered onto the side wall of the via hole 218 can be removed by executing the above process.

When the cleaning process of the surface oxide film 206 and the depo-substance 219 is completed in the above processing chamber 223a, the semiconductor substrate 201 is carried from the processing chamber 223a to the temperature holding heater chamber 224a. In order to prevent the re-oxidation of the underlying wiring 202, the heating process is applied to the semiconductor substrate 201 in the temperature holding heater chamber 224a to remove the formic acid remaining on the semiconductor substrate 201.

When the removing process of the formic acid is finished, the gates 232C, 232D are opened and then the semiconductor substrate 201 is carried into the PVD/CVD chamber 228 by the carrying arm 221. In the PVD/CVD chamber 228, a first deposition layer 208 is formed in the via hole 218 by executing the PVD process.

Figure 38D:
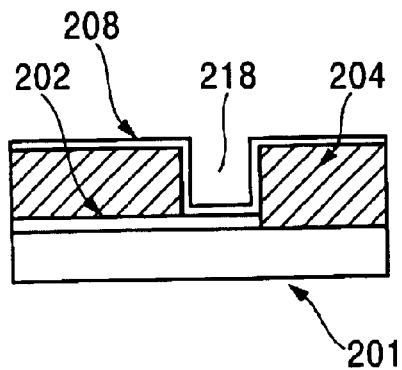

FIG. 38D shows the semiconductor substrate 201 after the first deposition layer 208 is formed. This first deposition layer 208 acts as a barrier metal, for example. Since the first deposition layer 208 formed in this manner comes contact with the upper surface of the underlying wiring 202 and the inner surface of the via hole 218, the connection having sufficiently low contact resistance can be achieved. Also, the formation of the first deposition layer 208 is conducted in the state that no unevenness caused by the surface oxide film 206 and the depo-substance 219 is present, the first deposition layer 208 can be formed with good coverage.

Figure 38E:
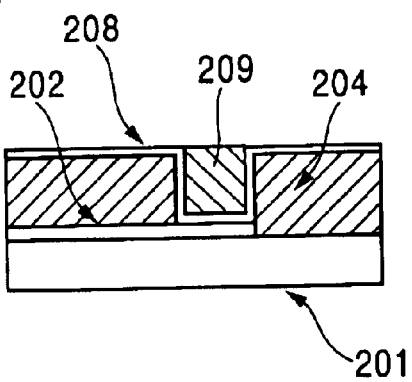

A second deposition layer 209 serving as a buried electrode to bury the via hole 218 is formed in the PVD/CVD chamber 228 subsequently to the formation of the first deposition layer 208. Accordingly, the semiconductor substrate 201 shown in FIG. 38E is manufactured.

When the forming process of the first deposition layer 208 and the second deposition layer 209 in the PVD/CVD chamber 228 is finished, the semiconductor substrate 201 is carried into the load lock chamber 225 by the carrying arm 221, then the leaking process is carried out, as described above, and then the semiconductor substrate 201 is taken out from the load lock chamber 225.

In the above embodiment, the example that the PVD process is executed in the PVD/CVD chamber 228 is described. Since the cleaning process can be carried out at the relatively low temperature (e.g., 200° C.) in the processing chamber 223a in the present embodiment, the present embodiment is also effective to execute the CVD process in the PVD/CVD chamber 228.

Figure 39A:
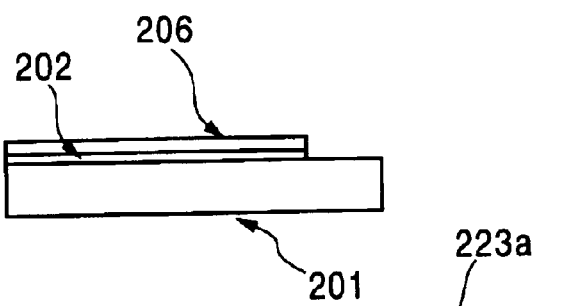
Figure 39B:
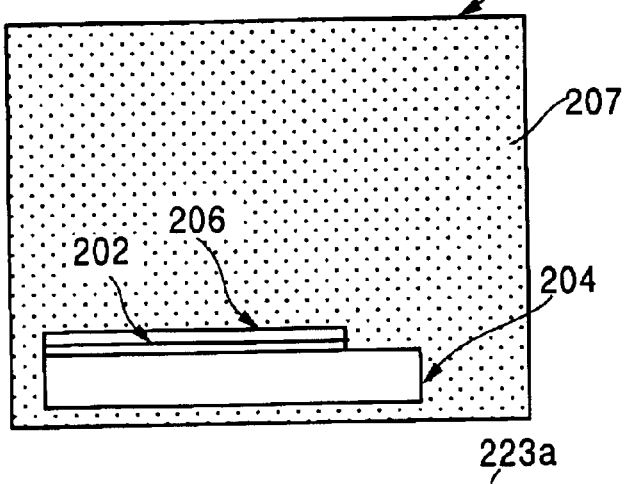

In other words, when the semiconductor substrate 201 in which the surface oxide film 206 is formed on the underlying wiring 202, as shown in FIG. 39A, is loaded into the manufacturing system 240B and then the reducing process similar to the above is carried out in the processing chamber 223a, as shown in FIG. 39B, generation of the unevenness on the underlying wiring 202 by the heat can be prevented.

Figure 39C:
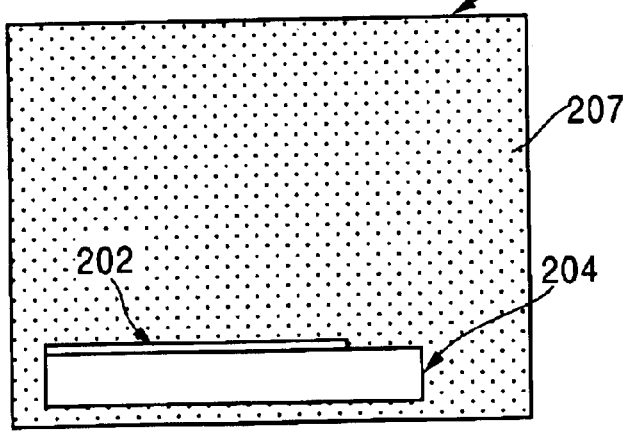
Figure 39D:
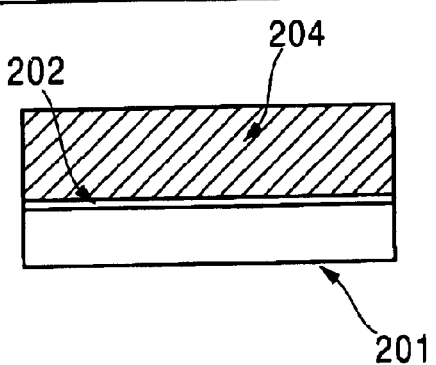

As a result, as shown in FIG. 39C, the upper surface of the underlying wiring 202 becomes a flat surface after the surface oxide film 206 is removed. Accordingly, the interlayer insulating material 204 can be deposited with good coverage when the interlayer insulating material 204 such as the SiN film, or the like is deposited by the CVD in the PVD/CVD chamber 228.

As described above, the preheating chamber 222a is not provided in the manufacturing system 240B according to the present embodiment. But the preheating process applied to the semiconductor substrate 201 in the processing chamber 223a in the eighth embodiment can be executed by using the temperature rising/falling heater 223b provided in the processing chamber 223a. As a result, even if the structure from which the preheating chamber 222a is removed is employed, there is caused no trouble in the cleaning process.

(Tenth Embodiment)

Figure 40A:
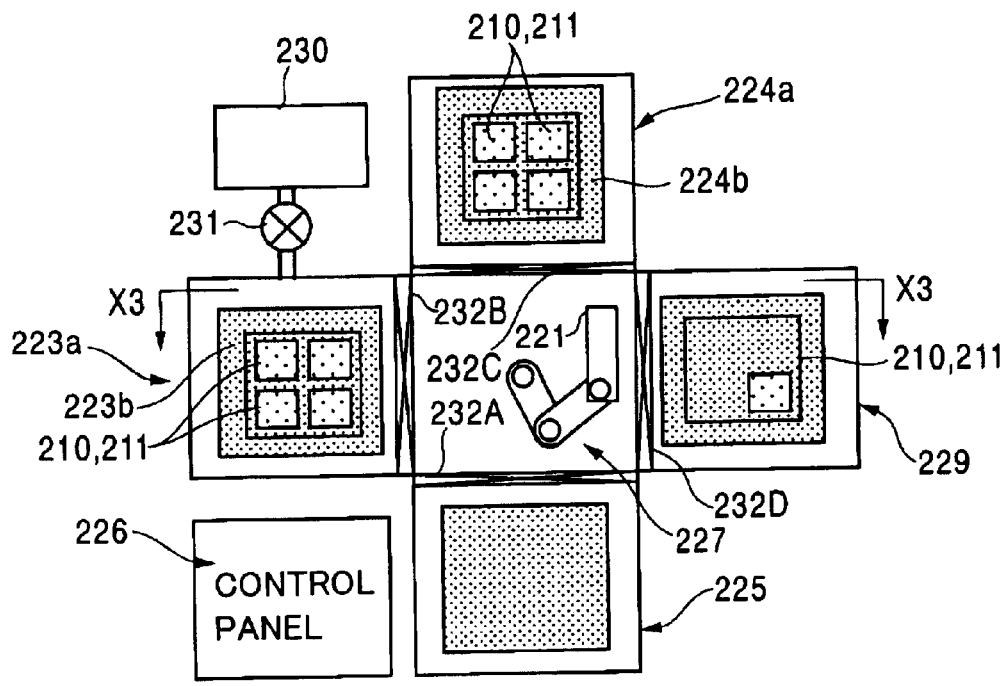
FIG. 40A is a plan view showing a structure of a semiconductor device manufacturing system according to a tenth embodiment of the present invention.
Figure 40B:
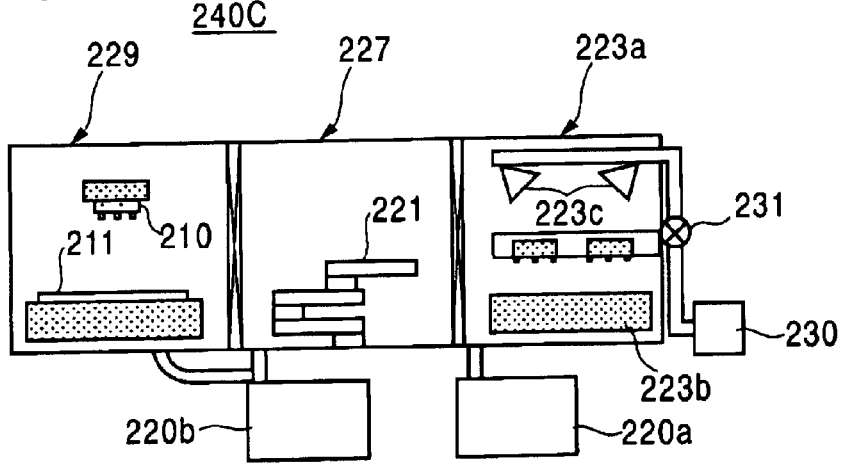
FIG. 40B is a sectional view taken along a X3—X3 line in FIG. 40A.

In a tenth embodiment, the cleaning process is carried out as the pre-process of the packaging process. FIG. 40A shows a semiconductor device manufacturing system 240C employed in the present embodiment. FIG. 40B is a view taken along a X3—X3 line in FIG. 40A.

The manufacturing system 240C according to the present embodiment has the feature that a parts packaging chamber 229 is provided, in place of the temperature holding heater 224b provided to the manufacturing system 240A according to the eighth embodiment or the PVD/CVD chamber 228 provided to the manufacturing system 240B according to the ninth embodiment. The parts packaging chamber 229 in the present embodiment is constructed to execute the process of jointing a package base material 210 and a wiring base material 211.

Figure 41A:
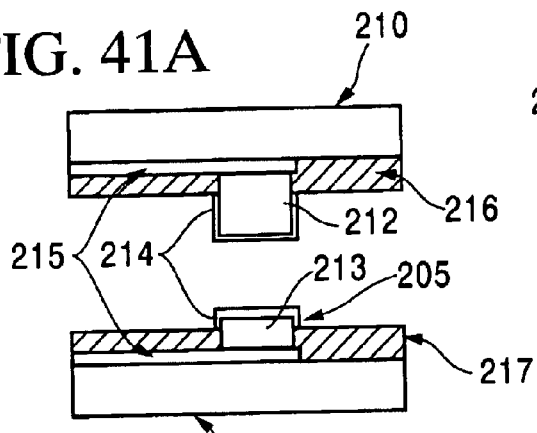
FIGS. 41A to 41D are sectional views showing a semiconductor device manufacturing method employing the semiconductor device manufacturing system shown in FIG. 40A.

As shown in FIG. 41A, the package base material 210 comprises an internal wiring 215, a package covering material 216 for covering the internal wiring 215, a package base material terminal 212 connected to the internal wiring 215 and projected from the package covering material 216, etc. Also, a wiring base material 211 comprises an internal wiring 215, a package base material covering material 217 for covering the internal wiring 215, a package base material terminal 213 connected to the internal wiring 215 and projected from the package base material covering material 217, etc.

The package base material terminal 212 and the package base material terminal 213 are formed of metal material containing Cu as main material respectively. Since the terminals 212, 213 are left in the air, the internal wiring 215 is formed on their surfaces respectively. The manufacturing system 240C according to the tenth embodiment executes the jointing operation by cleaning/removing the surface oxide film 214 formed on respective terminals 212, 213.

In turn, a method of packaging the package base material 210 on the wiring base material 211 by using the above manufacturing system 240C will be explained hereunder.

FIG. 41A shows the package base material 210 and the wiring base material 211 before they are loaded on the manufacturing system 240C. As shown in FIG. 41A, the surface oxide film 214 is formed on the package base material terminal 212 of the package base material 210 and the package base material terminal 213 of the wiring base material 211. In this manner, as mentioned as above, if the packaging process is carried out in the state that the surface oxide film 214 made of material different from the terminal material is formed on respective terminals 212, 213, the reflection of the electromagnetic field is generated at the surface oxide film 214 forming area and the high speed transmission of the signal is disturbed.

The package base material 210 and the wiring base material 211 on which the surface oxide film 214 is formed, as described as above, are loaded into the load lock chamber 225 of the manufacturing system 240C. When the base materials 210, 211 are loaded into the load lock chamber 225, such base materials 210, 211 are carried into the processing chamber 223a by the carrying arm 221.

In the processing chamber 223a, the reduction/removal of the surface oxide film 214 formed on the surfaces of respective terminals 212, 213 is executed by carrying out the similar cleaning process as explained in the eighth embodiment. In other words, the carboxylic acid mists 207 are supplied from the supply unit 230 to the processing chamber 223a in the state that the interior of the processing chamber 223a is set to the above predetermined low-pressure atmosphere and also respective base materials 210, 211 are heated up to about 200° C. to 350° C. FIG. 41B shows the behavior that the reducing/removing process of the surface oxide film 214 is executed in the processing chamber 223a.

In this manner, in this tenth embodiment, the reduction/ removal of the formate is carried out after the surface oxide film 214 is changed into the formate (the carboxylate) having the high reactivity by supplying the formic acid. Therefore, the removing process of the surface oxide film 214 can be executed at the low temperature. Also, as shown in FIG. 41C, the surface oxide film 214 formed on the surfaces of respective terminals 212, 213 can be removed by executing the above cleaning process.

When the above cleaning process of the surface oxide film 214 in the processing chamber 223a is completed, respective base materials 210, 211 are carried into the temperature holding heater chamber 224a from the processing chamber 223a. In the temperature holding heater chamber 224a, in order to prevent the re-oxidation of respective terminals 212, 213, the heating process is applied to respective base materials 210, 211 to remove the formic acid remaining on respective base materials 210, 211.

When the removing process of the formic acid is finished, the gates 232C, 232D are opened and then respective base materials 210, 211 are carried into the parts packaging chamber 229 by the carrying arm 221. In the parts packaging chamber 229, the packaging process of the package base material 210 onto the wiring base material 211 is carried out by jointing the package base material terminal 212 and the package base material terminal 213.

This process of jointing the package base material terminal 212 and the package base material terminal 213 is executed in the non-oxidizing atmosphere. Therefore, the cleaned terminals 212, 213 are never oxidized again in the parts packaging chamber 229. Also, as the concrete jointing method, the heating jointing process at which respective terminals 212, 213 are heated up to about 200° C. to 300° C. can be employed. In this heating jointing process, the pressure may be applied as occasion demands. In addition, the ultrasonic jointing process may be applied to respective terminals 212, 213 by providing the ultrasonic vibration to respective base materials 210, 211.

Figure 41D:
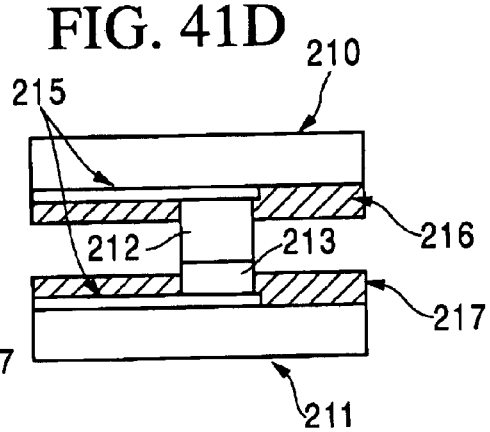
Figure 41B:
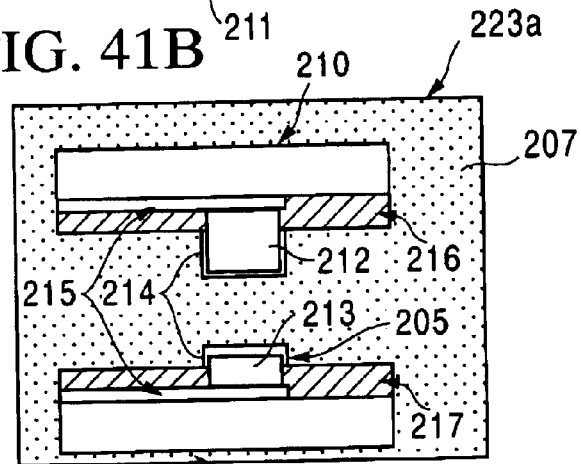
Figure 41C:
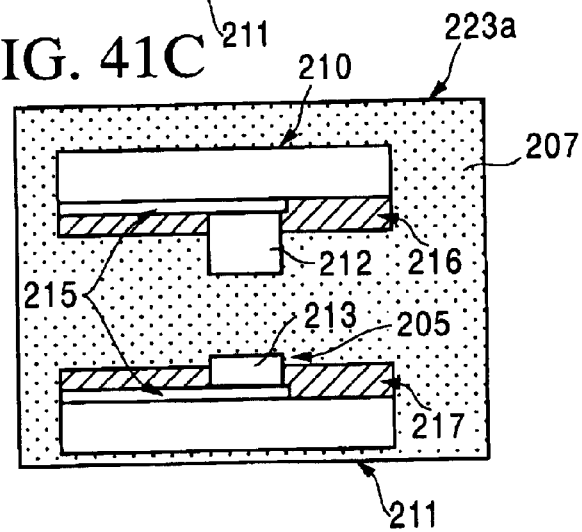

FIG. 41D shows the state that the package base material 210 is packaged onto the wiring base material 211. As shown in FIG. 41D, since the package base material terminal 212 is jointed to the package base material terminal 213 after the surface oxide film 214 is cleaned, the package base material 210 can be packaged firmly onto the wiring base material 211.

If the ultrasonic jointing is employed, there is no necessity that both the package base material terminal 212 and the package base material terminal 213 should always be cleaned. If the surface of any one of the terminals 212, 213 is cleaned, the similar advantage can be achieved. This is because such surface oxide film 214 can be mechanically removed (peeled off) by the ultrasonic vibration.

When the packaging process in the parts packaging chamber 229 is ended, the integrated base materials 210, 211 are carried into the load lock chamber 225 by the carrying arm 221. Then, as described above, the base materials 210, 211 are taken out from the load lock chamber 225 after the leakage process.

As described above, according to the present invention, the heating/melting areas and the carrying areas are provided in the chamber having the openings that are opened to the outer air, and in addition the formic-acid supplying means and the formic-acid exhausting mechanism are provided in the heating/melting areas. Therefore, the oxides on the solder layers are removed by using the formic acid in the heating/melting areas, and also the formic acid is vaporized in the low pressure while jointing the solder layers by the heating and is removed by the exhausting mechanism.

Also, since the solder-adhered object can be loaded/ unloaded into/from the chamber via the openings that are opened to the outer air, the processing ability of the solder jointing process can be increased. In addition, if the carrying areas are held at the predetermined temperature, the vaporization of the formic acid can be accelerated and the subsequent re-oxidation of the solder layers on the solder-adhered object can be prevented.

In addition, since the formic acid supplied to the heating/ melting areas is sucked by the exhausting mechanism in response to the pressure distribution in the chamber not to leak from the openings, the environmental pollution can be prevented.

Further, the solder-adhered object heated in the heating/ melting areas is unloaded to the outside via the openings while falling its temperature in response to the temperature distribution in the chamber. Therefore, the solder-adhered object can be taken out from the chamber at the temperature close to the room temperature, and thus the handling of the solder-adhered object can be facilitated.

If the formic-acid supplying means supplies the formic acid to the heating/melting areas at the concentration of less than 75 vol %, the formic acid of such concentration can be used safely without the explosive limit.

As described above, according to the present invention, there are provided the magazine for containing a plurality of substrates having the metal pattern to which the solder layers are adhered thereonto at a distance, and the heater arranged such that the magazine can be confine in the heater. Therefore, the solders on a plurality of substrates can be jointed at the same time and thus the throughput can be improved rather than the prior art.

Also, since the heater can be taken away not to surround the magazine after the solder layers are heated/melted by the heater, the temperature of the solder layers can be easily lowered and thus the time required from the heating to the cooling can be shortened. In addition, since the mechanism for fitting the cooling gas introducing mechanism to the heater is employed, the solder layers can be cooled more quickly by the cooling gas immediately after the heating of the solder layers is finished, and thus the solder cooling time can be shortened.

If the formic acid is supplied to the solder layers, the formic acid and the gas are mixed to suppress the excessive supply of the formic acid, or the formic acid is changed into the mists by the ultrasonic wave. Therefore, the excessive supply of the formic acid can be suppressed.

Further, since the magazine is placed only in the heating chamber, the adhesion of the pollutant in the air onto the magazine can be suppressed and thus the contamination of the substrates during the heating can be prevented.

As described above, according to the present invention, since the surface oxide film formed on the electrode or the wiring containing the copper as the main material is changed into the carboxylate and then is reduced/removed, the surface oxide film can be removed without fail. Also, since the carboxylate is supplied to the surface oxide film on the electrode or the wiring without the oxygen and the carboxylic acid can be effectively removed not to employ the pure-water cleaning, it can be prevented that the local corrosion is generated on the electrode or the wiring.

What is claimed is:

1. A solder jointing system comprising:
   a chamber open to the outside through openings at opposite ends of the chamber through which a solder-adhered object is passed, and the chamber having a heating/melting area and object carrying areas arranged adjacent to the heating/melting area with all areas of the chamber being open to the outside through the openings for passing the solder-adhered object;
   said openings having no physical barriers capable of closing or blocking the openings;
   a carrying mechanism for carrying the solder-adhered object into the heating/melting area;
   a formic-acid supplying device for supplying a formic acid into the heating/melting area;
   an exhausting device for exhausting a gas from the heating/melting area and its neighboring area to create a lower a pressure in the heating/melting area as compared to pressure outside the solder jointing system;
   a heating device for heating directly or indirectly the solder-adhered object in the heating/melting area; and
   an air-stream suppressing device for disturbing a gas flow between the heating/melting area and the carrying areas.

2. A solder jointing system according to claim 1, wherein the formic-acid supplying device supplies the formic acid at a concentration of less than 75 vol %.

3. A solder jointing system according to claim 1, wherein the carrying mechanism has conveyer belts for moving the solder-adhered object in the chamber at a distance from the heating device.

4. A solder jointing system according to claim 1, wherein the carrying mechanism has a carrying arm for moving the solder-adhered object in the chamber while putting it on the heating device.

5. A solder jointing system according to claim 1, wherein a holding mechanism which can hold the solder-adhered object is fitted to the heating/melting area.

6. A solder jointing system according to claim 1, wherein the air-stream suppressing device consist of shielding plates for reducing locally spaces at boundaries between the heating/melting area and the carrying areas in the chamber.

7. A solder jointing system according to claim 1, wherein the air-stream suppressing device consist of inert gas curtains that are flown between inert gas discharging portions provided to upper portions, lower portions, or side portions of boundaries between the heating/melting area and the carrying areas in the chamber and forced exhausting portions provided to oppose to the inert gas discharging portions.

8. A solder jointing system according to claim 1, wherein another heating device for heating the solder-adhered object are provided to the carrying areas.

9. A solder jointing system according to claim 8, wherein another exhausting mechanisms are provided to the carrying areas.

10. A solder jointing system according to claim 1, further comprising a carrier on which the solder-adhered object is put and which is moved in the chamber.

11. A solder jointing system according to claim 1, wherein the formic-acid supplying device consists of a formic-acid-containing solution containing portion provided to a part of the carrier, on which the solder-adhered object is put and which is moved in the chamber, and having formic-acid discharging ports.

12. A solder jointing system according to claim 1, wherein the formic-acid supplying device is provided near one end of the heating/melting area, and the exhausting mechanism is arranged on other end of the heating/melting area.

13. A solder jointing system according to claim 1, wherein the formic-acid supplying device has any one of a mechanism for changing the formic acid into a mist, a mechanism for vaporizing the formic acid, and a mechanism for spraying the formic acid.

14. A solder jointing system according to claim 1, wherein the formic-acid supplying device has a mechanism for vibrating the formic-acid containing solution by a ultrasonic wave.

15. A solder jointing system according to claim 1, wherein at least one of a formic-acid decomposing mechanism and a formic-acid recovering mechanism is connected to an exhaust side or a suction side of the exhausting mechanism.

16. A solder jointing system according to claim 15, wherein the formic-acid decomposing mechanism has a heater for heating a gas containing formic-acid sucked by the exhausting mechanism or a gas containing formic-acid exhausted from the exhausting mechanism up to 200° C. or more.

17. A solder jointing system according to claim 15, wherein the formic-acid recovering mechanism has a solution through which a gas containing formic-acid sucked by the exhausting mechanism or a gas containing formic-acid exhausted from the exhausting mechanism is passed.

18. A solder jointing system according to claim 17, wherein the solution is a water or an alcohol.

19. A solder jointing system comprising:
   a magazine for containing a plurality of base bodies onto which a solder is adhered at a distance;
   a heating chamber for storing the magazine and having a loading port through which the base bodies are loaded into the magazine and an unloading port through which the base bodies are unloaded from the magazine;
   a first air-shielding mechanism, and a second air-shielding mechanism provided to the loading port and the unloading port respectively to isolate the heating chamber from the outside atmosphere, the heating chamber having no physical barriers capable of closing or blocking the heating chamber;
   a heater arranged in the heating chamber such that the magazine can be confined therein;
   a formic-acid supplying mechanism for supplying a formic acid to a heating area; and
   an exhausting mechanism for exhausting the formic acid from the heating chamber.

20. A solder jointing system according to claim 19, further comprising a cooling gas introducing mechanism for introducing a cooling gas into the heater from an outside.

21. A solder jointing system according to claim 20, wherein the cooling gas is formed of an inert gas.

22. A solder jointing system according to claim 19, wherein the first air-shielding mechanism and the second air-shielding mechanism consist of at least one of a shutter and an air curtain.

23. A solder jointing system according to claim 22, wherein the air curtain consists of an inert gas shower.

24. A solder jointing system according to claim 19, wherein the formic-acid supplying mechanism has an introducing portion for introducing mixed mists of the formic acid and the inert gas.

25. A solder jointing system according to claim 19, wherein the formic-acid supplying mechanism has a ultrasonic vibrating element for changing the formic acid into the mists.

26. A solder jointing system according to claim 19, wherein the formic-acid supplying mechanism has a formic-acid introducing portion for introducing a solution whose formic-acid concentration is less than 76 vol %.

27. A solder jointing system according to claim 19, wherein the exhausting mechanism has a function for lowering a pressure in the heater in a state that the magazine is confined in the heater.

28. A solder jointing system according to claim 19, further comprising a formic-acid decomposing mechanism or a formic-acid recovering mechanism connected to an exhausting portion of the exhausting mechanism.

29. A solder jointing system according to claim 28, wherein the formic-acid recovering mechanism has a tank for containing a solution through which an exhaust gas discharged from the exhausting mechanism is passed.

30. A solder jointing system according to claim 29, wherein a ventilating portion having a plurality of holes which pass through the exhaust gas is provided to the tank.

31. A solder jointing system according to claim 30, wherein the solution is a water or an alcohol.

32. A solder jointing system according to claim 28, wherein the formic-acid decomposing mechanism has a heating portion for heating the exhaust gas discharged from the exhausting mechanism up to 400° C. or more.

33. A solder jointing, system according to claim 19, wherein the magazine has supporting surfaces on which wafer base bodies are supported and formic-acid introducing spaces through which the formic acid is passed into an interior.

34. A solder jointing system according to claim 19, wherein the magazine has mesh supporting surfaces on which wafer base bodies are supported and formic-acid introducing spaces through which the formic acid is introduced into an inside.

35. A solder jointing system according to claim 19, wherein the base bodies are chip-like semiconductor devices and supported by a supporting tool, and plural sheets of supporting tools are supported in the magazine at a distance.

36. A solder jointing system according to claim 35, wherein the supporting tool has recessed portions for positioning the semiconductor devices, and is formed of inorganic material or metal material.

37. A solder jointing system according to claim 19, further comprising a carrying mechanism for carrying the magazine in the heating chamber.

38. A solder jointing system according to claim 19, wherein the base body consists of any one of an electric parts, a circuit board, a semiconductor wafer, and a semiconductor chip.

39. A solder jointing system according to claim 19, further comprising an inert-gas introducing mechanism for introducing the inert gas into the heating chamber.

* * * * *